(12) United States Patent
Kobayashi et al.

(10) Patent No.: US 12,272,714 B2
(45) Date of Patent: Apr. 8, 2025

(54) SOLID-STATE IMAGING DEVICE

(71) Applicant: SONY SEMICONDUCTOR SOLUTIONS CORPORATION, Kanagawa (JP)

(72) Inventors: Kenji Kobayashi, Kanagawa (JP); Toshifumi Wakano, Kanagawa (JP); Yusuke Otake, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/132,014

(22) Filed: Apr. 7, 2023

(65) Prior Publication Data
US 2023/0246055 A1    Aug. 3, 2023

Related U.S. Application Data

(63) Continuation of application No. 17/526,800, filed on Nov. 15, 2021, now Pat. No. 11,699,716, which is a
(Continued)

(30) Foreign Application Priority Data

Aug. 4, 2017    (JP) ................................. 2017-151980

(51) Int. Cl.
  *H01L 27/146*    (2006.01)
  *H01L 23/522*    (2006.01)
  *H01L 31/107*    (2006.01)

(52) U.S. Cl.
  CPC .... *H01L 27/14636* (2013.01); *H01L 23/5225* (2013.01); *H01L 27/14603* (2013.01);
  (Continued)

(58) Field of Classification Search
  CPC ........... H01L 27/14636; H01L 23/5225; H01L 27/14603
  See application file for complete search history.

(56) References Cited

U.S. PATENT DOCUMENTS 10,680,028 B2    6/2020    Kobayashi et al.
11,222,916 B2    1/2022    Kobayashi et al.
(Continued)

FOREIGN PATENT DOCUMENTS

CN    101379615 A    3/2009
CN    105009289 A    10/2015
(Continued)

OTHER PUBLICATIONS

Lee et al., "A Back-Illuminated 3D-Stacked Single-Photon Avalanche Diode in 45nm CMOS Technology," 2017 IEEE International Electron Devices Meeting (IEDM), Dec. 2, 2017, 4 pages.
(Continued)

*Primary Examiner* — Walter H Swanson
(74) *Attorney, Agent, or Firm* — Sheridan Ross PC

(57) ABSTRACT

An imaging device includes a first chip. The first chip includes a first pixel and a second pixel. The first pixel includes a first anode region and a first cathode region, and the second pixel includes a second anode region and a second cathode region. The first chip includes a first wiring layer. The first wiring layer includes a first anode electrode, a first anode via coupled to the first anode electrode and the first anode region, and a second anode via coupled to the first anode electrode and the second anode region.

20 Claims, 37 Drawing Sheets

Related U.S. Application Data continuation of application No. 16/803,787, filed on Feb. 27, 2020, now Pat. No. 11,222,916, which is a continuation of application No. 16/326,060, filed as application No. PCT/JP2018/027845 on Jul. 25, 2018, now Pat. No. 10,680,028.

(52) U.S. Cl.
CPC .... *H01L 27/14634* (2013.01); *H01L 27/1464* (2013.01); *H01L 31/107* (2013.01)

(56) References Cited

U.S. PATENT DOCUMENTS

| | | | |
|---|---|---|---|
| 2005/0253132 | A1 | 11/2005 | Marshall |
| 2007/0194397 | A1* | 8/2007 | Adkisson .......... H01L 27/14621 257/432 |
| 2011/0164158 | A1 | 7/2011 | Iida |
| 2016/0181302 | A1 | 6/2016 | McGarvey et al. |
| 2017/0186798 | A1 | 6/2017 | Yang et al. |
| 2018/0211990 | A1 | 7/2018 | Yorikado |
| 2022/0077218 | A1 | 3/2022 | Kobayashi et al. |

FOREIGN PATENT DOCUMENTS

| | | |
|---|---|---|
| CN | 105518862 A | 4/2016 |
| CN | 105633192 A | 6/2016 |
| CN | 105684150 A | 6/2016 |
| CN | 105870244 | 8/2016 |
| DE | 102011115656 A1 | 3/2013 |
| JP | 2004327998 A | 11/2004 |
| JP | 2005-532695 | 10/2005 |
| JP | 2005-539373 | 12/2005 |
| JP | 2008-235681 | 10/2008 |
| JP | 2009-525619 | 7/2009 |
| JP | 2012-256736 | 12/2012 |
| JP | 2013-089919 | 5/2013 |
| JP | 2014-160042 | 9/2014 |
| JP | 2015-060909 | 3/2015 |
| JP | 2016-192551 | 11/2016 |
| JP | 2017-033962 | 2/2017 |
| TW | 201706622 | 2/2017 |
| WO | WO-2013058003 A1 | 4/2013 |
| WO | WO-2016147504 A1 | 9/2016 |
| WO | WO 2017094362 * | 6/2017 |

OTHER PUBLICATIONS

Lee et al., "High-Performance Back-Illuminated Three-Dimensional Stacked Single-Photon Avalanche Diode Implemented in 45-nm CMOS Technology," IEEE Journal of Selected Topics in Quantum Electronics, vol. 24, No. Apr. 16, 2018, 10 pages.

International Search Report and Written Opinion for International (PCT) Patent Application No. PCT/JP2018/027845, dated Oct. 30, 2018, 11 pages.

Official Action (with English translation) for Chinese Patent Application No. 201880003275.7, dated Sep. 17, 2020, 10 pages.

Official Action for Japan Patent Application No. 2017-151980, dated May 18, 2021, 4 pages.

Notice of Allowance for U.S. Appl. No. 16/326,060, dated Feb. 5, 2020, 8 pages.

Official Action for U.S. Appl. No. 16/803,787, dated Jun. 10, 2021, 6 pages. Restriction Requirement.

Notice of Allowance for U.S. Appl. No. 16/803,787, dated Aug. 18, 2021, 9 pages.

Corrected Notice of Allowance for U.S. Appl. No. 16/803,787, dated Dec. 9, 2021, 2 pages.

Official Action for U.S. Appl. No. 17/526,800, dated Sep. 29, 2022, 7 pages.

Notice of Allowance for U.S. Appl. No. 17/526,800, dated Mar. 1, 2023, 7 pages.

* cited by examiner

SOLID-STATE IMAGING DEVICE

CROSS REFERENCE TO RELATED APPLICATIONS

This application is a continuation of and claims priority to U.S. patent application Ser. No. 17/526,800, filed Nov. 15, 2021, which is a continuation of and claims priority to U.S. patent application Ser. No. 16/803,787, filed Feb. 27, 2020, now U.S. Pat. No. 11,222,916, which is a continuation of and claims priority to U.S. patent application Ser. No. 16/326,060, filed Feb. 15, 2019, now U.S. Pat. No. 10,680,028, which is a national stage application under 35 U.S.C. 371 and claims the benefit of PCT Patent Application No. PCT/JP2018/027845 having an international filing date of Jul. 25, 2018, which designated the United States, which PCT application claimed the benefit of Japanese Patent Application No. 2017-151980, filed Aug. 4, 2017, the entire disclosures of each of which are incorporated herein by reference.

TECHNICAL FIELD

The present disclosure relates to a solid-state imaging device (or imaging device) and/or an electronic device including an imaging device, and in particular, to a solid-state imaging device and/or an electronic device configured to suppress occurrence of noise.

BACKGROUND ART

A solid-state imaging device is used to capture an image in a camera or the like. In a front-illuminated solid-state imaging device in which light incident surface is arranged on a front surface of a semiconductor substrate, a quench circuit is arranged on the front surface side (light incident surface side) of the semiconductor substrate. As a result, an aperture ratio is decreased by the space.

On the other hand, in a back-illuminated solid-state imaging device, the quench circuit is arranged on the side (back side) opposite to the light incident surface of the semiconductor substrate. Even in the back-illuminated solid-state imaging device, sometimes, the size of each pixel is decreased due to factors such as an increase in the number of pixels. In such a case, due to restrictions in the process design, sometimes, the quench circuit may be necessarily arranged outside an active region of each pixel, and thus, in this case, the aperture ratio is also decreased. Therefore, there has been proposed a technique of arranging the quench circuit on a mount substrate instead of the semiconductor substrate (for example, PTL 1).

In addition, there has been proposed a technique of reducing the aperture ratio by increasing a distance from a reference plane including a surface of a semiconductor region to a readout wire line so as to be larger than a distance from the reference plane to a surface electrode and increasing the degree of freedom in designing a width of the readout wire line (for example, PTL 2).

In addition, there has been proposed a technique of reducing the noise by connecting a first semiconductor chip and a second semiconductor chip for exchanging signals through a connection region and forming a bump for exchanging signals and a shield member for surrounding the bump in the connection region (for example, PTL 3).

CITATION LIST

Patent Literature

[PTL 1]
JP 2013-89919A
[PTL 2]
JP 2016-192551A
[PTL 3]
JP 2015-60909A

SUMMARY

Technical Problem

However, in the technique of PTL 1, since the avalanche photodiode and the quench circuit are laminated, the distance between the cathode wire line connected to the adjacent avalanche photodiode and the electrode is shortened, so that the parasitic capacitance is increased. In addition, as the aperture ratio is increased, the density of the multiplication layer of the entire pixel portion is increased, and thus, the amount of current generated at breakdown is also increased, so that the amount of fluctuation in voltage of the anode at the time of occurrence of avalanche breakdown is increased. Therefore, it is difficult to suppress noise.

In addition, in the technique of PTL 2, it is difficult to reduce the influence of parasitic capacitance between readout wire lines, and in a case of miniaturization, it is difficult to suppress noise caused by the interference between the readout wire lines.

Furthermore, in the technique of PTL 3, the length of the shield member is increased, and thus, the resistance value is increased accordingly, so that, the amount of fluctuation in voltage of the anode at the time of occurrence of avalanche breakdown is increased. Therefore, it is difficult to suppress noise.

The present disclosure has been made in view of such a situation, and the present disclosure intends to suppress noise.

Solution to Problem

One aspect of the present disclosure is an imaging device including a first chip. The first chip includes a first pixel and a second pixel, the first pixel including a first anode region and a first cathode region, the second pixel including a second anode region and a second cathode region. The first chip includes a first wiring layer including a first anode electrode, a first anode via coupled to the first anode electrode and the first anode region, and a second anode via coupled to the first anode electrode and the second anode region.

In a plan view, the first and second pixels are adjacent to one another, and, in the plan view, the first anode electrode and the first and second anode vias are between the first and second cathode regions.

The first chip further comprises an insulating material between the first anode region and the second anode region. In the plan view, the first anode electrode overlaps portions of the first anode region, the second anode region, and the insulating material.

In the plan view, the first and second anode vias are aligned with one another along a first direction.

The imaging device further comprises a second chip bonded to the first chip and including circuitry for processing signals from the first and second pixels.

The second chip further comprises a second wiring layer that includes a second anode electrode coupled to the first anode electrode, a first anode wiring, a third anode via coupled to the second anode electrode and the first anode wiring, and a fourth anode via coupled to the second anode electrode and the first anode wiring.

The first wiring layer further comprises a first cathode electrode, a first cathode via coupled to the first cathode region and the first cathode electrode, a second cathode electrode, and a second cathode via coupled to the second cathode region and the second cathode electrode.

The imaging device further comprises a second chip bonded to the first chip and including circuitry for processing signals from the first and second pixels. The second chip includes a second wiring layer that includes a second anode electrode coupled to the first anode electrode, a first anode wiring, a third anode via coupled to the second anode electrode and the first anode wiring, and a fourth anode via coupled to the second anode electrode and the first anode wiring.

The second wiring layer further comprises a third cathode electrode coupled to the first cathode electrode, a first cathode wiring, a third cathode via coupled to the third cathode electrode and the first cathode wiring, a fourth cathode electrode coupled to the second cathode electrode, a second cathode wiring, and a fourth cathode via coupled to the fourth cathode electrode and the second cathode wiring.

The second wiring layer further comprises a third cathode wiring, a fifth cathode via coupled to the first cathode wiring and the third cathode wiring, a fourth cathode wiring, and a sixth cathode via coupled to the second cathode wiring and the third cathode wiring.

The first wiring layer further comprises a first cathode electrode, a first cathode wiring between the first cathode electrode and the first cathode region in a cross-sectional view, and a plurality of cathode vias coupled to the first cathode region and the first cathode wiring. The first cathode wiring is coupled to the first cathode electrode.

In a plan view, a first cathode via of the plurality of cathode vias is at a center portion of the first cathode region and a remainder of the plurality of cathode vias are at edge portions of the first cathode region.

The remainder of the plurality of cathode vias are arranged symmetrically around the first cathode via at the edge portions of the first cathode region.

The first wiring layer further comprises a first shield wiring that overlaps the first anode region and the second anode region in a plan view.

The shield wiring is coplanar with the first cathode wiring.

The first wiring layer further comprises a second shield wiring that overlaps the first cathode wiring and the first shield wiring in the plan view.

The second shield wiring is coplanar with the first cathode electrode.

In one aspect of the present disclosure, an imaging device comprises a first chip including a first pixel including a first anode region and a first cathode region. The first chip includes a first wiring layer includes a first cathode electrode, a first cathode wiring between the first cathode electrode and the first cathode region in a cross-sectional view, and a plurality of cathode vias coupled to the first cathode region and the first cathode wiring. The first cathode wiring is coupled to the first cathode electrode.

In a plan view, a first cathode via of the plurality of cathode vias is at a center portion of the first cathode region and a remainder of the plurality of cathode vias are arranged symmetrically around the first cathode via at edge portions of the first cathode region.

The imaging device may be mounted on a moving body.

In one aspect of the present disclosure, an electronic device comprises an imaging device including a first chip, the first chip including a first pixel and a second pixel. The first pixel includes a first anode region and a first cathode region, and the second pixel includes a second anode region and a second cathode region. The first chip includes a first wiring layer including a first anode electrode, a first anode via coupled to the first anode electrode and the first anode region, and a second anode via coupled to the first anode electrode and the second anode region.

Advantageous Effects of Invention

As described above, according to one aspect of the present disclosure, it is possible to suppress noise. In addition, the effects described herein are not necessarily limited, and any of the effects described in this specification may be obtained.

DESCRIPTION OF EMBODIMENTS

Hereinafter, embodiments for implementing the present disclosure will be described. In addition, the description will be made in the following order.
1. First Embodiment: SPAD pixel chip (FIGS. 1 to 10B)
2. Second Embodiment: SPAD Pixel Chip (FIGS. 11 and 12)
3. Third Embodiment: SPAD pixel chip (FIGS. 13 to 16)
4. Fourth Embodiment: SPAD pixel chip (FIGS. 17 to 19)
5. Fifth Embodiment: SPAD pixel chip (FIGS. 20 to 24)
6. Sixth Embodiment: SPAD pixel chip (FIGS. 25 to 28)
7. Seventh Embodiment: SPAD pixel chip (FIGS. 29 to 32)
8. Eighth Embodiment: SPAD pixel chip (FIGS. 33 to 36)
9. Ninth Embodiment: SPAD pixel chip (FIGS. 37 to 40)
10. Tenth Embodiment: SPAD pixel chip (FIGS. 41 to 44)
11. Eleventh Embodiment: SPAD pixel chip (FIGS. 45 to 48)
12. Twelfth Embodiment: SPAD pixel chip (FIGS. 49 to 51)
13. Thirteenth Embodiment: SPAD pixel chip (FIGS. 52 to 54)
14. Fourteenth Embodiment: SPAD pixel chip (FIGS. 55 to 57)
15. Application Example to Moving Body (FIGS. 58 and 59)
16. Others First Embodiment (SPAD Pixel Chip (FIGS. 1 to 10B))

First, a first embodiment will be described with reference to FIGS. 1 to 10B.

Figure 1:
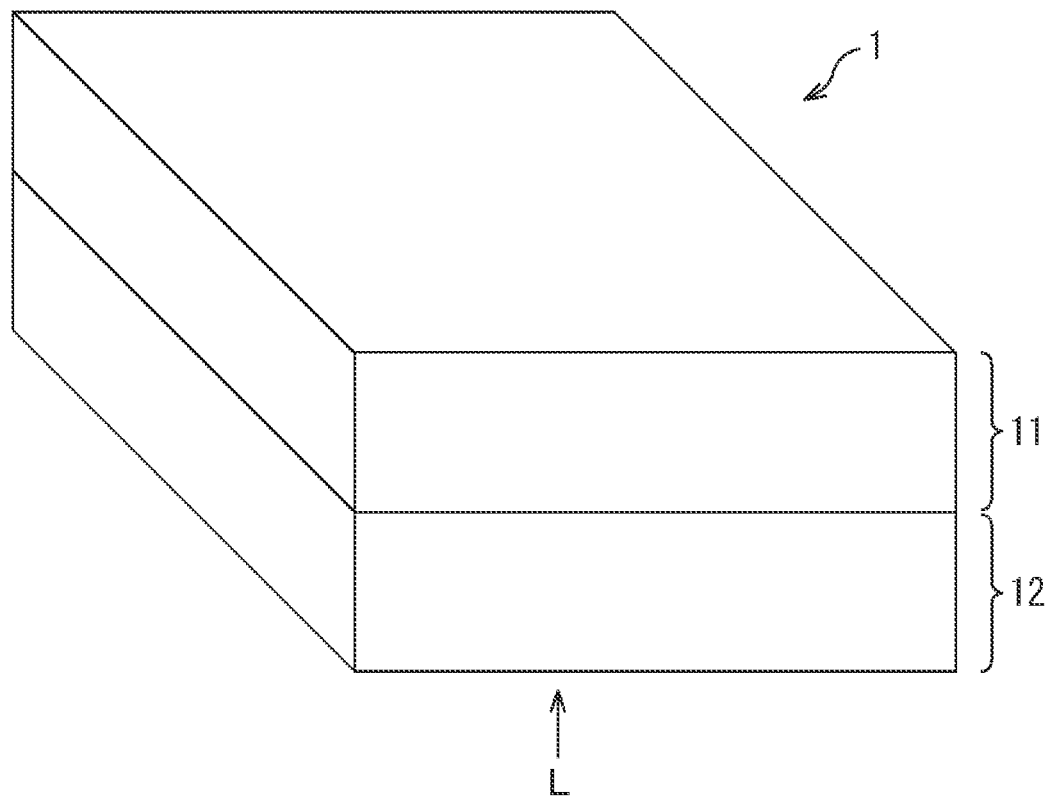
FIG. 1 is a perspective view illustrating a configuration of an SPAD pixel chip.
Figure 2:
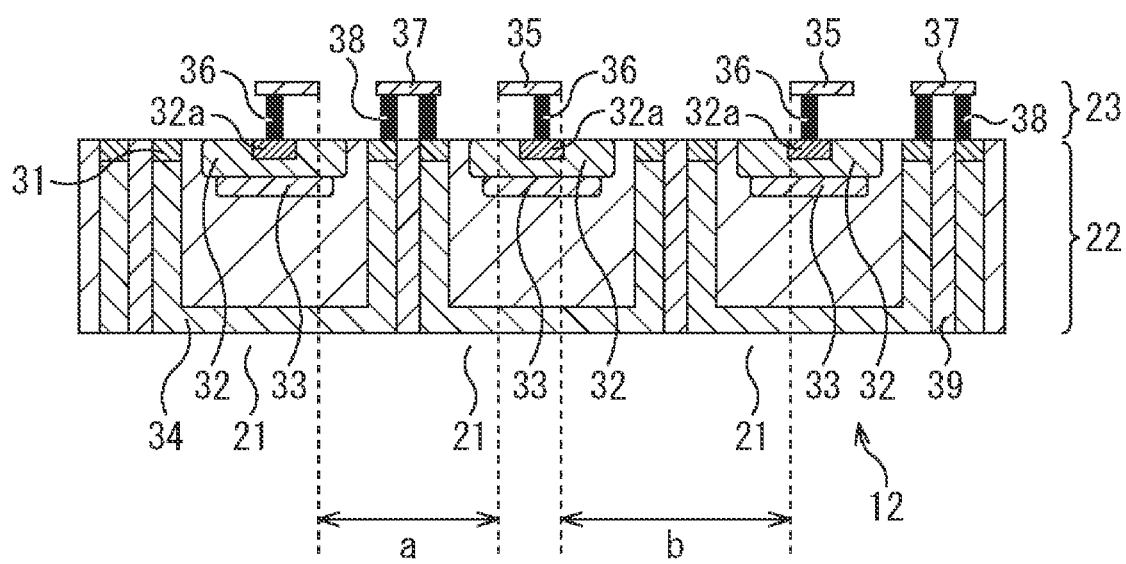
FIG. 2 is a cross-sectional view illustrating a configuration of a photodiode chip.
Figure 3:
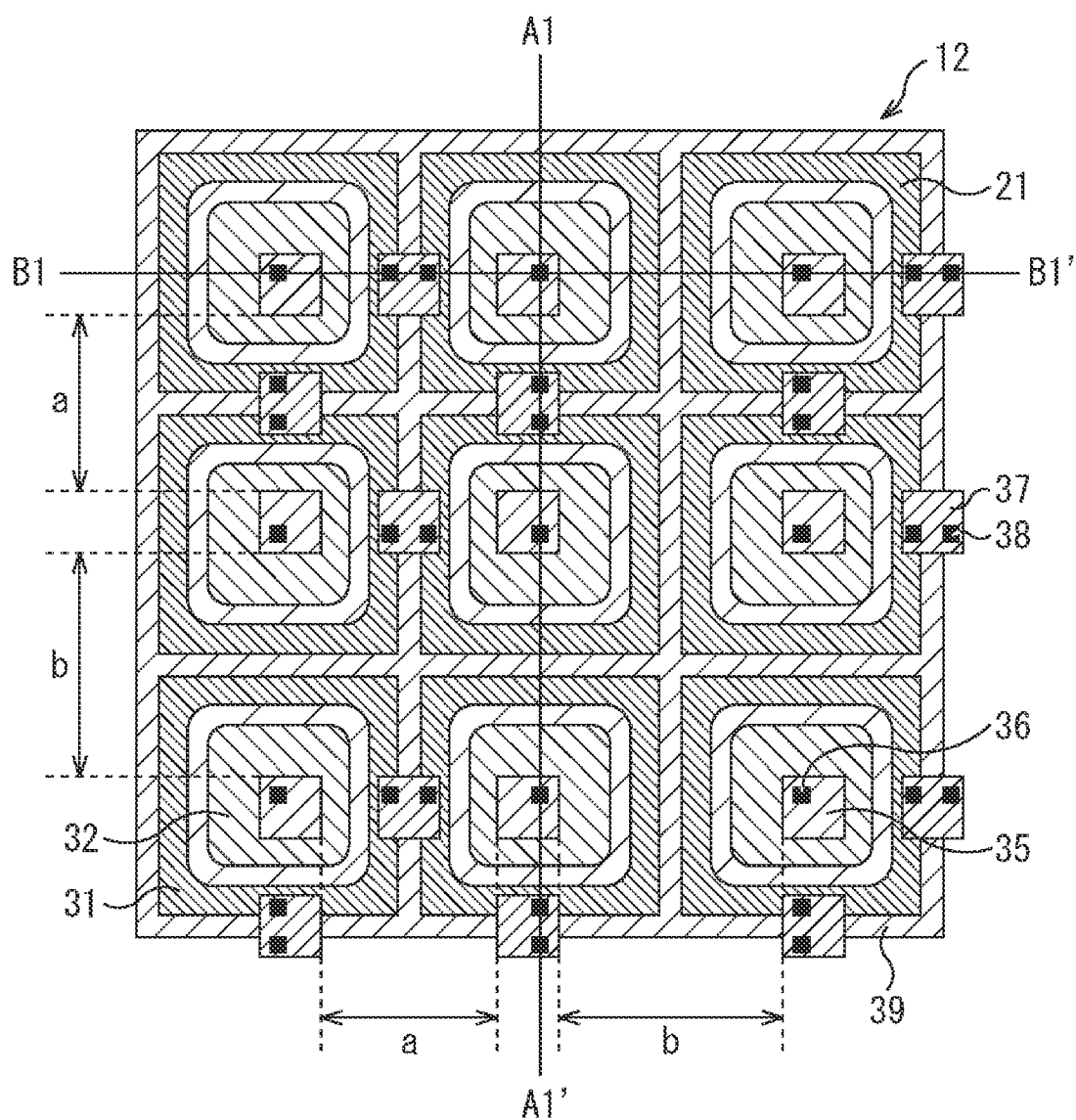
FIG. 3 is a plan view illustrating a configuration of a photodiode chip.
Figure 4:
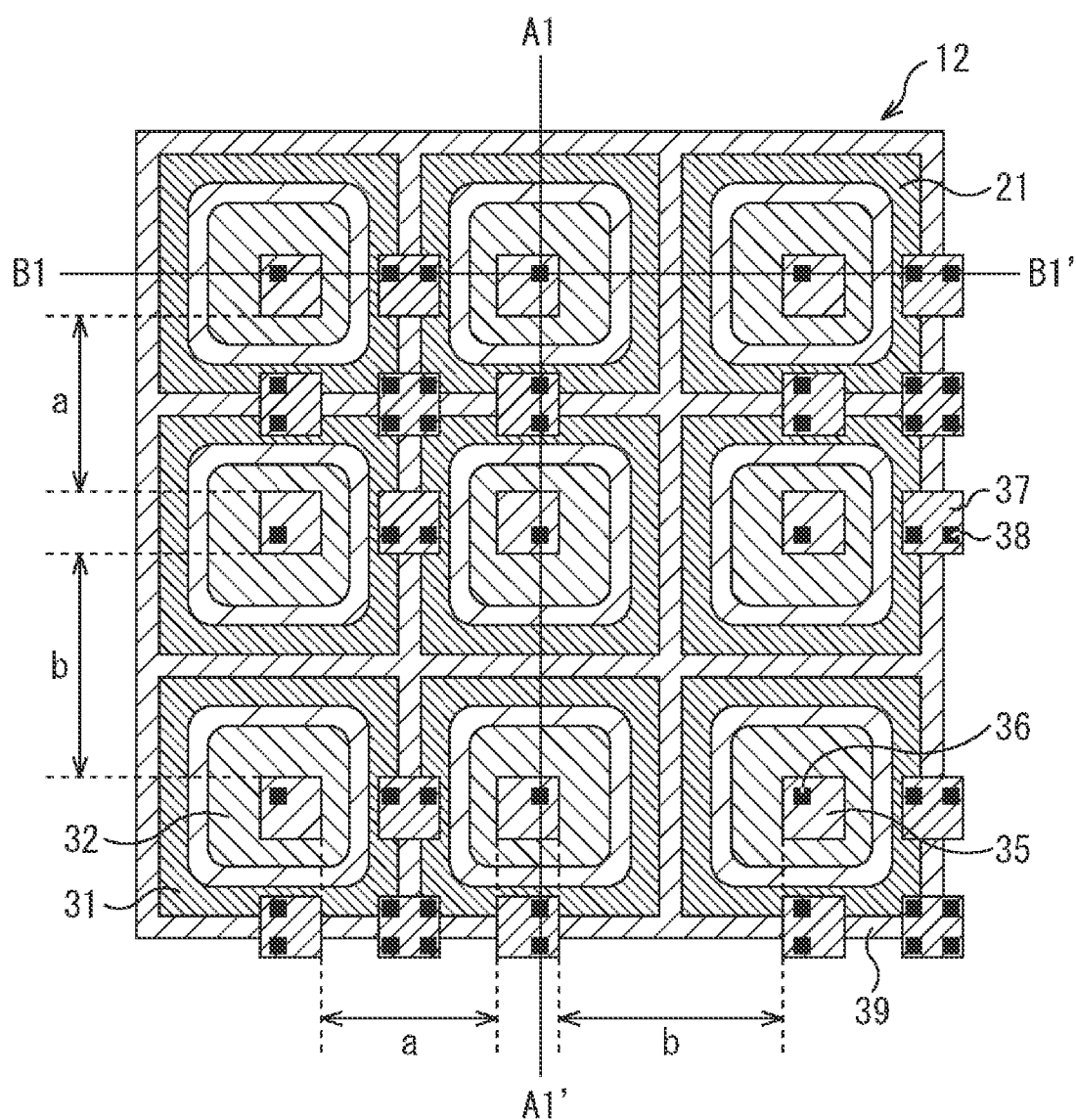
FIG. 4 is a plan view illustrating a configuration of a photodiode chip.
Figure 5:
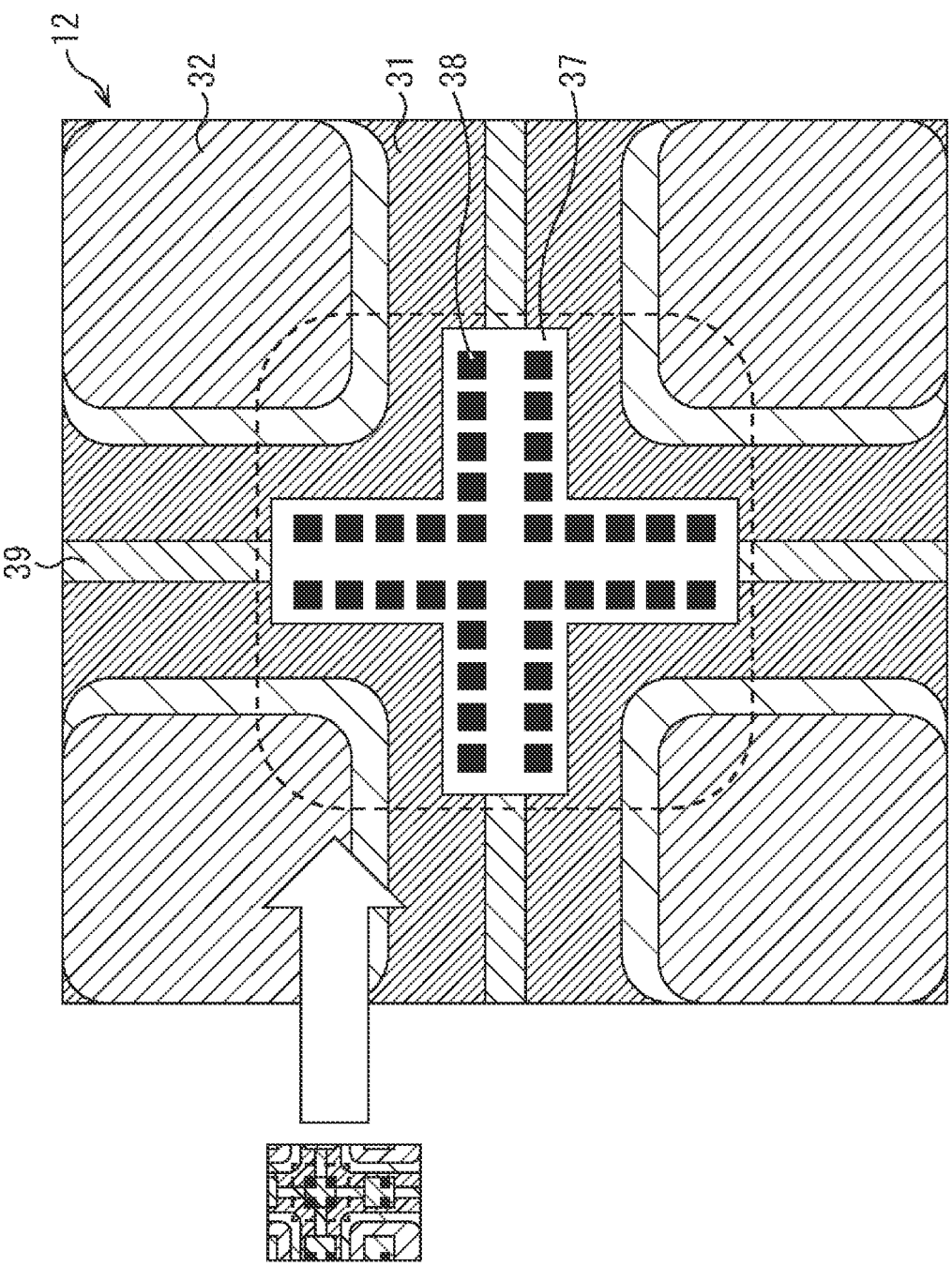
FIG. 5 is a plan view illustrating a configuration of a photodiode chip.

FIG. 1 is a perspective view illustrating a configuration of an SPAD pixel chip, FIG. 2 is a cross-sectional view illustrating a configuration of a photodiode chip, and FIGS. 3 to 5 are plan views illustrating a configuration of a photodiode chip. FIG. 2 illustrates a configuration of a cross section of the photodiode chip 12 taken along line A1-A1' or line B1-B1' in FIG. 3 or FIG. 4. In addition, the illustration of lenses and the like is omitted.

As illustrated in FIG. 1, a single photon avalanche diode (SPAD) pixel chip 1 as a solid-state imaging device is configured by bonding a circuit chip 11 having a quench circuit and the like and a photodiode chip 12 having a photodiode which photoelectrically converts light from an object (not illustrated). The light L from the object (not illustrated) is incident on the photodiode chip 12 from the lower side in FIG. 1. A signal photoelectrically converted by the photodiode chip 12 is supplied to a quench circuit in the circuit chip 11 and processed. That is, the SPAD pixel chip 1 is a back-illuminated lamination-type solid-state imaging device, and the SPAD pixel chip can detect faint light by using an avalanche phenomenon.

In the photodiode chip 12, n×m (n and m are arbitrary integers) number of SPAD pixels 21 (hereinafter, also simply referred to as pixels 21) are arranged in a matrix shape, but in the drawing, only the pixels 21 are illustrated. This also applies to the other embodiments described below. In the example of FIGS. 3 and 4, 3×3 pixels 21 are illustrated. The pixels 21 are separated by a pixel separation portion (or insulating material) 39 so as to be independent from each other. The pixel 21 includes an Si layer 22 and a wiring layer 23.

An anode 31 and a cathode 32 are formed in each pixel 21 of the Si layer 22, and an anode multiplication layer 33 is formed on the light incident side (the lower side in FIG. 2) of the cathode 32. That is, the SPAD is formed. In addition, a hole accumulation layer 34 is formed so as to surround each pixel 21. In addition, the pixel separation portion 39 and the hole accumulation layer 34 may be omitted.

For example, in each component inside the Si layer 22, the cathode 32 includes an N-type semiconductor, the anode 31 includes a P-type semiconductor, the pixel separation portion 39 includes an oxide, the anode multiplication layer 33 includes a PN junction, the hole accumulation layer 34 includes P-type semiconductor having a concentration lower than that of to the anode 31. The P-type semiconductor and the N-type semiconductor may be interchanged.

In the wiring layer 23, a cathode via 36 is connected to the cathode 32. The portion to which the cathode via 36 of the cathode 32 is connected is formed as a portion 32a having a higher impurity concentration than other portions in order to facilitate connection of the cathode via 36 which includes a metal. A cathode electrode 35 including a metal is connected to the side of the cathode via 36 opposite to the portion to which the cathode 32 is connected. In the example of FIGS. 2 and 3, one cathode via 36 is connected to one cathode electrode 35. However, a plurality of cathode vias 36 may be connected to one cathode electrode 35. The cathode 32 is connected to the quench circuit in the circuit chip 11 through the cathode via 36 and the cathode electrode 35.

An anode via 38 is connected to the anode 31, and an anode electrode 37 is connected to the side opposite to the portion of the anode via 38 to which the anode 31 is connected. The anode via 38 and the anode electrode 37 also include metal. Similarly to the cathode electrode 35, one anode via 38 may be connected to one anode electrode 37. However, as illustrated in FIG. 3, a plurality (two in the example of FIG. 3) of the anode vias 38 may be connected.

In addition, in all the embodiments described later as well as this embodiment, electrodes, wire lines, and vias include a metal.

FIG. 5 is a plan view illustrating a configuration of the photodiode chip. In the example of FIG. 5, thirty six anode vias 38 are connected to one anode electrode 37. Since a relatively large current flows in the SPAD, it is preferable to increase the number of the anode vias 38 and the cathode vias 36.

In addition, the cathode electrode 35 and the cathode via 36 may be integrated with each other, and the anode electrode 37 and the anode via 38 may be integrated with each other.

The anode 31 is connected to an anode power supply (anode power supply 40 in FIG. 8 to be described later) in the circuit chip 11 through the anode via 38 and the anode electrode 37.

In this example, the cathode electrode 35 and the anode electrode 37 has a quadrangular shape, particularly, a square shape.

In addition, although illustration is omitted, the spaces between the cathode via 36, the cathode electrode 35, the anode via 38, the anode electrode 37, and the like of the wiring layer 23 are filled with an insulator (for example, SiO2 or the like).

Figure 6:
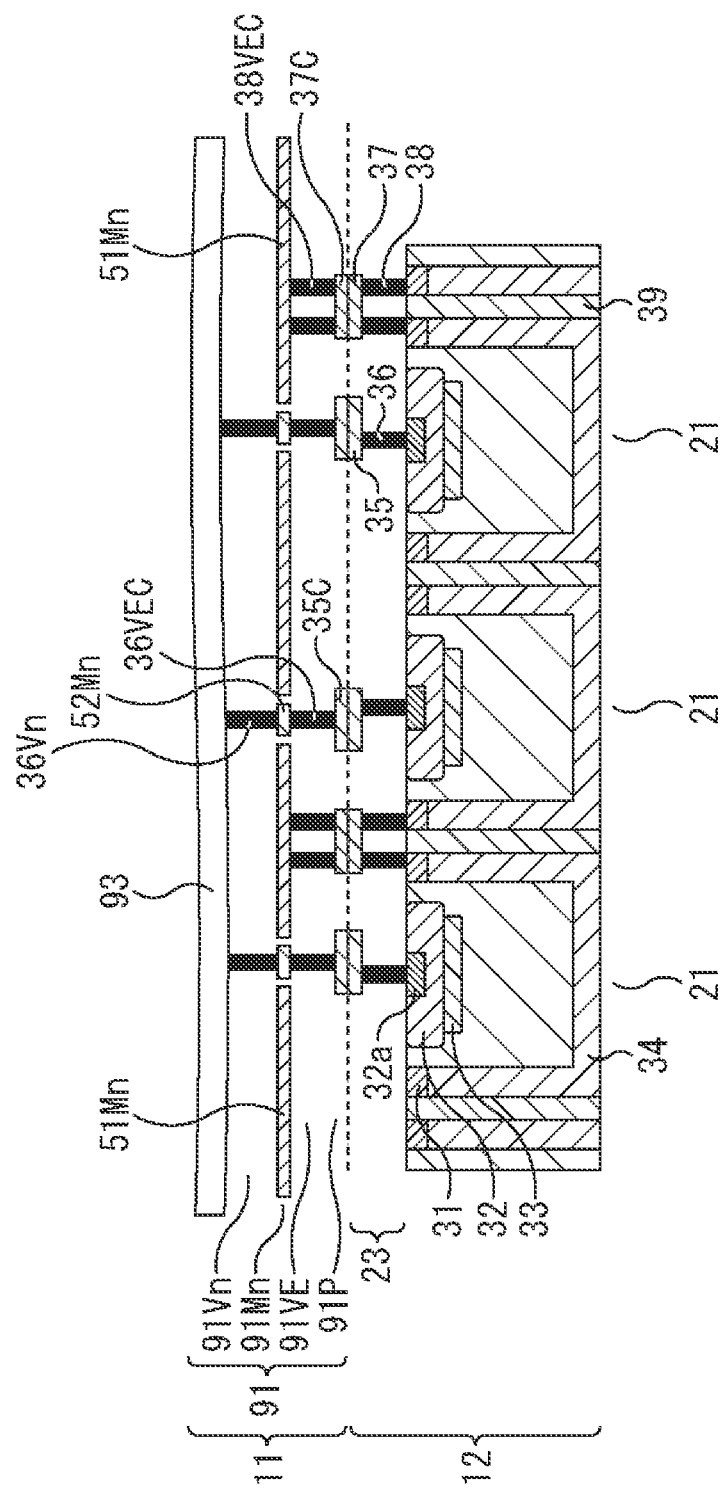
FIG. 6 is a cross-sectional view illustrating a configuration of an SPAD pixel chip.
Figure 7:
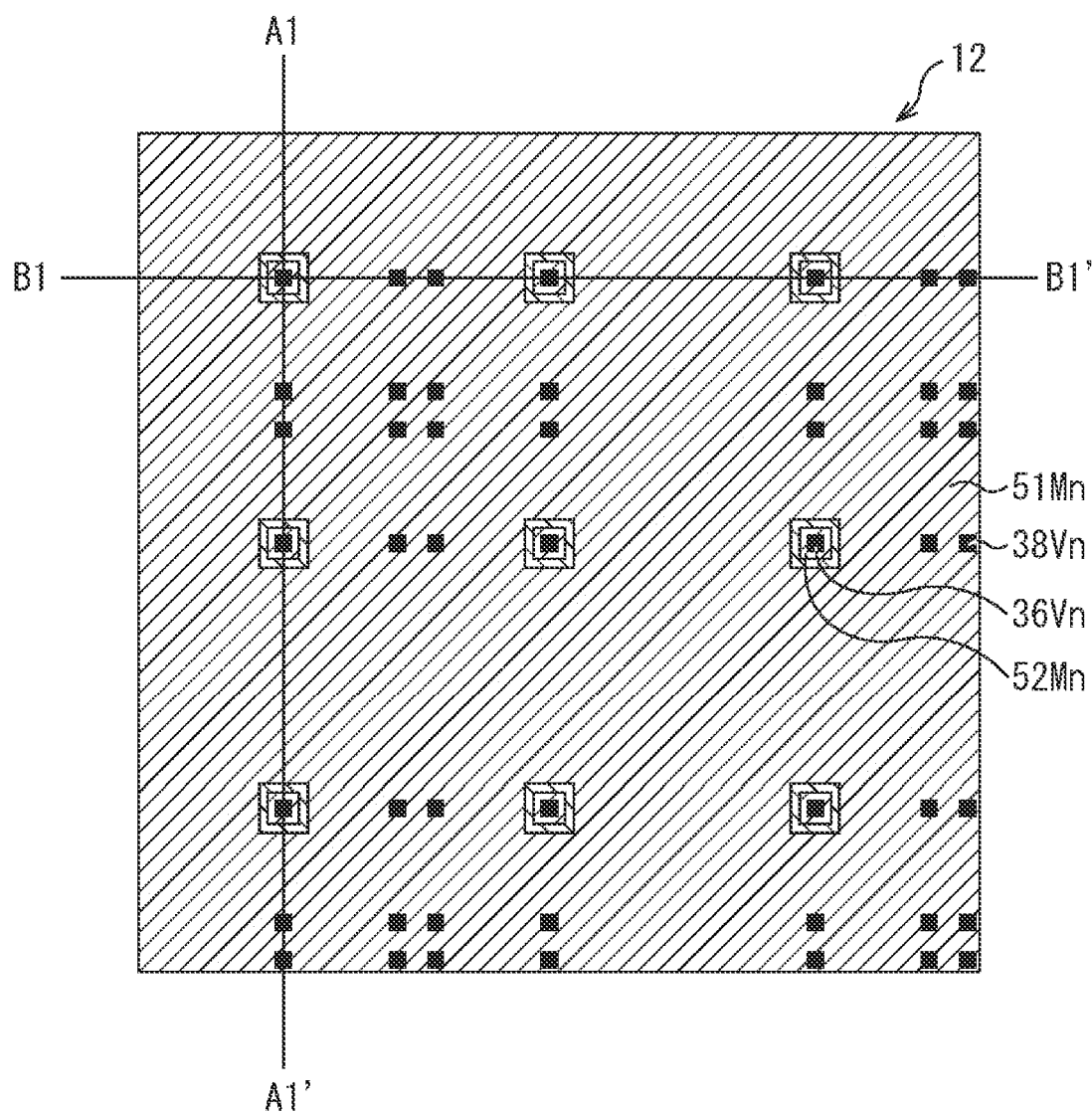
FIG. 7 is a plan view illustrating a configuration of an SPAD pixel chip.

FIG. 6 is a cross-sectional view illustrating a configuration of the SPAD pixel chip, and FIG. 7 is a plan view illustrating a configuration of the SPAD pixel chip. FIG. 6 is a cross-sectional view taken along line A1-A1' or line B1-B1' of FIG. 7.

FIG. 6 illustrates a configuration of a wiring layer 91 of the circuit chip 11 connected to the wiring layer 23 of the photodiode chip 12 illustrated in FIG. 2. As illustrated in FIG. 6, the wiring layer 91 is formed on the side of the circuit chip 11 so as to be electrically connected to the wiring layer 23 of the photodiode chip 12.

The wiring layer 91 includes an electrode layer 91P, a VE layer 91VE, an Mn layer 91Mn, and a Vn layer 91Vn in order from the side closer to the wiring layer 23.

In the wiring layer 91, a cathode electrode 35C and an anode electrode 37C are provided to be connected to the cathode electrode 35 and the anode electrode 37 of the photodiode chip 12, respectively. For example, the cathode electrodes 35 and the 35C are bonded to one another. The cathode electrode 35C is connected to a cathode wire line (or cathode wiring) 52Mn through a cathode via 36VEC. The cathode wire line 52Mn is further connected to another layer illustrated as a portion 93 in the figure through the cathode via 36Vn. However, the detailed configuration is not illustrated.

The anode electrode 37C is connected to the anode wire line 51Mn through an anode via 38VEC. The anode wire line 51Mn is further connected to a portion 93 through an anode via (not illustrated) and is connected to an anode power supply 40 (refer to FIG. 8 described later) therefrom.

Figure 8:
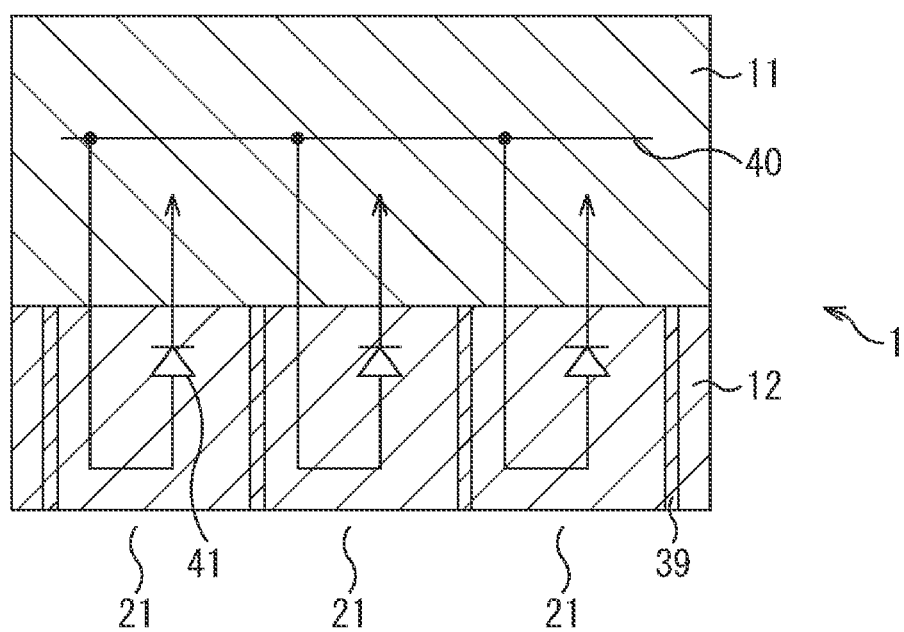
FIG. 8 is a view illustrating connection of photodiodes.

FIG. 8 is a view illustrating the connection of photodiodes. As illustrated in FIG. 8, the pixels 21 separated by the pixel separation portion 39 so as to be independent from each other are provided with respective photodiodes 41, each of which is an SPAD configured with the cathode 32 and the anode 31. The cathodes 32 of the respective pixels 21 are independently connected to a quench circuit (not illustrated) of the circuit chip 11. In addition, the anodes 31 of the respective pixels 21 are independently connected to the anode power supply 40 as a fixed potential of the circuit chip 11.

It may be considered that the anode power supply is formed on the side of the photodiode chip 12. That is, a configured may be considered where the anodes 31 of the respective photodiodes 41 are commonly connected to the anode power supply and the anode power supply is connected to the anode power supply 40 on the circuit chip 11 side through one anode via. However, such a configuration is not adopted in this embodiment. With such a configuration, as the distance from one anode via, through which power is supplied from the circuit chip 11 side to the anode power supply of the photodiode chip 12 side, to the anode 31 of each pixel 21 is increased, the resistance therebetween is increased. The larger the resistance, the larger the voltage drop by that amount, so that variation occurs in each pixel 21.

On the other hand, in this embodiment, the anodes 31 of the respective pixels 21 are independently connected to the anode power supply 40 of the photodiode chip 12 side. As a result, the distance from the anode 31 of each pixel 21 to the anode power supply 40 of the photodiode chip 12 side becomes shortest (or shorter) distance, and thus, the resistance is minimized (or reduced) so that the voltage drop is also minimized (or reduced). In addition, the resistance of the respective pixels 21, hence the voltage drops, are equalized, and variations are suppressed. As a result, noise is also suppressed.

As illustrated in FIG. 3, in the first embodiment, the cathode vias 36 are arranged at the centers of the pixels 21 in plan view. However, with respect to the cathode electrodes 35, the distance between the cathode electrode 35 in the pixel 21 in the odd-numbered row and the cathode electrode 35 in the pixel 21 in the even-numbered row therebelow is set to "a". In addition, the distance between the cathode electrode 35 in the pixel 21 in the even-numbered row and the cathode electrode 35 in the pixel 21 in the odd-numbered row therebelow is set to "b". In addition, the distance "a" is set to be shorter than the distance "b" (a<b).

For example, the distance "a" between the cathode electrode 35 of the pixel 21 in the first row and the cathode electrode 35 in the second row is set to be larger than the distance "b" between the cathode electrode 35 of the pixel 21 in the second row and the cathode electrode 35 in the third row.

Similarly, the distance between the cathode electrode 35 in the pixel 21 in the odd-numbered column and the cathode electrode 35 in the pixel 21 in the even-numbered column on the right side is set to be "a". In addition, the distance between the cathode electrode 35 in the pixel 21 in the even-numbered column and the cathode electrode 35 in the pixel 21 in the right odd-numbered column on the right side is set to be "b". In addition, the distance "a" is set to be shorter than the distance "b" (a<b).

For example, the distance "a" between the cathode electrode 35 in the pixel 21 in the first column and the cathode electrode 35 in the second column is set to be shorter than the distance "b" between the cathode electrode 35 in the pixel 21 in the second column and the cathode electrode 35 in the third column.

That is, the cathode electrode 35 is set so that the distance from the adjacent other cathode electrode 35 can be the distance "a" shorter than the average value ((a+b)/2) or can be the longer distance "b".

More specifically, the cathode vias 36 are arranged at the centers of the pixels 21 in plan view. However, with respect to the cathode electrodes 35, the cathode electrodes 35 in the pixels 21 in the odd-numbered row and the odd-numbered column are arranged so that the cathode via 36 is located at the upper left of the cathode electrode 35. The cathode electrodes 35 in the pixels 21 in the odd-numbered row and the even-numbered column are arranged so that the cathode via 36 is located at the upper right of the cathode electrode 35.

In addition, the cathode electrodes 35 in the pixels 21 in the even-numbered rows and the odd-numbered columns are arranged so that the cathode via 36 is located at the lower left of the cathode electrode 35. The cathode electrodes 35 in the pixels 21 in the even-numbered rows and the even-numbered columns are arranged so that the cathode via 36 is located at the lower right side of the cathode electrode 35.

The anode electrodes 37 (anode via 38) are arranged between the adjacent cathode electrodes which are closer in distance (between the cathode electrodes 35 at the distance "a" in the figure) among the adjacent cathode electrodes 35 (cathode via 36). That is, as illustrated in FIG. 3, the anode electrodes 37 (anode vias 38) as shield electrodes are arranged between the cathode electrodes 35 in the pixels 21 in the first row and the second row, between the cathode electrodes 35 in the pixels 21 in the third row and the fourth row (not illustrated), and the like. Similarly, the anode electrodes 37 (anode via 38) are arranged between the cathode electrodes 35 in the pixels 21 in the first column and the second column, between the cathode electrodes 35 in the pixels 21 in the third column and the fourth column (not illustrated), and the like.

As illustrated in FIG. 3, the basic configuration based on this rule is that a total of four anode electrodes 37 are arranged among the 2×2 (a total of four) pixels 21 so that one anode electrode 37 is arranged between the cathode electrodes 35 having the distance "a". With such a configuration, the space between the cathode electrode 35 and the other cathode electrode 35 having the closest distance from the cathode electrode 35 can be shielded by the anode electrode 37, so that it is possible to suppress interference of cathode signals caused by parasitic capacitance between the cathode electrodes 35.

In contrast, in the example of FIG. 4, one anode electrode 37 is further arranged at the center position of the 2×2 (a total of four) pixels 21, and thus, a total of five anode electrodes 37 are arranged, so that the more shielding effect is expected.

In addition, the cathode electrode 35 and the anode electrode 37 reflect light being incident from the back surface (the lower side in FIG. 2) and passing through the Si layer 22 toward the Si layer 22 side. In addition, these components reflect light being generated in the circuit chip 11 by driving the circuit chip 11 and being directed toward the photodiode chip 12 (toward the Si layer 22) toward the circuit chip 11. Therefore, the photodiode chip 12 and the circuit chip 11 can be optically separated from each other.

The number of anode electrodes 37 per pixel 21 is 1 in the example of FIG. 3 and 1.25 in the example of FIG. 4. As a result, the pixel 21 and the anode power supply 40 can be connected to each other with low resistance, and thus, it is possible to suppress fluctuation in voltage when a current flows in the anode power supply during avalanche. In addition, it is possible to suppress generation of noise (for example, superimposition of noise on the cathode electrode 35 (cathode via 36) through the anode electrode 37 (anode via 38)) caused by the fluctuation in voltage of the anode power supply 40.

Figure 9B:
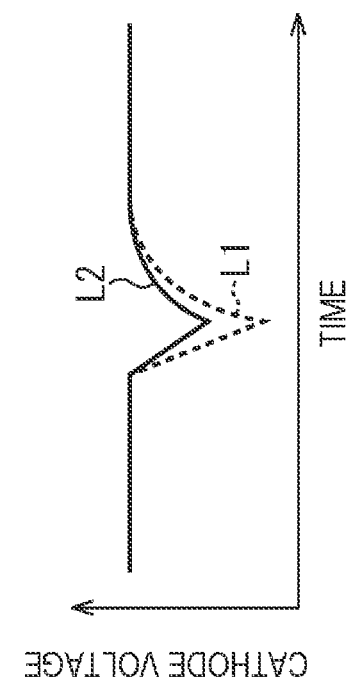
FIGS. 9A and 9B are views illustrating a shielding effect.
Figure 9A:
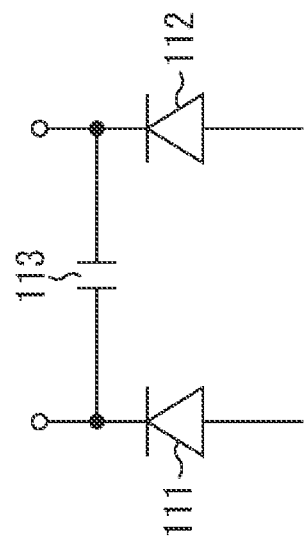

Next, the shielding effect will be described. FIGS. 9A to 10B are views illustrating the shielding effect. A case where it is not shielded by the anode electrode 37 is illustrated in FIGS. 9A and 9B. That is, as illustrated in FIG. 9A, the photodiode 111 and the photodiode 112 are adjacent to each other, and it is assumed that a parasitic capacitance 113 exists between the cathodes 32 of both photodiodes. In this state, if avalanche occurs in the photodiode 111, the output voltage of the cathode 32 thereof rapidly and greatly drops temporarily only in the generation interval as indicated by the line L1 in FIG. 9B.

On the other hand, as indicated by the line L2 in FIG. 9B, the output voltage of the cathode 32 of the photodiode 112 where avalanche does not occur also rapidly and greatly drops temporarily at the timing when avalanche occurs in the photodiode 111. The output value thereof is Cp/Ctotal times the output of the photodiode 111. Cp is the value of the parasitic capacitance 113 between the cathode 32 of the photodiode 111 and the cathode 32 of the photodiode 112, and Ctotal is the value of the capacitance of the cathode 32 of the photodiode 111.

Figure 10B:
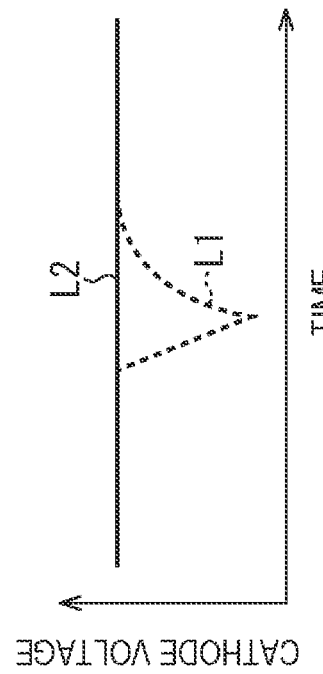
FIGS. 10A and 10B are views illustrating a shielding effect.
Figure 10A:
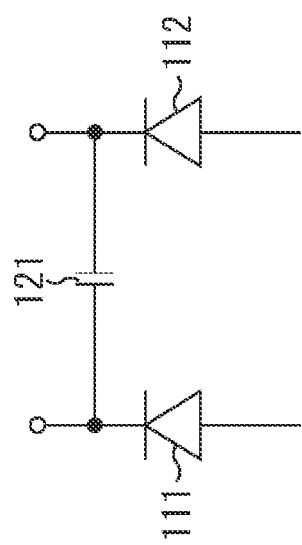

In contrast, a case where the space between the cathode 32 of the photodiode 111 and the cathode 32 of the photodiode 112 is shielded by the anode electrode 37 illustrated in FIGS. 10A and 10B. That is, in this case, as illustrated in FIG. 10A, the capacitance value of the parasitic capacitance 121 between the cathode 32 of the photodiode 111 and the cathode 32 of the photodiode 112 is smaller than that of the capacitance 113 due to the anode electrode 37 (anode via 38) as the shield electrode. In addition, in this case, if avalanche occurs in the photodiode 111, the output voltage of the cathode 32 thereof rapidly and greatly drops temporarily only in the generation interval as indicated by the line L1 in FIG. 10B.

However, the output voltage of the cathode 32 of the photodiode 112 where avalanche does not occur is hardly changed as indicated by the line L2 in FIG. 10B. That is, the influence of the adjacent photodiodes 111 is reduced.

In addition, the area of the cathode electrode 35 is set to be equal to or smaller than the area of the anode electrode 37 as a shield electrode. This also applies to all other embodiments. Therefore, the capacitance of the cathode 32 can be decreased, and the capacitance of the fixed potential can be increased, which is advantageous for suppressing noise.

In addition, by insulating and separating the pixels 21 by the pixel separation portion 39, it is possible to suppress the interference therebetween in the Si layer 22 at the time of occurrence of avalanche.

In addition, hereinafter, other embodiments will be described, but only the differences from the other embodiments will be mainly described, and description of the same points will be omitted.

Second Embodiment (SPAD Pixel Chip (FIG. 11, FIG. 12))

Next, a second embodiment will be described with reference to FIGS. 11 and 12.

Figure 11:
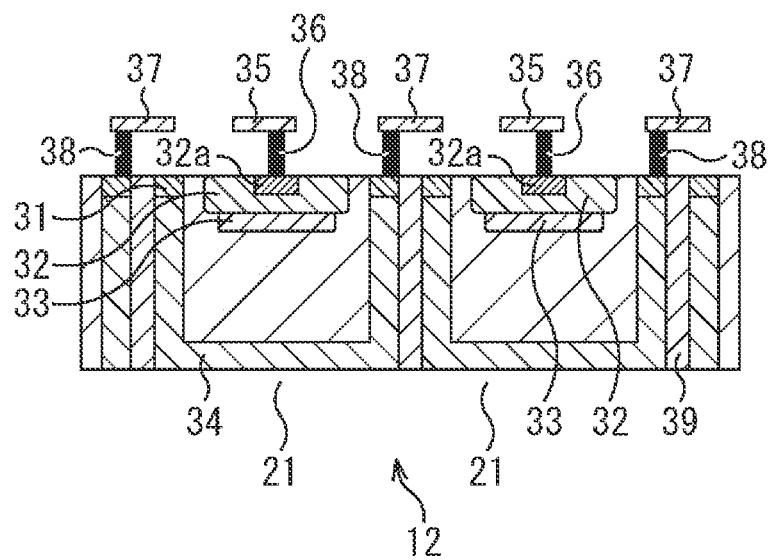
FIG. 11 is a cross-sectional view illustrating a configuration of a photodiode chip.
Figure 12:
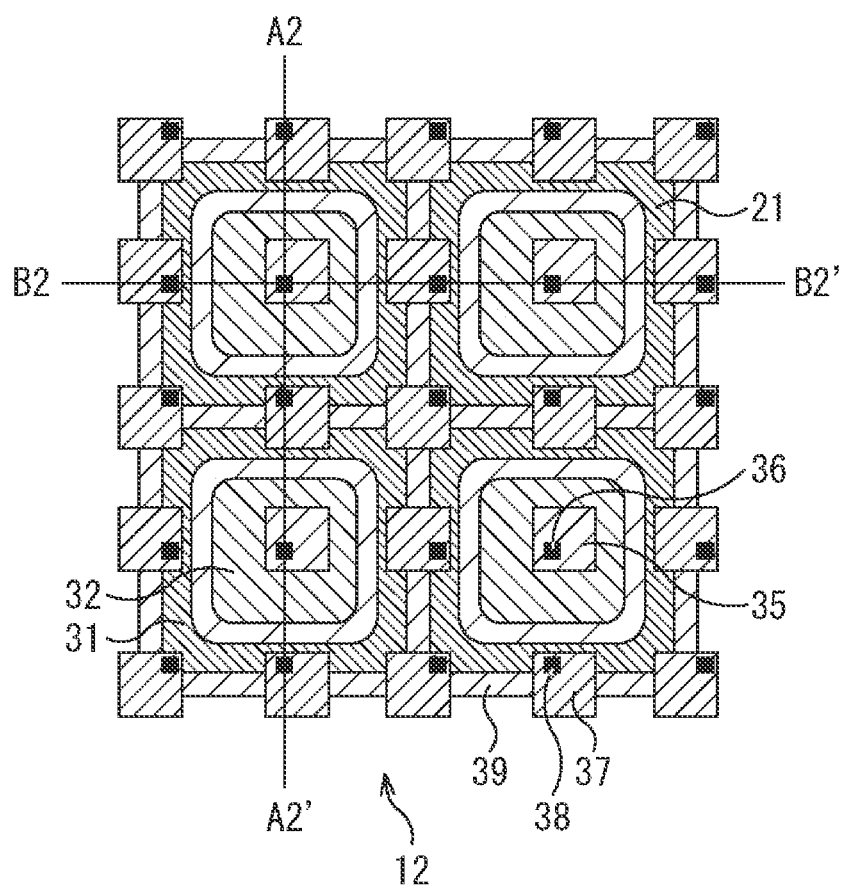
FIG. 12 is a plan view illustrating a configuration of a photodiode chip.

FIG. 11 is a cross-sectional view illustrating a configuration of a photodiode chip, and FIG. 12 is a plan view illustrating a configuration of the photodiode chip. FIG. 11 illustrates a configuration of a cross section of the photodiode chip 12 taken along line A2-A2' or line B2-B2' of FIG. 12. In addition, the illustration of the wiring layer 91 of the circuit chip 11 is omitted.

In this second embodiment, the cathode vias 36 are arranged at the centers of the pixels 21 in plan view. In addition, in all the pixels 21, the cathode electrodes 35 are arranged so that the cathode via 36 is located at the lower left of the cathode electrode 35. As a result, the intervals between the cathode electrodes 35 are all the same.

In each pixel 21, the anode electrodes 37 are arranged at the lower left, the left center, and the lower center of the cathode electrode 35. As a result, the anode electrodes 37 are arranged at the upper left, the left center, the lower left, the lower center, the lower right, the right center, the upper right, and the upper center thereof so as to surround the cathode electrode 35 of each pixel 21. The anode vias 38 are arranged so as to be located at the upper right for the anode electrode 37 of the lower left, at the lower right for the anode electrode 37 of the left center, and at the upper left for the anode electrode 37 of the lower center. That is, the pixels 21 are configured to have translational symmetry.

Since the anode electrodes 37 (anode vias 38) are arranged between all the cathode electrodes 35 (cathode vias 36) vertically and laterally adjacent to each other, it is possible to further improve the effect of reducing the noise caused by parasitic capacitance between the cathode electrodes 35 (cathode vias 36).

Furthermore, in the second embodiment, the pixel 21 has the same layout as that of the adjacent pixel 21 with respect to the arrangement of the cathode electrode 35, the cathode via 36, the anode electrode 37, and the anode via 38.

Therefore, electric characteristics (for example, a method of treating the parasitic capacitance caused by the cathode electrode 35, the cathode via 36, the anode electrode 37, the anode via 38, and the like in the adjacent pixel 21) of each pixel 21 can be allowed to be uniform. In addition, optical characteristics (for example, oblique incidence characteristics affected by the arrangement of the cathode electrode 35, the cathode via 36, the anode electrode 37, the anode via 38, and the like) can be allowed to be uniform.

Third Embodiment (SPAD Pixel Chip (FIGS. 13 to 16))

Next, a third embodiment will be described with reference to FIGS. 13 to 16.

Figure 13:
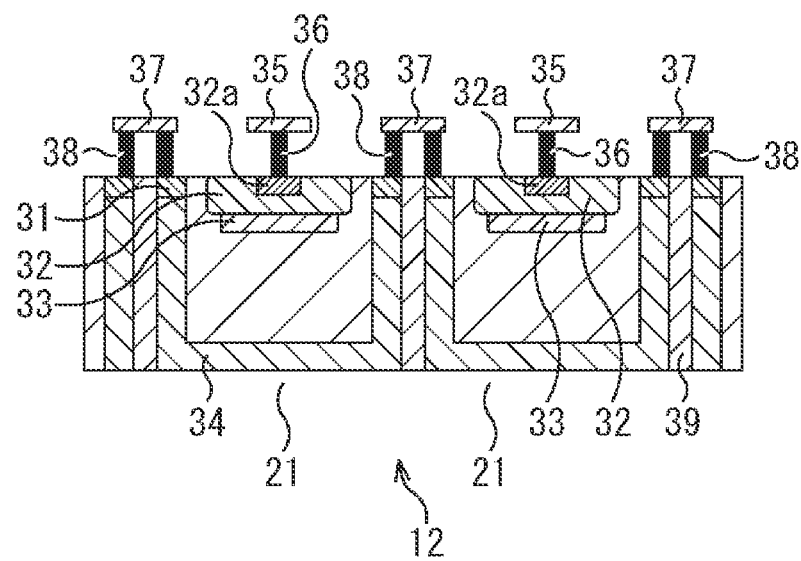
FIG. 13 is a cross-sectional view illustrating a configuration of a photodiode chip.
Figure 14:
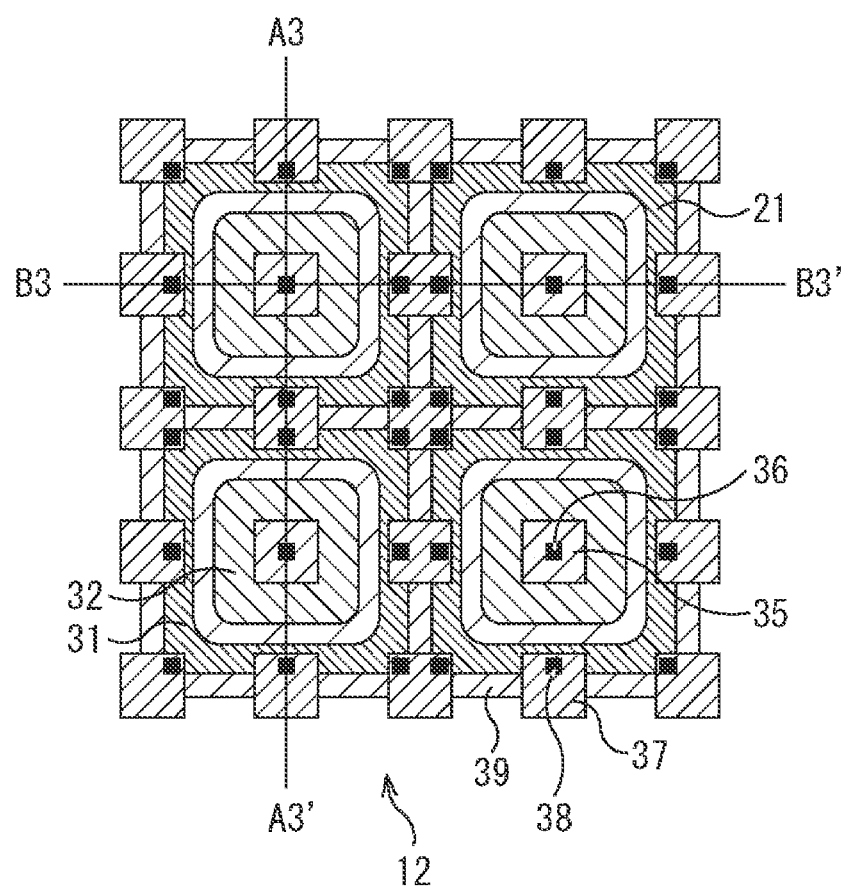
FIG. 14 is a plan view illustrating a configuration of a photodiode chip.
Figure 15:
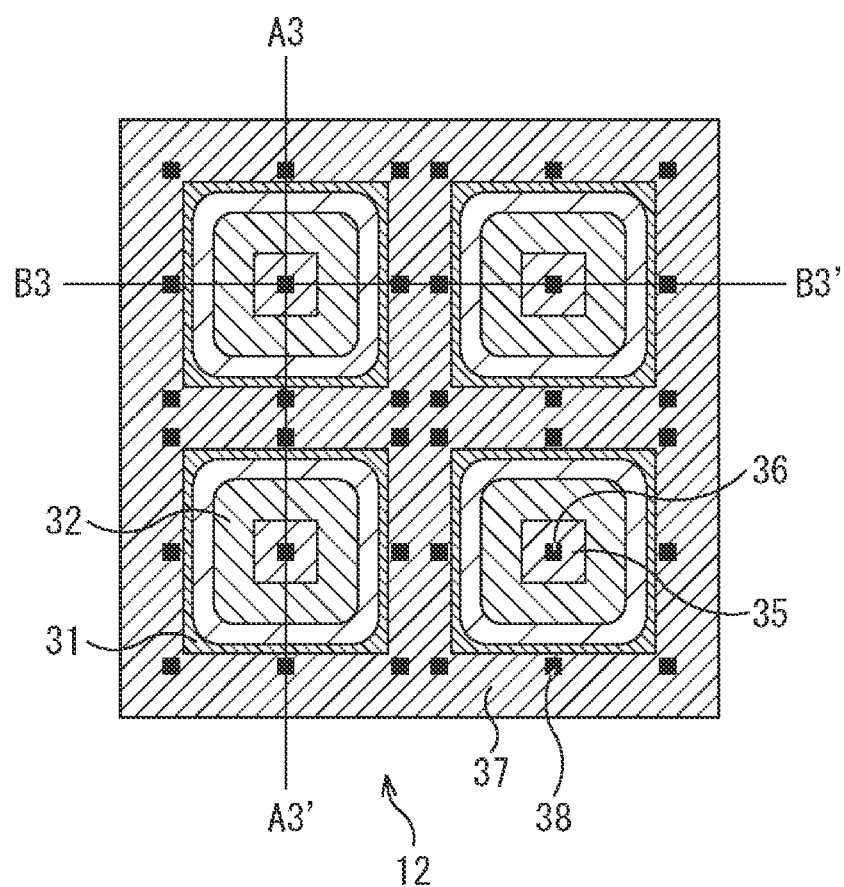
FIG. 15 is a plan view illustrating a configuration of a photodiode chip.
Figure 16:
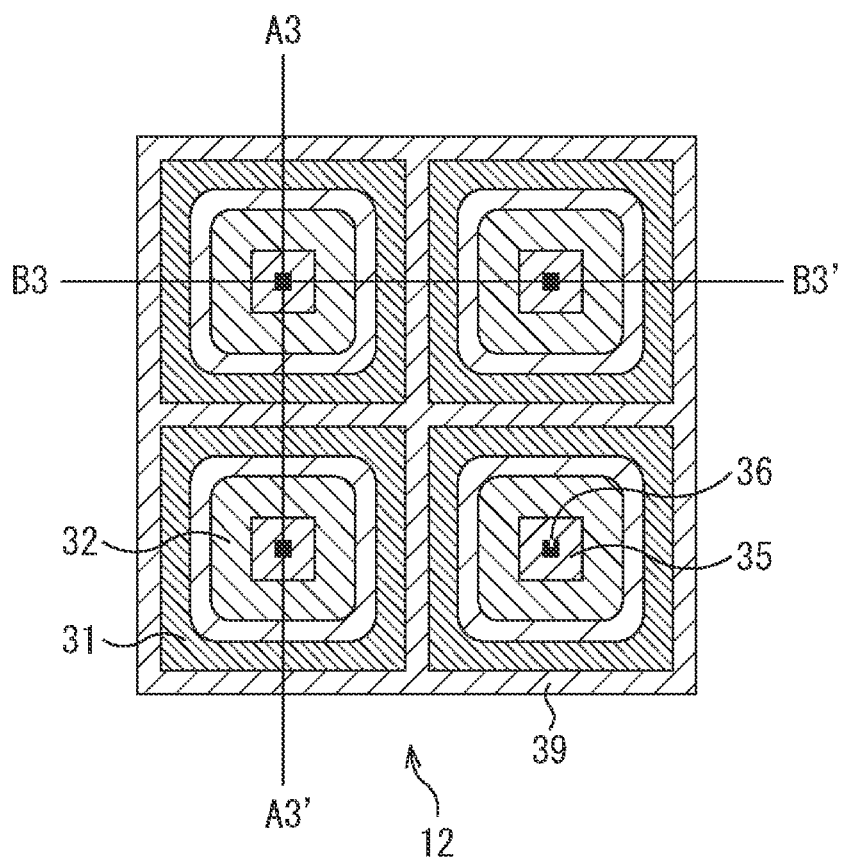
FIG. 16 is a plan view illustrating a configuration of a photodiode chip.

FIG. 13 is a cross-sectional view illustrating a configuration of a photodiode chip. FIGS. 14 to 16 are plan views illustrating a configuration of the photodiode chip. FIG. 13 illustrates a configuration of a cross section of the photodiode chip 12 taken along line A3-A3' or B3-B3' of FIGS. 14 to 16. FIG. 16 illustrates a configuration where the anode electrode 37 and the anode via 38 of FIG. 15 are removed. In addition, the illustration of the wiring layer 91 of the circuit chip 11 is omitted.

In the example of FIG. 14, the cathode via 36 arranged at the center of the pixel 21 is located at the center of the cathode electrode 35, so that the cathode electrode 35 is located at the center of the pixel 21. Similarly to the case of FIG. 12, the anode electrodes 37 are arranged at the lower left, the left center, and the lower center of the cathode electrode 35 in each pixel 21. Therefore, the anode electrodes 37 are arranged at the upper left, the left center, the lower left, the lower center, the lower right, the right center, the upper right, and the upper center thereof so as to surround the pixel 21.

In a case where the anode electrode 37 is located at the left center, the anode via 38 is arranged so as to be located at the right center of the anode electrode 37. In a case where the anode electrode 37 is located at the lower left, the anode via 38 is arranged so as to be located at the upper right of the anode electrode 37. In addition, in a case where the anode electrode 37 is located at the lower center, the anode via 38 is arranged so as to be located at the upper center of the anode electrode 37.

As a result, in the example of FIG. 14, each pixel 21 is vertically and laterally symmetrical with respect to the arrangement of the cathode electrode 35, the cathode via 36, the anode electrode 37, and the anode via 38. That is, similarly to the case in FIG. 12, not only is the arrangement of the pixels 21 the same layout as the adjacent pixels 21, but also the layout is vertically and laterally symmetrical within the pixels 21. As a result, electric characteristics (for example, a method of treating the parasitic capacitance caused by the cathode electrode 35, the cathode via 36, the anode electrode 37, the anode via 38, and the like in the adjacent pixel 21 and the like) of each pixel 21 can be allowed to be vertically and laterally symmetrical for each pixel. In addition, optical characteristics (for example, oblique incidence characteristics affected by the arrangement of the cathode electrode 35, the cathode via 36, the anode electrode 37, the anode via 38, and the like) can be allowed to be vertically and laterally symmetrical for each pixel 21.

In the example of FIG. 15, the anode electrode 37 is formed so as to continuously surround the pixel 21. The other configurations are similar to those in the example of FIG. 14.

Fourth Embodiment (SPAD Pixel Chip (FIGS. 17 to 19))

Next, a fourth embodiment will be described with reference to FIGS. 17 to 19.

Figure 17:
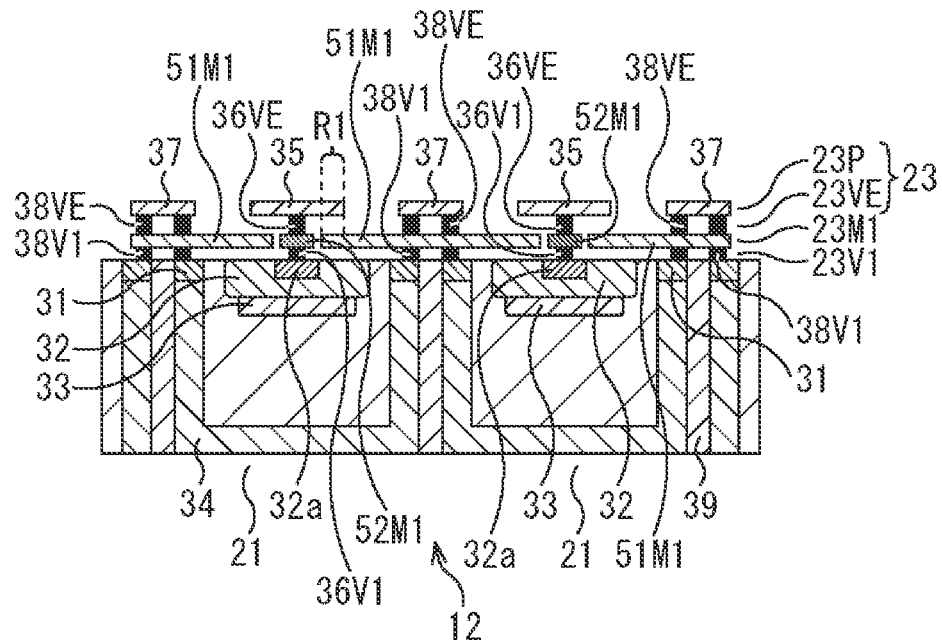
FIG. 17 is a cross-sectional view illustrating a configuration of a photodiode chip.

FIG. 17 is a cross-sectional view illustrating a configuration of a photodiode chip. FIGS. 18 and 19 are plan views illustrating a configuration of the photodiode chip. FIG. 17 illustrates a configuration of a cross section of the photodiode chip 12 taken along line A4-A4' or B4-B4' of FIGS. 18 and 19. In addition, the illustration of the wiring layer 91 of the circuit chip 11 is omitted.

In the fourth embodiment, the wiring layer 23 includes a V1 layer 23V1, an M1 layer 23M1, a VE layer 23VE, and an electrode layer 23P, which are illustrated in order from the bottom in FIG. 17.

Figure 18:
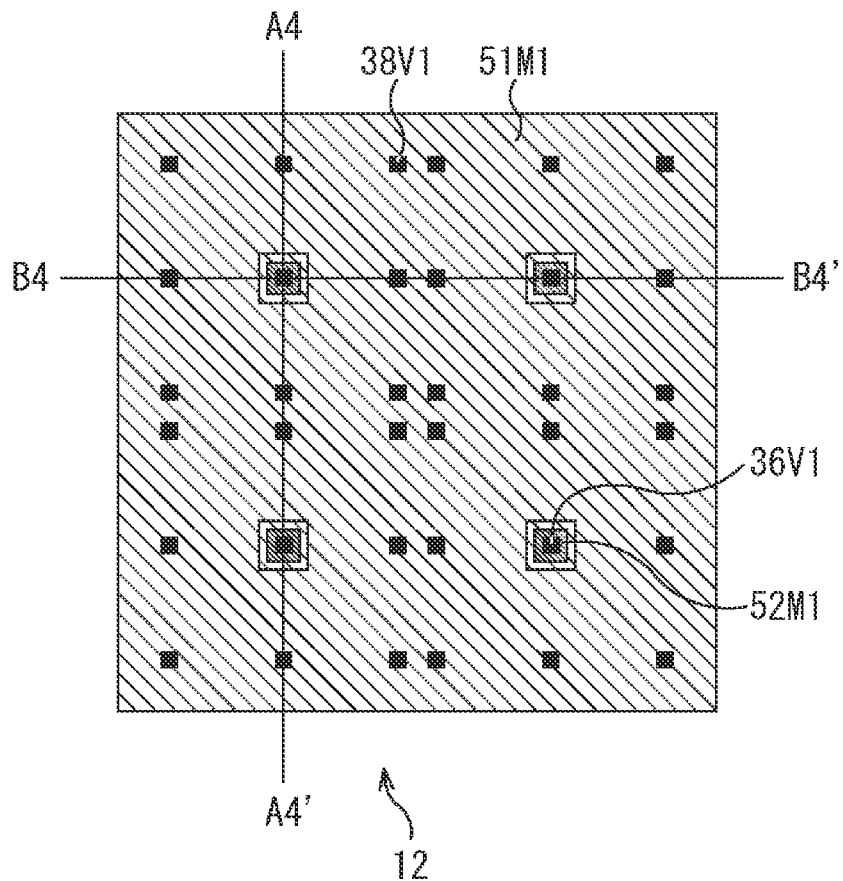
FIG. 18 is a plan view illustrating a configuration of a photodiode chip.
Figure 19:
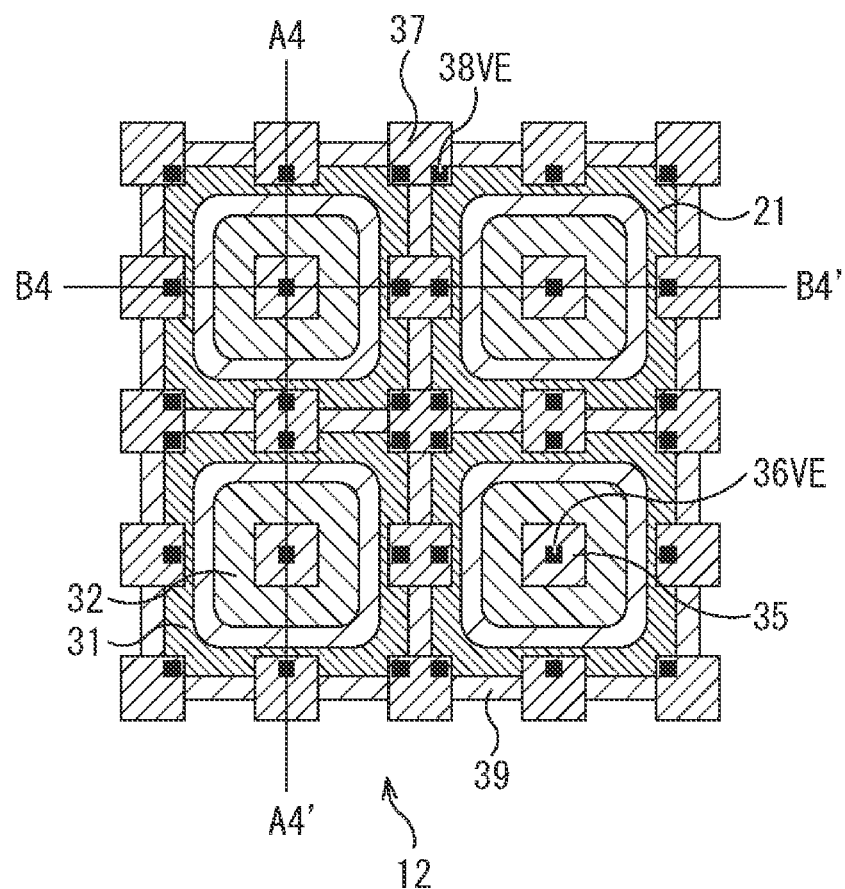
FIG. 19 is a plan view illustrating a configuration of a photodiode chip.

FIG. 18 illustrates a configuration of a plane of the V1 layer 23V1 and the M1 layer 23M1, and FIG. 19 illustrates a configuration of a plane of the VE layer 23VE and the electrode layer 23P.

As illustrated in FIG. 19, the cathode electrode 35 is arranged at the center of the pixel 21 similarly to the case of FIG. 14. The cathode 32 is connected to the cathode electrode 35 of the electrode layer 23P through a cathode via 36V1 of the V1 layer 23V1, a cathode wire line 52M1 of the M1 layer 23M1, and a cathode via 36VE of the VE layer 23VE. As described above, the cathode electrode 35 is connected to the quench circuit in the circuit chip 11.

The anode electrodes 37 are arranged in the vicinity of the pixel 21 in the Si layer 22 and at the left center, the lower left, and the lower center of the pixel 21. The anode 31 is connected to the anode power supply 40 in the circuit chip 11 through an anode via 38V1 of the V1 layer 23V1, an anode wire line 51M1 of the M1 layer 23M1, an anode via 38VE of the VE layer 23VE, and the anode electrode 37 of the electrode layer 23P.

In the fourth embodiment, there is a region R1 where the cathode electrode 35 and the anode wire line 51M1 overlap with each other in plan view. That is, the cathode electrode 35 is arranged so as to cover a gap between the anode wire line 51M1 and the anode wire line 51M1 adjacent thereto. That is, the cathode electrode 35 is arranged so as to overlap at least a portion of the anode wire line 51M1.

Thus, the pixel 21 is completely covered with the wiring layer 23. By adopting such a configuration, almost all of the light that passes through the Si layer 22 and is directed toward the wiring layer 23 is reflected by the wiring layer 23 to be returned to the Si layer 22. As a result, the photodiode chip 12 and the circuit chip 11 are optically separated from each other, and thus, it is possible to improve sensitivity. In addition, it is possible to prevent (or alternatively, mitigate) the light generated in the circuit chip 11 from being incident on the Si layer 22. In addition, as illustrated in FIG. 18, since the cathode wire line 52M1 is surrounded by the anode wire line 51M1, it is possible to further improve the shielding effect between the adjacent cathodes 32.

In addition, other than the cathode electrode 35 and the anode wire line 51M1 may be combined, or at least a portion of two or more of the cathode electrode 35, the shield electrode, and the shield wire line may be arranged to overlap with each other.

In addition, the sum of the area of the cathode electrode 35 and the area of the cathode wire line 52M1 is set to be equal to or smaller than the sum of the area of the anode electrode 37 as a shield electrode and the area of the anode wire line 51M1 as a shield wire line. Therefore, the capacitance of the cathode 32 can be decreased, and the capacitance of the fixed potential can be increased, which is advantageous for suppressing noise.

Fifth Embodiment (SPAD Pixel Chip (FIGS. 20 to 24))

Next, a fifth embodiment will be described with reference to FIGS. 20 to 24.

Figure 20:
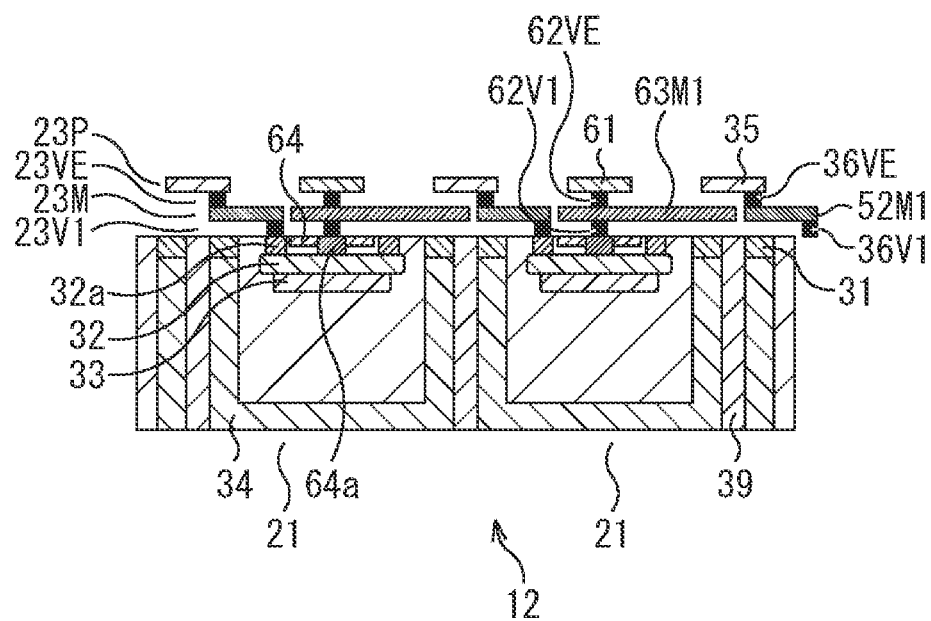
FIG. 20 is a cross-sectional view illustrating a configuration of a photodiode chip.
Figure 21:
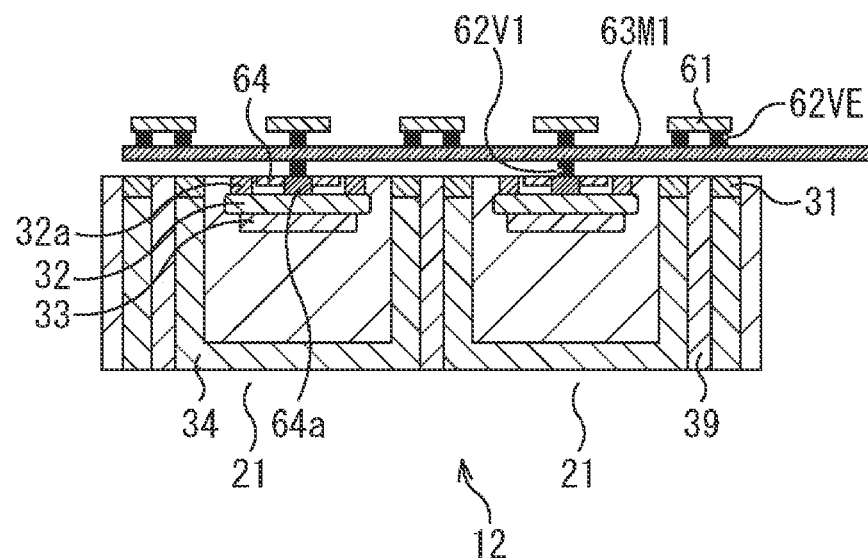
FIG. 21 is a cross-sectional view illustrating a configuration of a photodiode chip.
Figure 22:
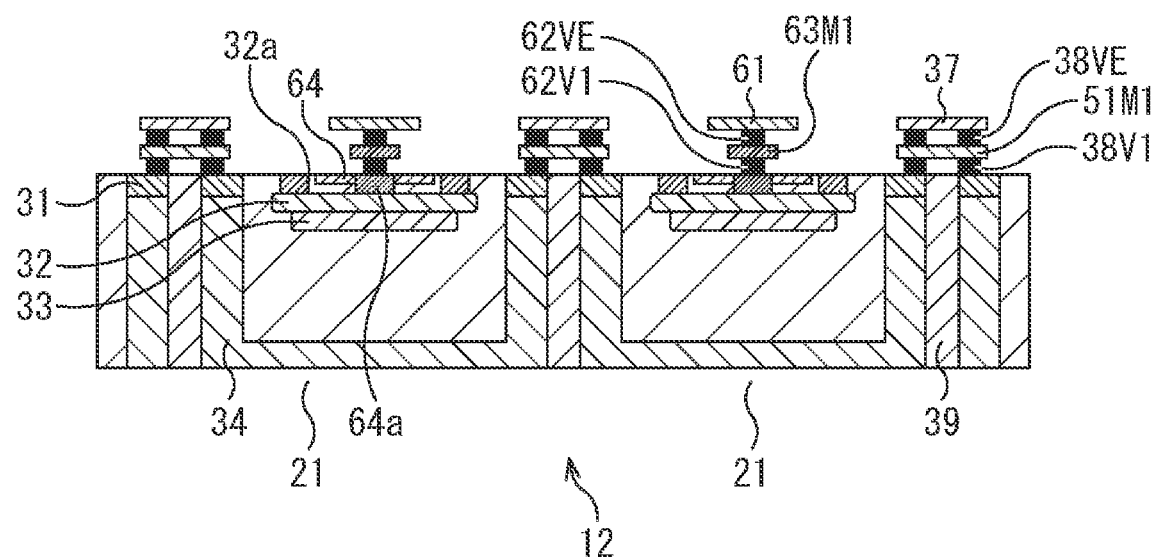
FIG. 22 is a cross-sectional view illustrating a configuration of a photodiode chip.
Figure 23:
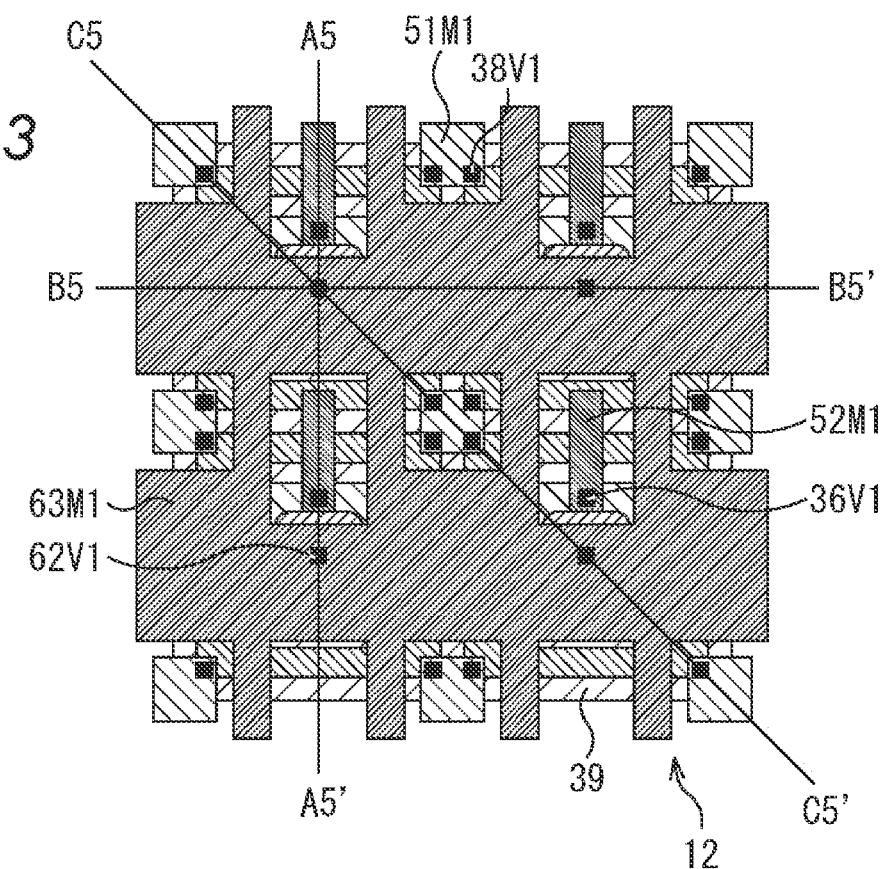
FIG. 23 is a plan view illustrating a configuration of a photodiode chip.
Figure 24:
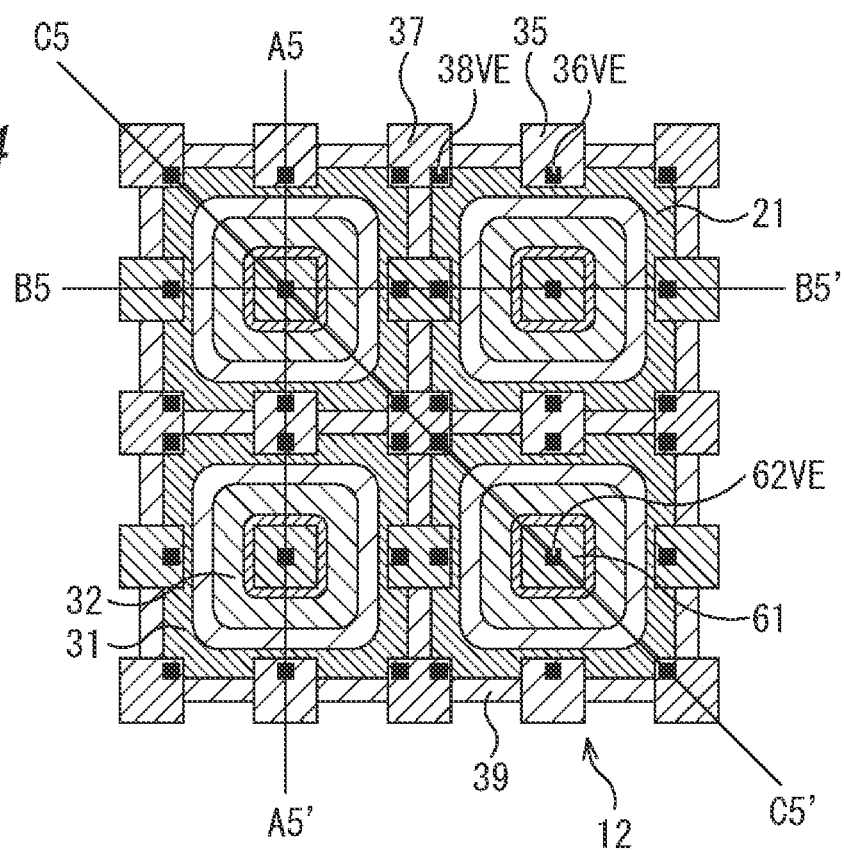
FIG. 24 is a plan view illustrating a configuration of a photodiode chip.

FIGS. 20, 21, and 22 are cross-sectional views illustrating a configuration of a photodiode chip. FIGS. 23 and 24 are plan views illustrating a configuration of the photodiode chip. FIG. 20 illustrates a configuration of a cross section of the photodiode chip 12 taken along line A5-A5' of FIGS. 23 and 24. FIG. 21 illustrates a configuration of a cross section of the photodiode chip 12 taken along line B5-B5' of FIGS. 23 and 24. FIG. 22 illustrates a configuration of a cross section of the photodiode chip 12 taken along line C5-C5' of FIGS. 23 and 24. FIG. 23 illustrates a configuration of a plane of the V1 layer 23V1 and the M1 layer 23M1, and FIG. 24 illustrates a configuration of a plane of the VE layer 23VE and the electrode layer 23P. In addition, the illustration of the wiring layer 91 of the circuit chip 11 is omitted.

In the fifth embodiment, similarly to the first to fourth embodiments, the cathode 32, the anode multiplication layer 33, the pixel separation portion 39, and the hole accumulation layer 34 are formed in the Si layer 22. Furthermore, in the fifth embodiment, the pinning layer 64 is formed at the center of the pixel 21.

The pinning layer 64 includes a P-type semiconductor having a high concentration with respect to the cathode 32. A portion 64a of the pinning layer 64 connected to the pinning via (or cathode via) 62V1 has a higher impurity concentration than the other portions. However, similarly to the case described in the first embodiment, it is also possible to interchange the entire P-type semiconductor with the N-type semiconductor.

Similarly to the fourth embodiment, the wiring layer 23 includes a cathode via 36V1, a cathode wire line 52M1, a cathode via 36VE, a cathode electrode 35, an anode via 38V1, an anode wire line 51M1, an anode via 38VE, and an anode electrode 37. In addition, in the fifth embodiment, the wiring layer 23 further includes a pinning via 62V1, a pinning wire line 63M1, a pinning via 62VE, and a pinning electrode 61.

The pinning layer 64 is connected to the ground, which is a fixed potential in the circuit chip 11, through the pinning via 62V1, the pinning wire line 63M1, the pinning via 62VE, and the pinning electrode 61 in unit of the pixel 21.

In the fifth embodiment, as illustrated in FIG. 23, in the M1 layer 23M1, the cathode wire line 52M1 is surrounded by the pinning wire line 63M1 as a shield wire line. In addition, as illustrated in FIG. 24, in the electrode layer 23P, the cathode electrodes 35 are arranged at the centers of the upper sides of the pixels 21, and the anode electrodes 37 are arranged at the upper left and the upper right of the pixels 21. The pinning electrodes 61 as the shield electrodes are arranged at the center, the left center, and the right center of the pixels 21. The cathode electrode 35 is sandwiched between the pinning electrodes 61 on the upper and lower sides thereof and sandwiched between the anode electrodes 37 on the left and right sides thereof.

The pinning wire line 63M1 and the pinning electrode 61 are connected to the ground of the circuit chip 11. As a result, in comparison with a case where the pinning wire line and the pinning electrode are connected to the anode power supply 40, the potential becomes a constant potential with little noise such as kTC noise, so that it is possible to transmit the signal output from the cathode 32 to the quench circuit of the circuit chip 11 with lower noise.

In addition, the sum of the area of the cathode electrode 35 and the area of the cathode wire line 52M1 is set to be equal to or smaller than the sum of the area of the anode electrode 37 and the pinning electrode 61 as the shield electrode and the area of the anode wire line 51M1 and the pinning wire line 63M1 as the shield wire line. Therefore, the capacitance of the cathode 32 can be decreased, and the capacitance of the fixed potential can be increased, which is advantageous for suppressing noise.

In the first to fourth embodiments, the shield wire line is connected to one fixed potential (anode power supply 40). However, in the fifth embodiment, the anode 31 is connected to the anode power supply 40 as a fixed potential through the anode wire line 51M1 and the anode electrode 37. In addition, the pinning layer 64 is connected to the ground as another fixed potential through the pinning electrode 61 and the pinning wire line 63M1. That is, the shield wire line is connected to a plurality of (two in this embodiment) fixed potentials.

Sixth Embodiment (SPAD Pixel Chip (FIGS. 25 to 28))

Next, a sixth embodiment will be described with reference to FIGS. 25 to 28.

Figure 25:
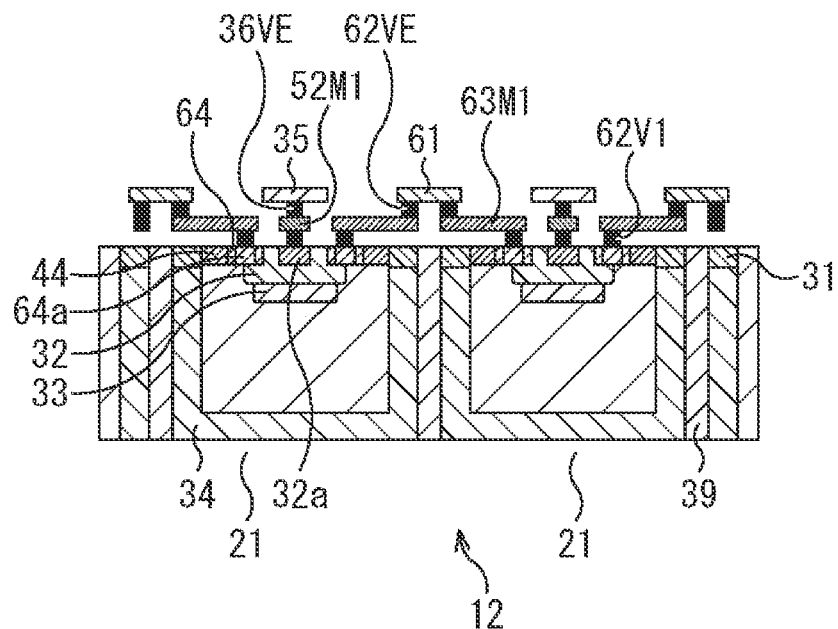
FIG. 25 is a cross-sectional view illustrating a configuration of a photodiode chip.
Figure 26:
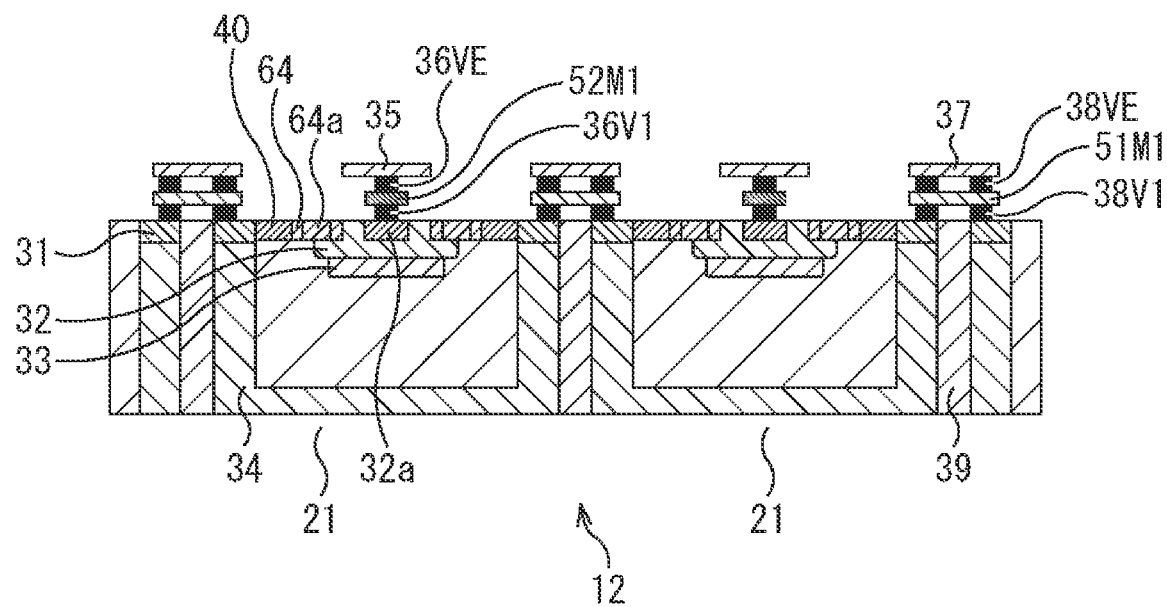
FIG. 26 is a cross-sectional view illustrating a configuration of a photodiode chip.
Figure 27:
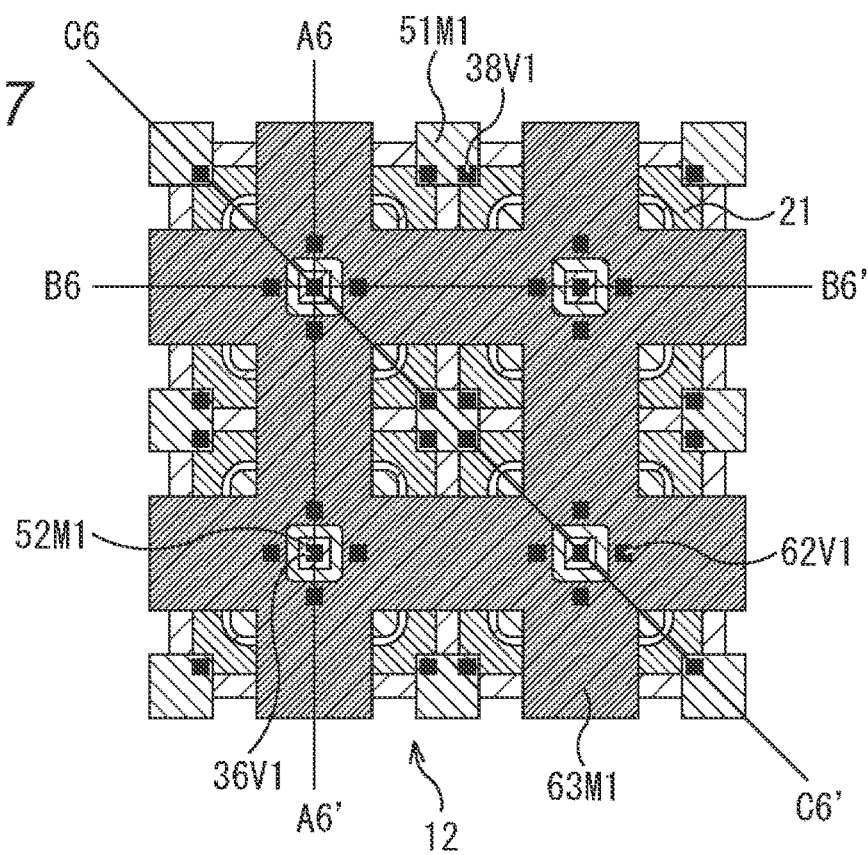
FIG. 27 is a plan view illustrating a configuration of a photodiode chip.
Figure 28:
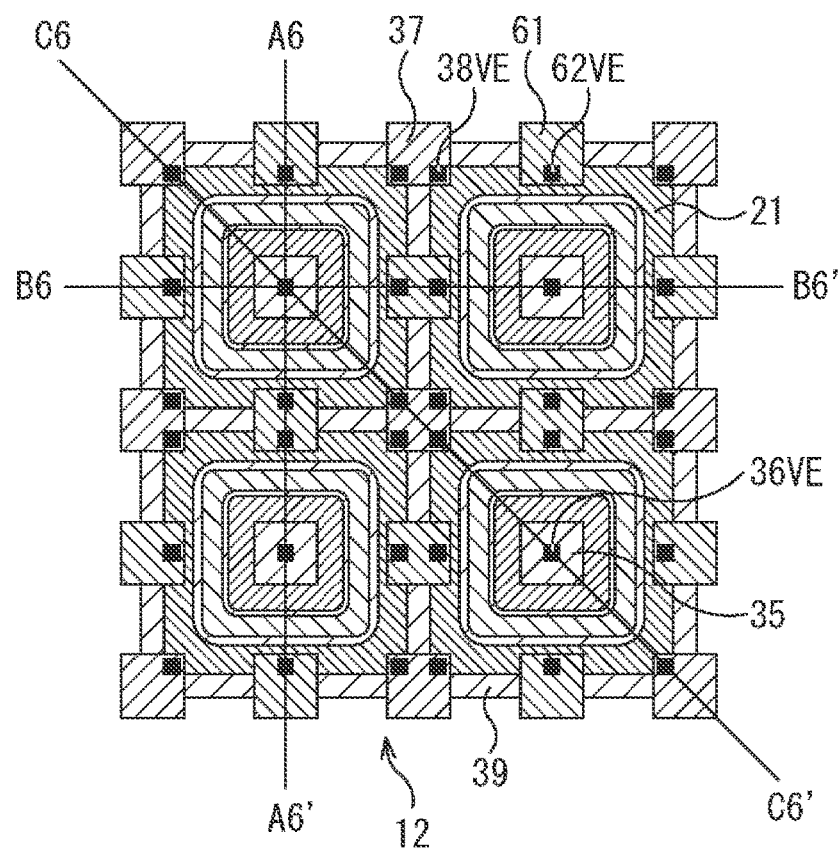
FIG. 28 is a plan view illustrating a configuration of a photodiode chip.

FIGS. 25 and 26 are cross-sectional views illustrating a configuration of a photodiode chip. FIGS. 27 and 28 are plan views illustrating a configuration of the photodiode chip. FIG. 25 is a view illustrating a configuration of a cross section taken along line A6-A6' or the line B6-B6' in FIGS. 27 and 28. FIG. 26 is a view illustrating a configuration of a cross section taken along line C6-C6' of FIGS. 27 and 28. FIG. 27 illustrates a configuration of a plane of the V1 layer 23V1 and the M1 layer 23M1, and FIG. 28 illustrates a configuration of a plane of the VE layer 23VE and the electrode layer 23P. In addition, the illustration of the wiring layer 91 of the circuit chip 11 is omitted.

The Si layer 22 includes a cathode 32, an anode multiplication layer 33, a pixel separation portion 39, a hole accumulation layer 34, and a pinning layer 64 surrounding the cathode 32. Furthermore, an N-type impurity region 44 is provided between the pinning layer 64 and the anode 31. This is provided so as to suppress the occurrence of the avalanche phenomenon in the portions other than the anode multiplication layer 33, but it is not indispensable.

In the sixth embodiment, as illustrated in FIG. 27, in plan view, the cathode wire line 52M1 is surrounded by the pinning wire lines 63M1 the upper, lower, left, and right sides thereof. In addition, as illustrated in FIG. 28, in plan view, the cathode electrode 35 are surrounded by the pinning electrodes 61 on the upper, lower, left, and right sides thereof. Since the pinning wire line 63M1 and the pinning electrode 61 are connected to the ground as described above, the signal from the cathode 32 is outputted in a state surrounded by the ground.

On the other hand, as described above, the fifth embodiment is configured so that, as illustrated in FIG. 23, the cathode wire line 52M1 is surrounded by the pinning wire line 63M1. However, as illustrated in FIG. 24, the upper and lower sides of the cathode electrode 35 are sandwiched between the pinning electrodes 61, but the left and right sides thereof are sandwiched between the anode electrodes 37.

As described above, since not only the upper and lower sides but also the left and right sides the cathode electrode 35 are sandwiched between the pinning electrodes 61, the sixth embodiment is configured so that it is difficult to easily superimpose noise in comparison with the fifth embodiment.

In addition, in this embodiment, the shield electrode and the shield wire line are connected to a plurality of fixed potentials.

Seventh Embodiment (SPAD Pixel Chip (FIGS. 29 to 32))

Next, a seventh embodiment will be described with reference to FIGS. 29 to 32.

Figure 29:
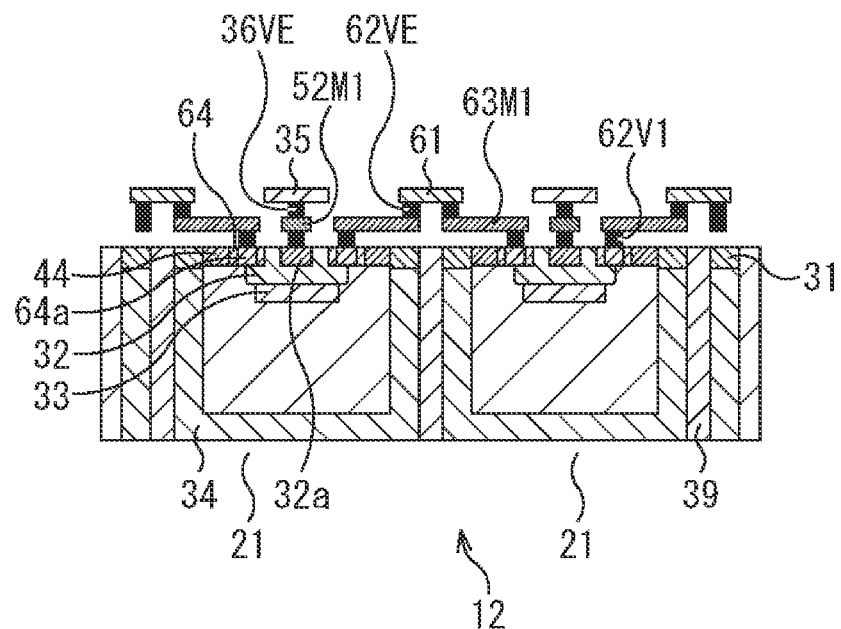
FIG. 29 is a cross-sectional view illustrating a configuration of a photodiode chip.
Figure 30:
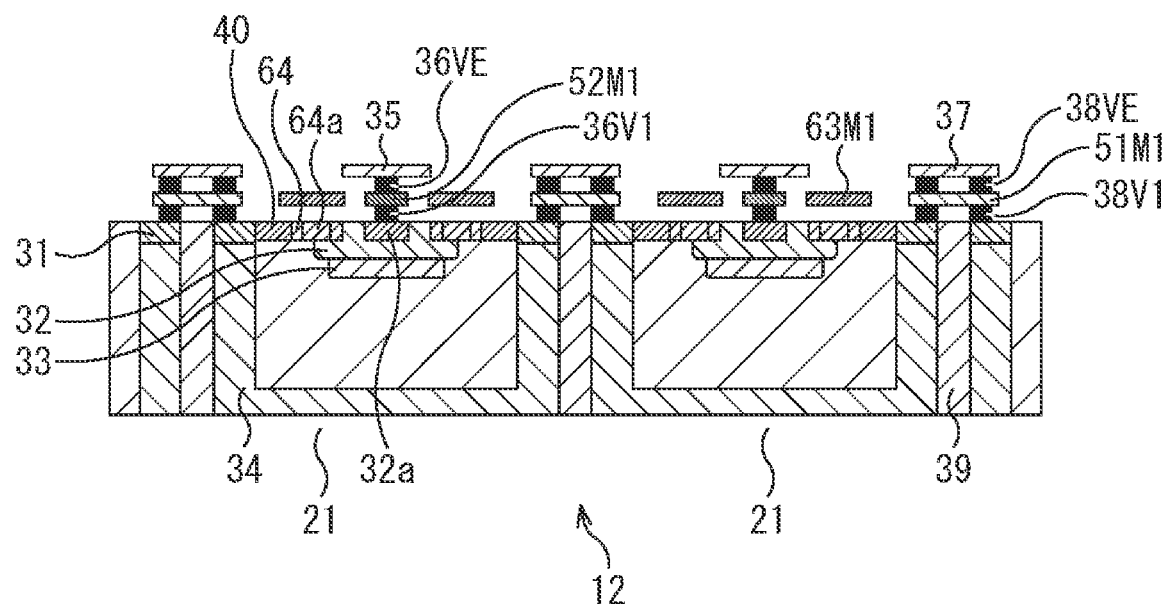
FIG. 30 is a cross-sectional view illustrating a configuration of a photodiode chip.
Figure 31:
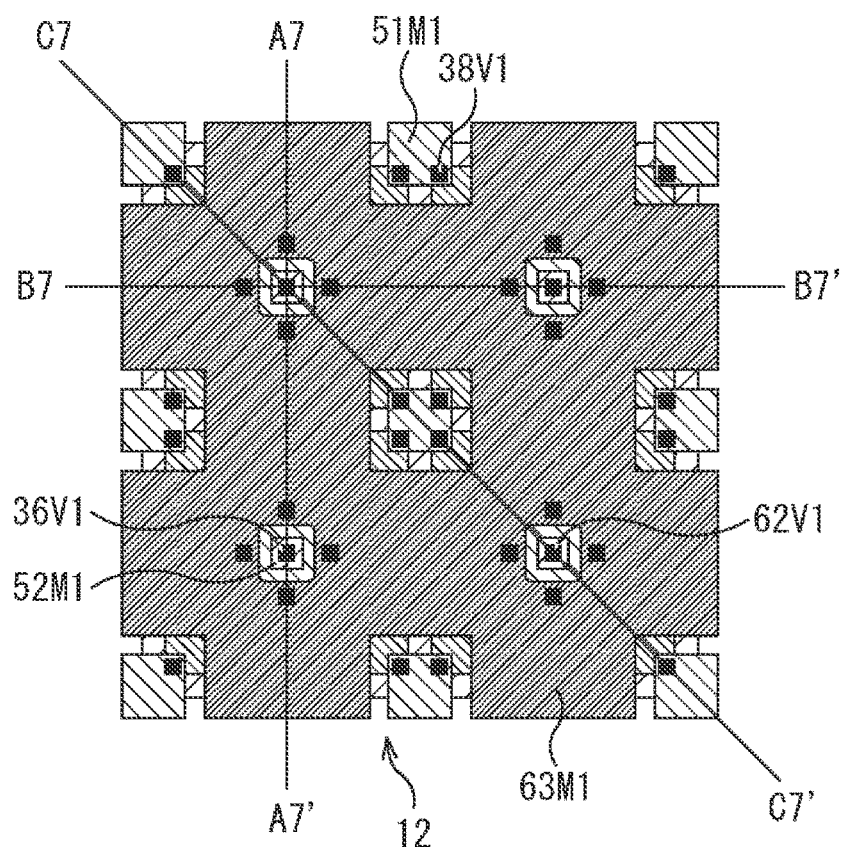
FIG. 31 is a plan view illustrating a configuration of a photodiode chip.
Figure 32:
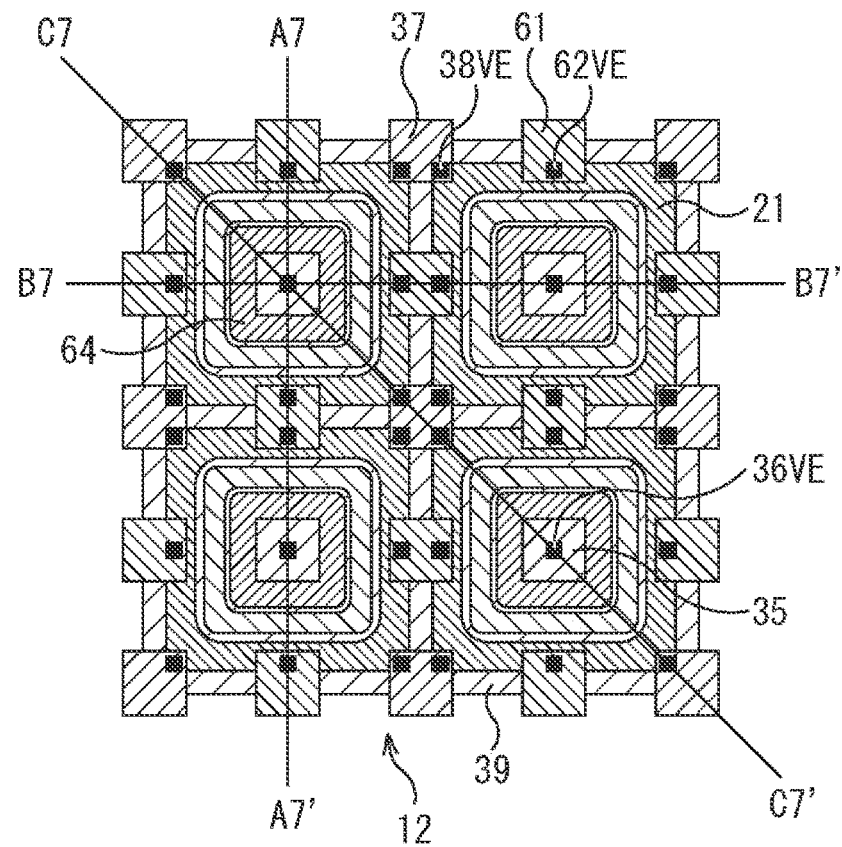
FIG. 32 is a plan view illustrating a configuration of a photodiode chip.

FIGS. 29 and 30 are cross-sectional views illustrating a configuration of a photodiode chip. FIGS. 31 and 32 are plan views illustrating a configuration of the photodiode chip. FIG. 29 is a view illustrating a configuration of a cross section taken along line A7-A7' or line B7-B7' of FIGS. 31 and 32. FIG. 30 is a view illustrating a configuration of a cross section taken along line C7-C7' of FIGS. 31 and 32. FIG. 31 illustrates a configuration of a plane of the V1 layer 23V1 and the M1 layer 23M1, and FIG. 32 illustrates a configuration of a plane of the VE layer 23VE and the electrode layer 23P. In addition, the illustration of the wiring layer 91 of the circuit chip 11 is omitted.

As illustrated in FIG. 31, the pinning wire line 63M1 is connected to the pinning wire line 63M1 of the adjacent pixel 21 on the M1 layer 23M1 and is arranged so as to cover the entire M1 layer 23M1. With such a configuration, the cathode wire line 52M1 and the cathode electrode 35 can be surrounded by the pinning wire line 63M1, so that it is possible to suppress noise caused by fluctuation in the cathode signal of the adjacent pixel 21 and the anode power supply 40.

In addition, the pinning wire line 63M1 is arranged so as to cover almost all the M1 layer 23M1, so that almost all the light incident from the lower side in FIGS. 29 and 30, transmitted through the Si layer 22, and directed toward the wiring layer 23 can be reflected to the wiring layer 23 and returned to the Si layer 22. It is possible to prevent (or alternatively, mitigate) the light generated in the circuit chip 11 from being incident on the Si layer 22. As a result, it is possible to improve sensitivity.

In addition, in this embodiment, the shield electrode and the shield wire line are connected to a plurality of fixed potentials.

Eighth Embodiment (SPAD Pixel Chip (FIGS. 33 to 36))

Next, an eighth embodiment will be described with reference to FIGS. 33 to 36.

Figure 33:
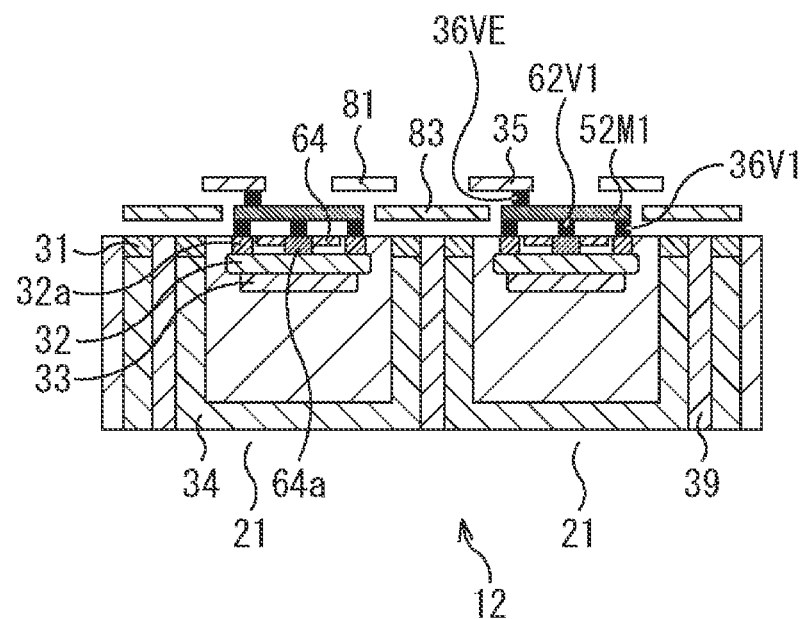
FIG. 33 is a cross-sectional view illustrating a configuration of a photodiode chip.
Figure 34:
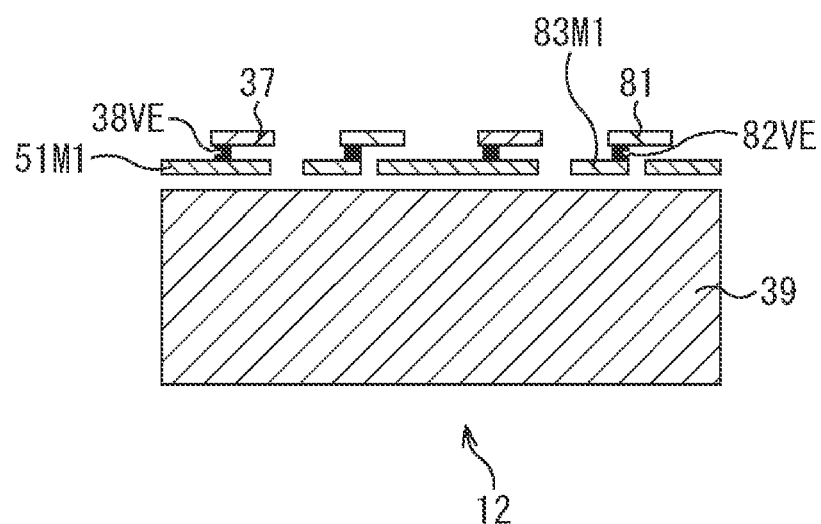
FIG. 34 is a cross-sectional view illustrating a configuration of a photodiode chip.
Figure 35:
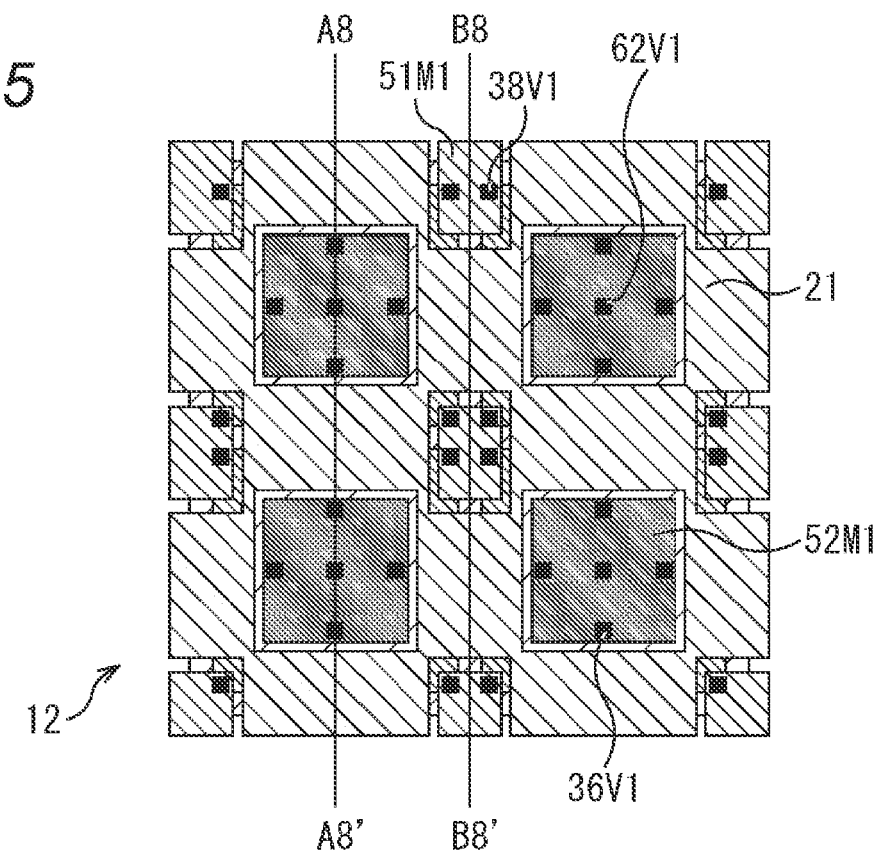
FIG. 35 is a plan view illustrating a configuration of a photodiode chip.
Figure 36:
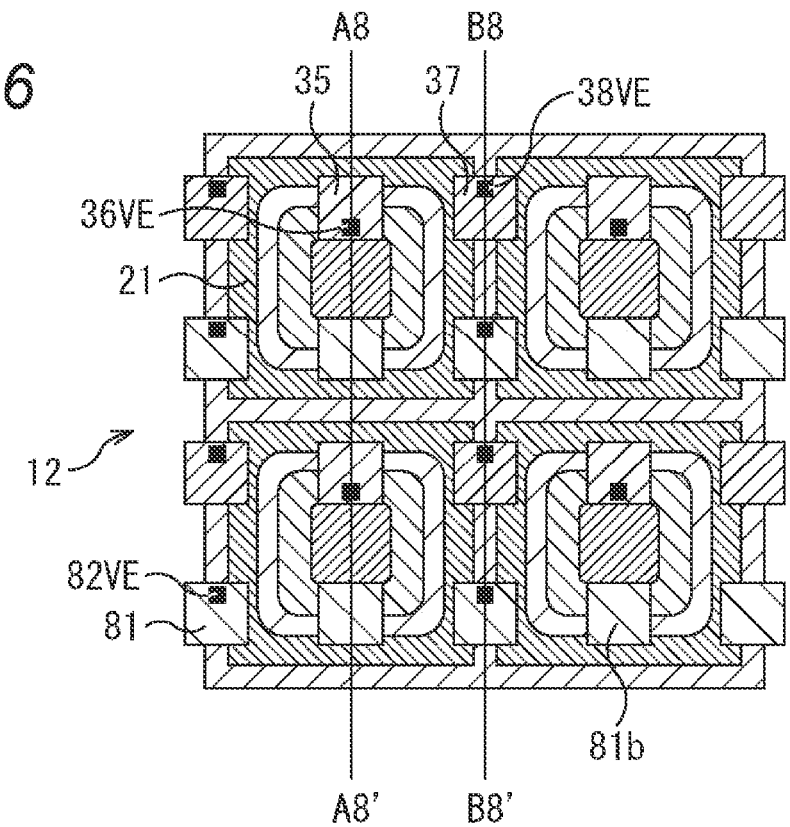
FIG. 36 is a plan view illustrating a configuration of a photodiode chip.

FIGS. 33 and 34 are cross-sectional views illustrating a configuration of the photodiode chip. FIGS. 35 and 36 are plan views illustrating a configuration of the photodiode chip. FIG. 33 is a view illustrating a configuration of a cross section taken along line A8-A8' in FIGS. 35 and 36. FIG. 34 is a view illustrating a configuration of a cross section taken along line B8-B8' in FIGS. 35 and 36. FIG. 35 illustrates a configuration of a plane of the V1 layer 23V1 and the M1 layer 23M1, and FIG. 36 illustrates a configuration of a plane of the VE layer 23VE and the electrode layer 23P. In addition, the illustration of the wiring layer 91 of the circuit chip 11 is omitted.

In this embodiment, the cathode wire line 52M1 is configured to be connected to the cathode via 36V1 and to be connected to the pinning via 62V1, so that the cathode 32 and the pinning layer 64 are electrically connected. The pinning via 62V1 arranged at the center of the pixel 21 and the square cathode wire line 52M1 are connected so that the pinning via is located at the center thereof. As a result, as illustrated in FIG. 35, the cathode wire line 52M1 is configured to be vertically and laterally symmetrical with respect to the center of the pixel 21.

In the eighth embodiment, the anode electrode 37 as a shield electrode (the anode wire line 51M1 as a shield wire line) is provided between the cathode electrode 35 (the cathode wire line 52M1) and the adjacent cathode electrode 35 (the cathode wire line 52M1) in the lateral direction of FIG. 36. In addition, between the cathode electrode 35 and the anode electrode 37, the blocking electrode 81 as a shield electrode (the blocking wire line 83M1 as a shield wire line) is provided in the vertical direction.

Similarly to the cathode electrode 35, the anode electrode 37, and the pinning electrode 61, the blocking electrode 81 has a quadrangular shape, particularly, a square shape. The blocking electrode 81 is connected to the blocking wire line 83M1 through the blocking via 82VE. In addition, since the blocking wire line 83M1, the blocking electrode 81, and the blocking via 82VE are provided for shielding the cathode 32 and there is no connection to the Si layer 22, no via connected to the blocking wire line 83M1 to the V1 layer 23V1 exists (the blocking via 82V1 does not exist).

In a case where the cathode 32 and the pinning layer 64 are connected and the potential is allowed to be common, the connection of the pinning layer 64 to the ground is turned off. By doing so, the capacitance between the cathode 32 and the pinning layer 64 becomes zero, so that it is possible to improve the time resolution of the cathode output.

In addition, a fixed potential for shielding is supplied from the circuit chip 11 to the blocking wire line 83M1 through the blocking electrode 81. This fixed potential may be the potential of the anode power supply 40 or the same potential of the pinning layer 64 as in the fifth to seventh embodiments. However, the fixed potential may be other potentials. For example, in a case where there are a ground for digital use and a ground for analog use that is different from the ground for digital use, the cathode 32 may be shielded for the ground which is not in use between the grounds. In addition, as illustrated in FIG. 36, a blocking electrode 81b not connected to the blocking via 82VE may be formed.

In the eighth embodiment, two fixed potentials of the anode power supply 40 and the power supply of the blocking wire line 83M1 are used.

In addition, the sum of the area of the cathode electrode 35 and the area of the cathode wire line 52M1 is set to be equal to or smaller than the sum of the area of the anode electrode 37 and the blocking electrode 81 as the shield electrode and the area of the anode wire line 51M1 and the blocking wire line 83M1 as the shield wire line. Therefore, the capacitance of the cathode 32 can be decreased, and the capacitance of the fixed potential can be increased, which is advantageous for suppressing noise.

Ninth Embodiment (SPAD Pixel Chip (FIGS. 37 to 40))

Next, a ninth embodiment will be described with reference to FIGS. 37 to 40.

Figure 37:
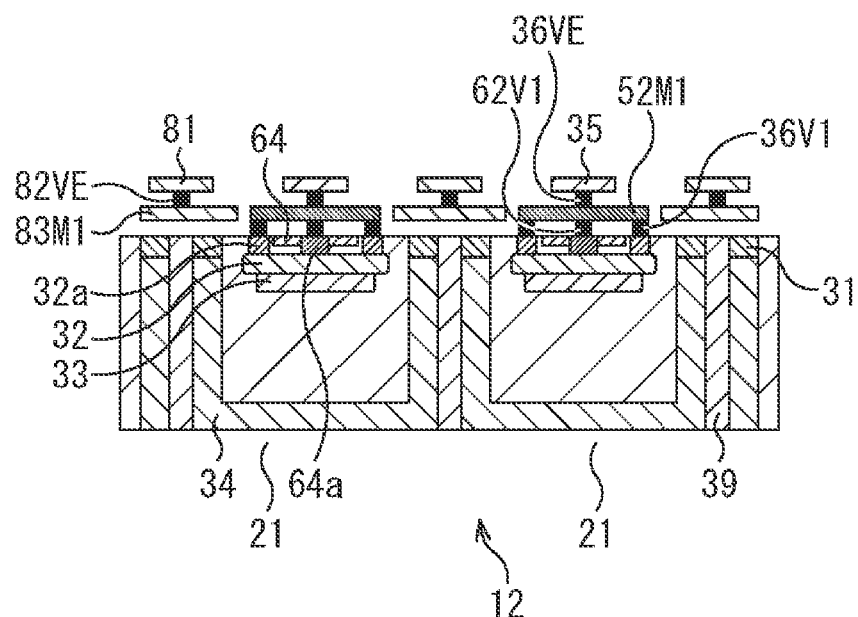
FIG. 37 is a cross-sectional view illustrating a configuration of a photodiode chip.
Figure 38:
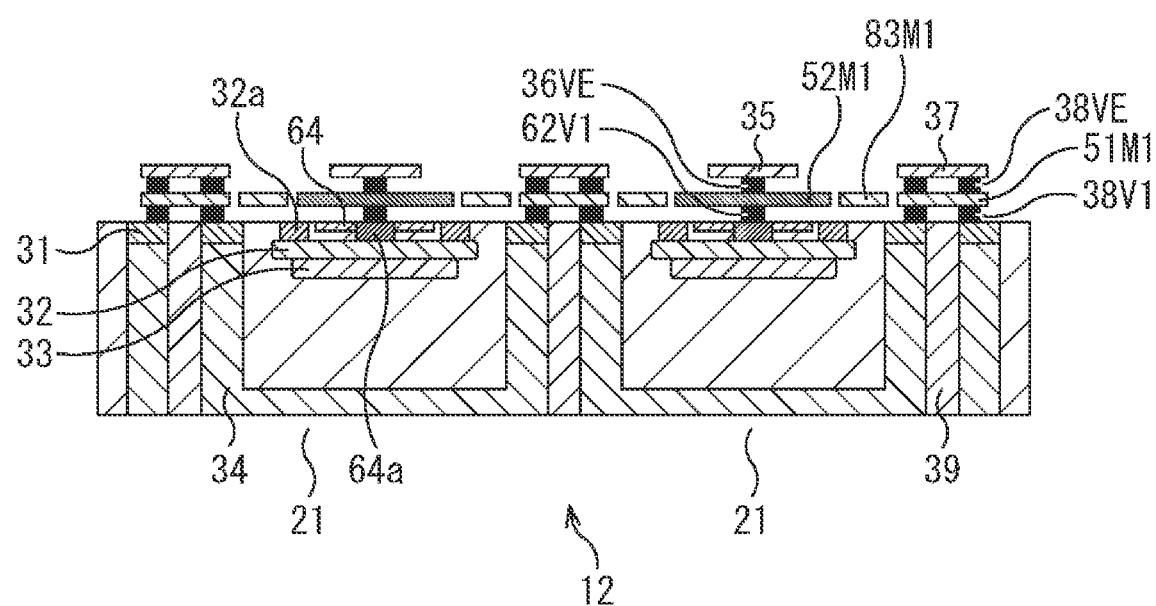
FIG. 38 is a cross-sectional view illustrating a configuration of a photodiode chip.
Figure 39:
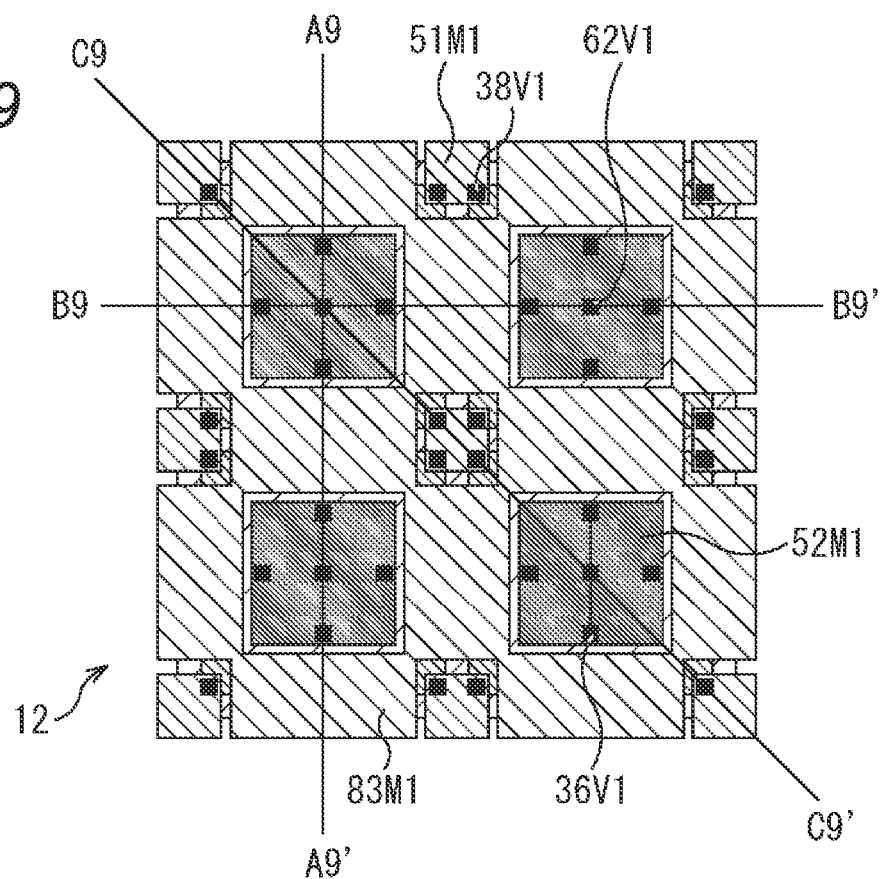
FIG. 39 is a plan view illustrating a configuration of a photodiode chip.
Figure 40:
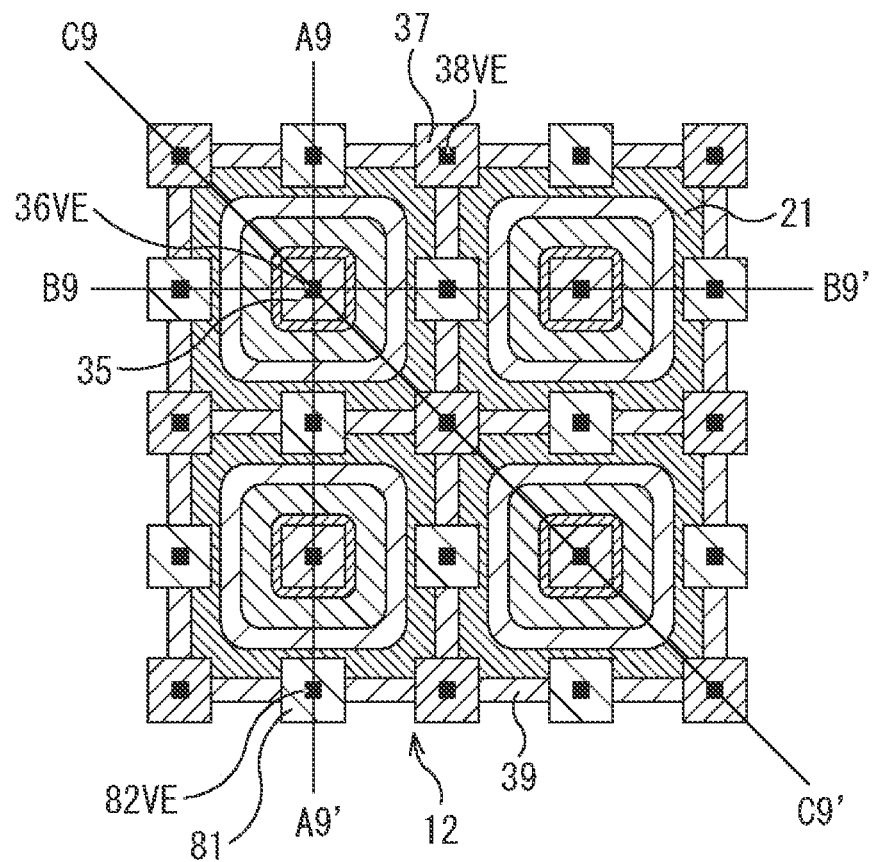
FIG. 40 is a plan view illustrating a configuration of a photodiode chip.

FIGS. 37 and 38 are cross-sectional views illustrating a configuration of a photodiode chip. FIGS. 39 and 40 are plan views illustrating a configuration of the photodiode chip. FIG. 37 is a view illustrating a configuration of a cross section taken along line A9-A9' or B9-B9' of FIGS. 39 and 40. FIG. 38 is a view illustrating a configuration of a cross section taken along line C9-C9' in FIGS. 39 and 40. FIG. 39 illustrates a configuration of a plane of the V1 layer 23V1 and the M1 layer 23M1, and FIG. 40 illustrates a configuration of a plane of the VE layer 23VE and the electrode layer 23P. In addition, the illustration of the wiring layer 91 of the circuit chip 11 is omitted.

In the ninth embodiment, the respective vias (the cathode vias 36V1, cathode vias 36VE, the anode vias 38V1, the anode vias 38VE, and the blocking vias 82VE) are arranged so as to be vertically and laterally symmetrical. In addition, the respective wire lines (the cathode wire lines 52M1, the anode wire lines 51M1, and the blocking wire lines 83M1) are arranged so as to be vertically and laterally symmetrical. In addition, the respective electrodes (the cathode electrodes 35, the anode electrodes 37, and the blocking electrodes 81) are also arranged so as to be vertically and laterally symmetrical.

In the ninth embodiment, the via closest to each cathode via (cathode via 36V1 and cathode via 36VE) is the blocking via 82VE. The wire line closest to the cathode wire line 52M1 is the blocking wire line 83M1. The electrodes (vertically and laterally adjacent electrodes) closest to the cathode electrode 35 are the blocking electrodes 81. With such a configuration, it is possible to suppress the noise which is caused by the fluctuation in power generated during the photodiode in the circuit chip 11 and is superimposed on the cathode signal.

In addition, in this embodiment, the shield wire line is connected to a plurality of fixed potentials. In addition, the potentials of the cathode 32 and the pinning layer 64 are allowed to be common. In addition, the cathode wire line 52M1 is arranged at the center of the pixel 21.

Tenth Embodiment (SPAD Pixel Chip (FIGS. 41 to 44))

Next, a tenth embodiment will be described with reference to FIGS. 41 to 44.

Figure 41:
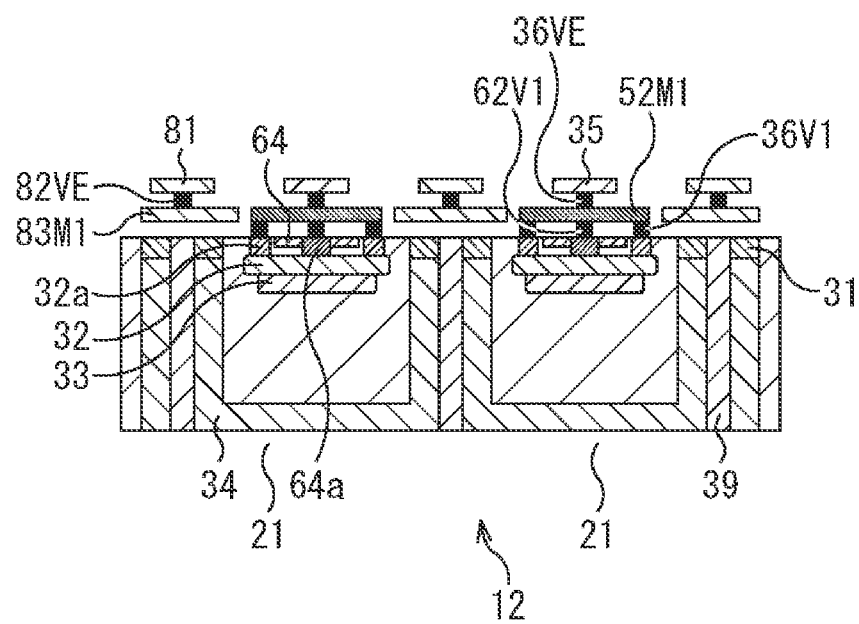
FIG. 41 is a cross-sectional view illustrating a configuration of a photodiode chip.
Figure 42:
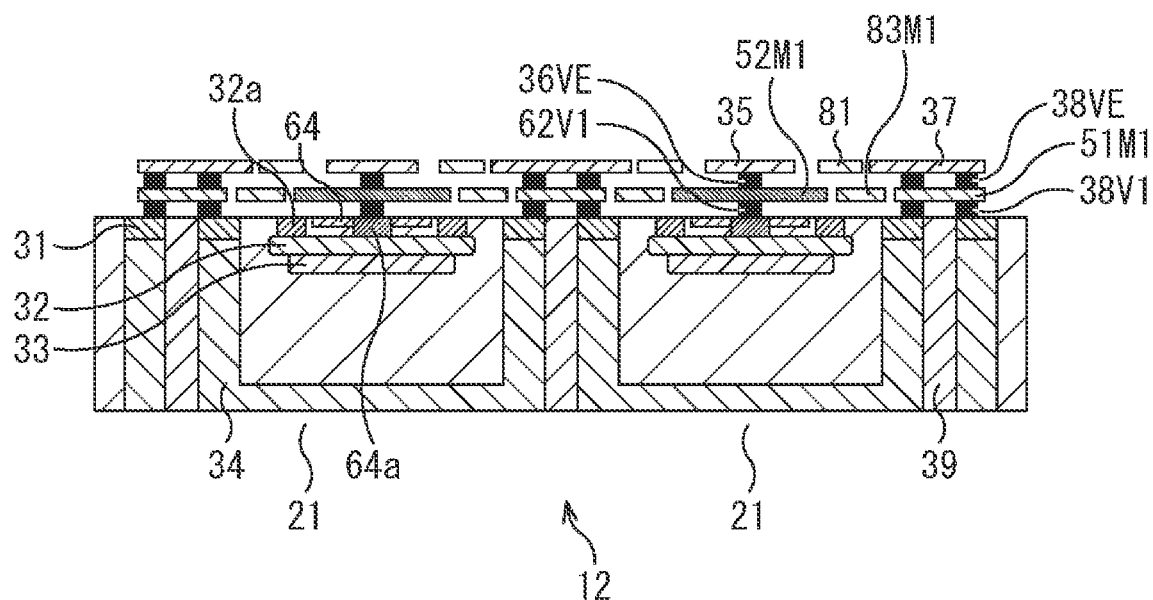
FIG. 42 is a cross-sectional view illustrating a configuration of a photodiode chip.
Figure 43:
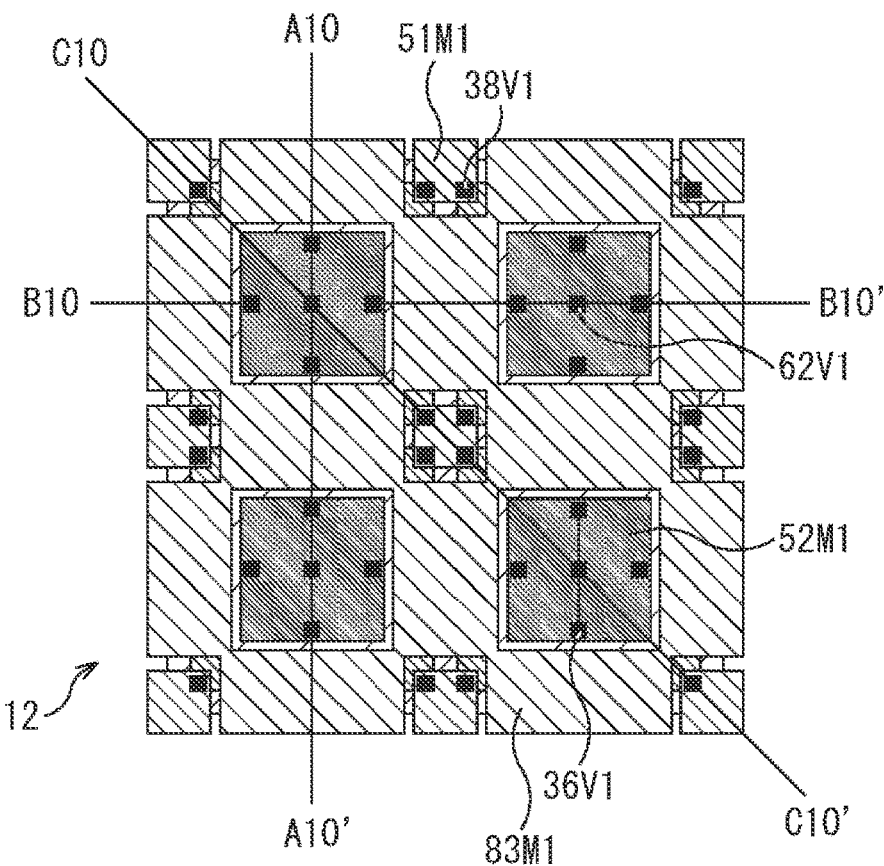
FIG. 43 is a plan view illustrating a configuration of a photodiode chip.
Figure 44:
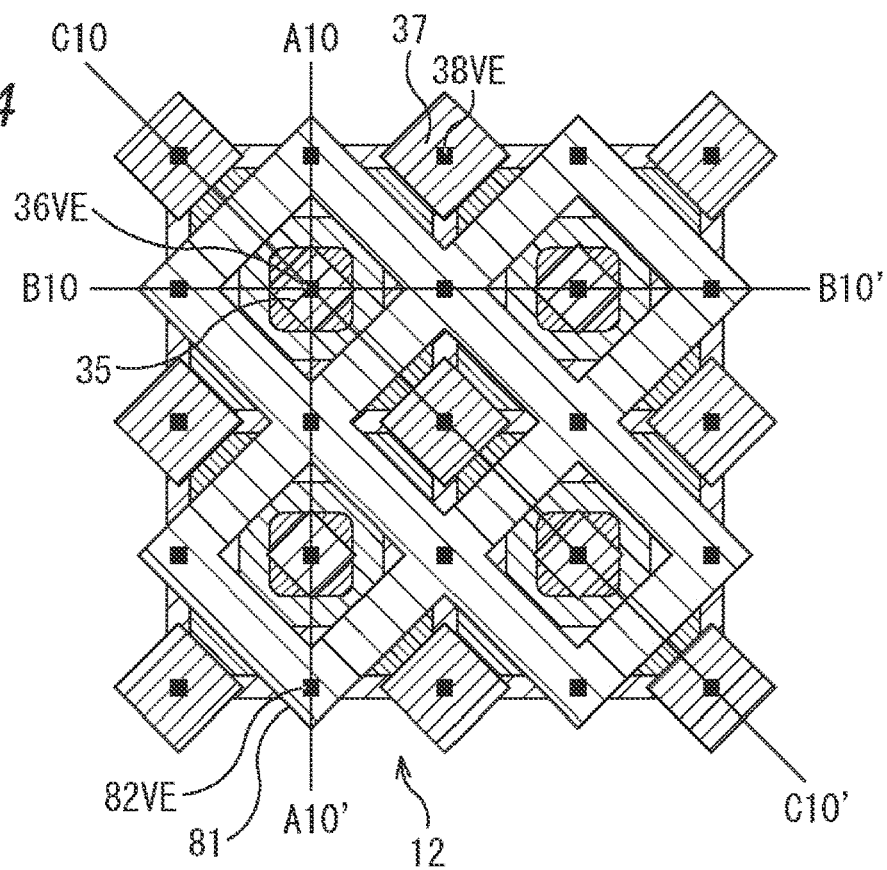
FIG. 44 is a plan view illustrating a configuration of a photodiode chip.

FIGS. 41 and 42 are cross-sectional views illustrating a configuration of a photodiode chip. FIGS. 43 and 44 are plan views illustrating a configuration of the photodiode chip. FIG. 41 is a view illustrating a configuration of a cross section taken along line A10-A10' or B10-B10' of FIGS. 43 and 44. FIG. 42 is a view illustrating a configuration of a cross section taken along line C10-C10' of FIGS. 43 and 44. FIG. 43 illustrates a configuration of a plane of the V1 layer 23V1 and the M1 layer 23M1, and FIG. 44 illustrates a configuration of a plane of the VE layer 23VE and the electrode layer 23P. In addition, the illustration of the wiring layer 91 of the circuit chip 11 is omitted.

In the eighth embodiment (FIG. 36) and the ninth embodiment (FIG. 40), the blocking electrode 81 is configured to have a single quadrangular shape. However, in the tenth embodiment, as illustrated in FIG. 44, the blocking electrode 81 is configured not to have a single quadrangular shape but to continuously extend over a plurality of the pixels 21. More specifically, the blocking electrode 81 is configured so as to surround the quadrangular cathode electrode 35 arranged at the center of the pixel 21 with an annular quadrangle. In addition, the blocking electrode 81 is configured so as to surround the quadrangular anode electrode 37 arranged at the upper left of each pixel 21 with an annular quadrangle. In addition, the corners of the annular quadrangle are configured so as to be continuous with the corners of the annular quadrangle of the adjacent pixels 21.

With such a configuration, the cathode electrode 35 and anode electrode 37 can be individually surrounded, and as performed in the other embodiments, not only the shielding between the adjacent cathode electrodes 35 and but also shielding between the cathode 32 and anode 31 can be performed.

In addition, the sizes of the cathode electrode 35 and the anode electrode 37 are also different. The area of the cathode electrode 35 is smaller than the area of the anode electrode 37. In order to improve the time resolution at the time of transmitting the cathode signal, it is demanded that parasitic capacitance is not added to the cathode electrode 35 as much as possible. In the blocking electrode 81, although necessary to prevent (or alternatively, reduce) noise from being superimposed, it is preferable to reduce the parasitic capacitance of the cathode electrode 35. Therefore, by forming the cathode electrode 35 to be small, the parasitic capacitance is reduced.

In contrast, it is preferable that a large amount of parasitic capacitance is added to the anode electrode 37 in order to supply a stable potential without fluctuation in potential. Therefore, by increasing the area of the anode electrode 37 or by reducing the distance between the anode electrode 37 and the blocking electrode 81, the parasitic capacitance functions as a bypass capacitor, so that it is possible to stabilize the anode potential.

In addition, in this embodiment, the shield wire line is connected to a plurality of fixed potentials. In addition, the potentials of the cathode 32 and the pinning layer 64 are allowed to be common. In addition, the cathode wire line 52M1 is arranged at the center of the pixel 21.

Eleventh Embodiment (SPAD Pixel Chip (FIGS. 45 to 48))

Next, an eleventh embodiment will be described with reference to FIGS. 45 to 48.

Figure 45:
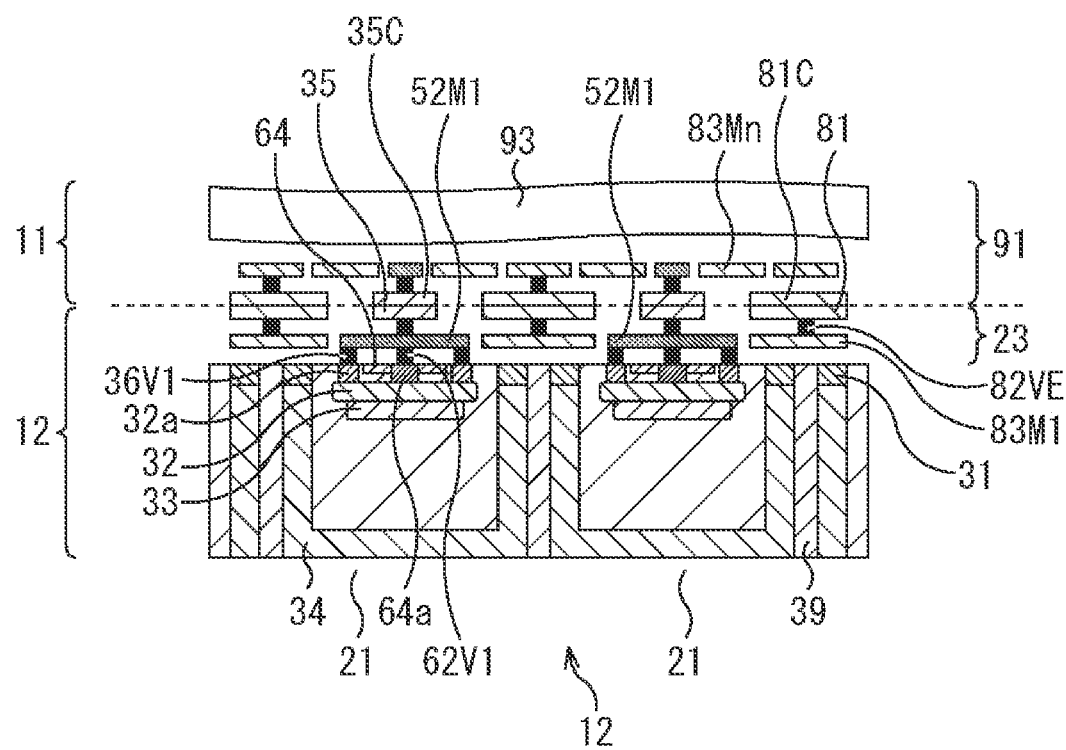
FIG. 45 is a cross-sectional view illustrating a configuration of an SPAD pixel chip.
Figure 46:
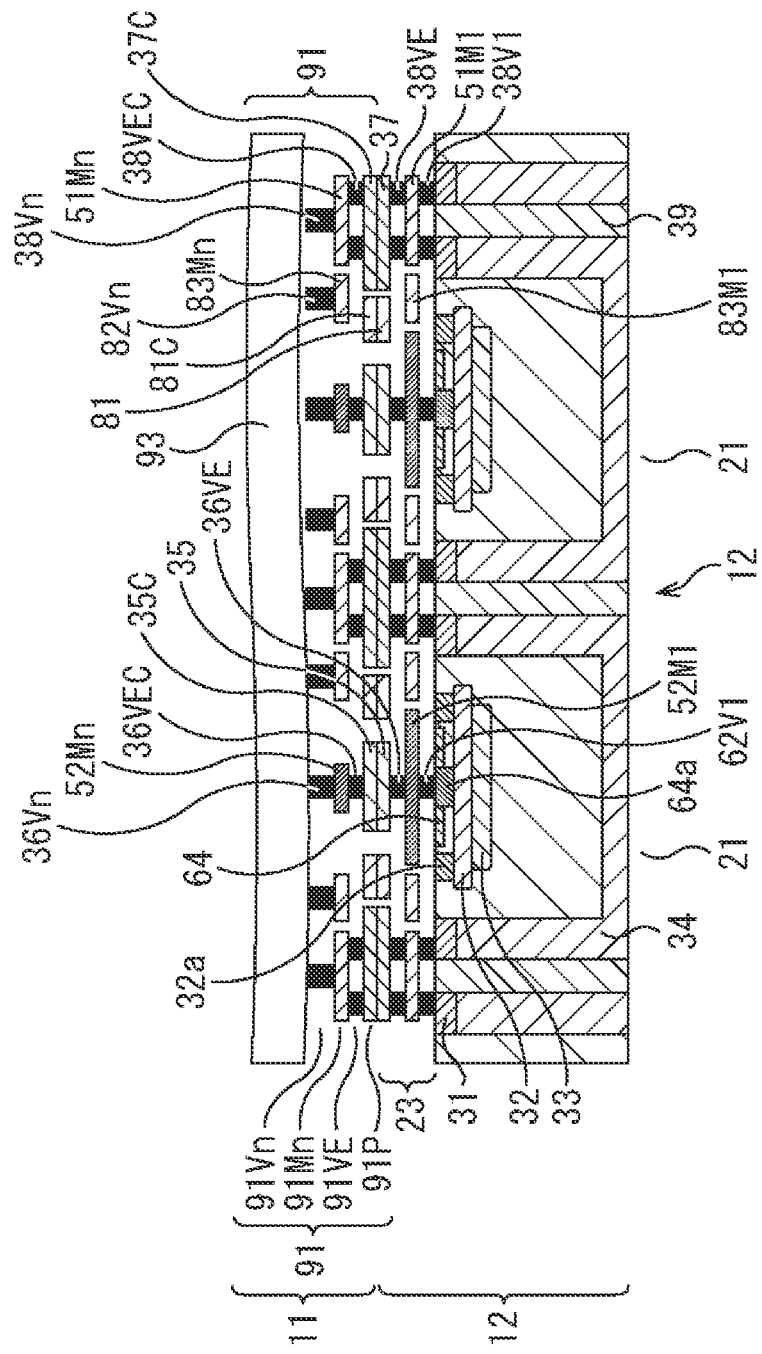
FIG. 46 is a cross-sectional view illustrating a configuration of an SPAD pixel chip.
Figure 47:
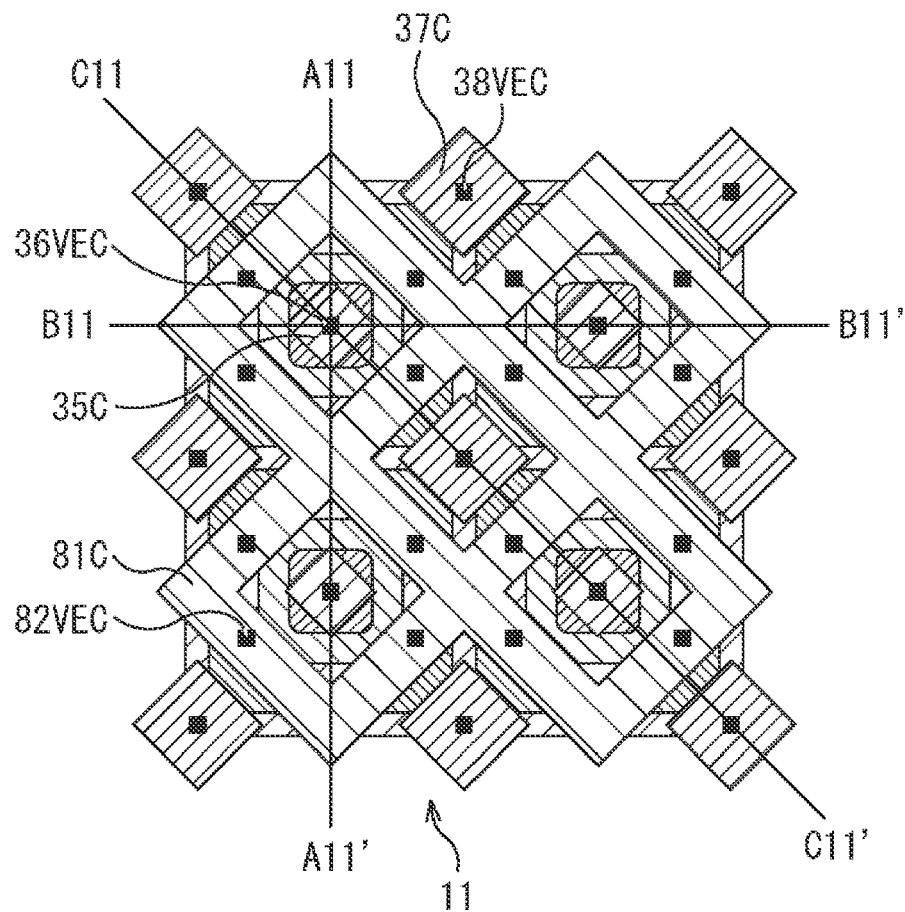
FIG. 47 is a plan view illustrating a configuration of a circuit chip.
Figure 48:
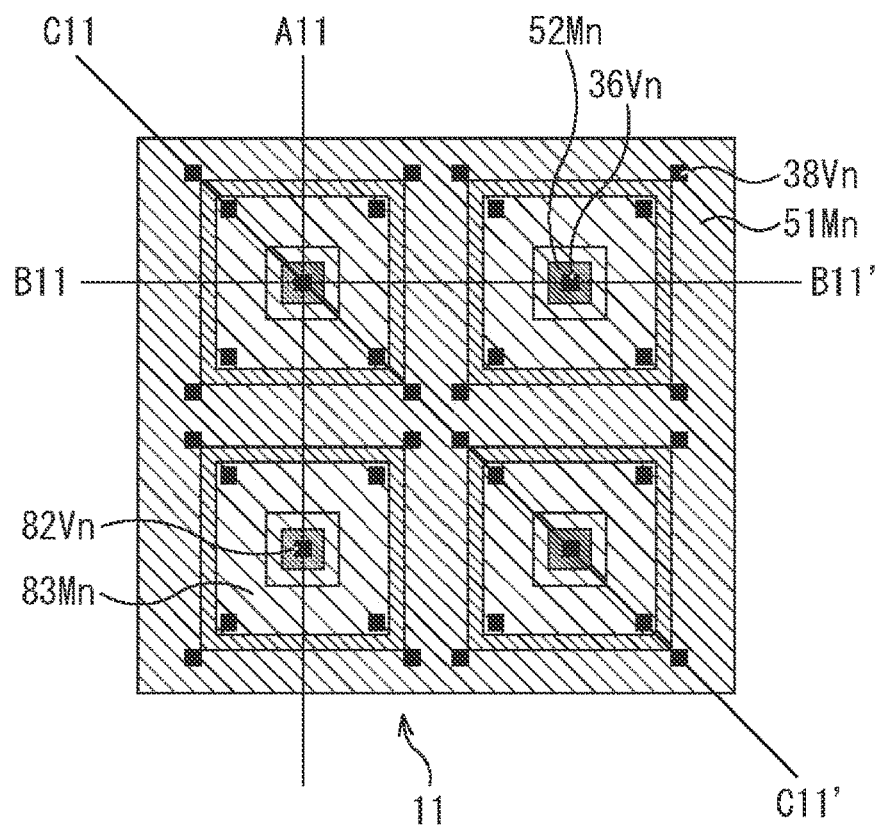
FIG. 48 is a plan view illustrating a configuration of a circuit chip.

FIGS. 45 and 46 are cross-sectional views illustrating a configuration of an SPAD pixel chip. FIGS. 47 and 48 are plan views illustrating a configuration of a circuit chip. FIG. 45 is a view illustrating a configuration of a cross section taken along line A11-A11' or B11-B11' of FIGS. 47 and 48. FIG. 46 is a view illustrating a configuration of a cross section taken along line C11-C11' in FIGS. 47 and 48. FIG. 47 illustrates a configuration of a plane of the VE layer 91VE and the electrode layer 91P, and FIG. 48 illustrates a configuration of a plane of the Vn layer 91Vn and the Mn layer 91Mn.

The eleventh embodiment has a configuration where a configuration of the circuit chip 11 side is added to the configuration of the tenth embodiment. The wiring layer 91 of the circuit chip 11 includes an electrode layer 91P, a VE layer 91VE, an Mn layer 91Mn, and a Vn layer 91Vn, which are illustrated in order from the side closer to the wiring layer 23. In addition, herein, the description of the portion 93 (the upper portion in FIGS. 45 and 46) lower than the wiring layer 91 of the circuit chip 11 is omitted.

The wiring layer 91 in the circuit chip 11 includes a cathode electrode 35C, a cathode via 36VEC, a cathode wire line 52Mn, a cathode via 36Vn, an anode electrode 37C, an anode via 38VEC, an anode wire line 51Mn, and an anode via 38Vn. Although illustration is omitted, the space between the wiring layers 91 is filled with an insulator (for example, SiO2 or the like) in a similar manner to the case of the wiring layer 23 of the photodiode chip 12.

The photodiode chip 12 and the circuit chip 11 are electrically connected to each other through the respective wiring layer 23 and the respective wiring layer 91. In the photodiode chip 12, the cathode 32 is connected sequentially to the cathode via 36V1, the cathode wire line 52M1, the cathode via 36VE, and the cathode electrode 35. In addition, the cathode electrode 35 is connected to the quench circuit in the circuit chip 11 through the cathode electrode 35C, the cathode via 36VEC, the cathode wire line 52Mn, and the cathode via 36Vn in the circuit chip 11.

The cathode electrode 35C, the cathode via 36VEC, the cathode wire line 52Mn, the cathode via 36Vn, the anode electrode 37C, the anode via 38VEC, the anode wire line 51Mn, and the anode via 38Vn of the wiring layer 91 correspond to components having the corresponding names of the wiring layer 23. That is, the cathode electrode 35C corresponds to the cathode electrode 35, the cathode via 36VEC corresponds to the cathode via 36VE, the cathode wire line 52Mn corresponds to the cathode wire line 52M1, and the cathode via 36Vn corresponds to the cathode via 36V1, respectively. In addition, the anode electrode 37C corresponds to the anode electrode 37, the anode via 38VEC corresponds to the anode via 38VE, the anode wire line 51Mn corresponds to the anode wire line 51M1, and the anode via 38Vn corresponds to the anode via 38V1, respectively.

In addition, in this embodiment, one cathode via 36VE is provided for one cathode electrode 35, and one cathode via 36VEC is provided for one cathode electrode 35C. However, a plurality of the cathode vias 36VE or the cathode vias 36VEC may be connected to one cathode electrode 35 or one cathode electrode 35C, respectively.

Similarly, the anode 31 in the photodiode chip 12 is connected sequentially to the anode via 38V1, the anode wire line 51M1, the anode via 38VE, and the anode electrode 37. In addition, the anode electrode 37 is connected to the anode power supply 40 through the anode electrode 37C, the anode via 38VEC, the anode wire line 51Mn, and the anode via 38Vn of the circuit chip 11.

In addition, within the photodiode chip 12, the blocking wire line 83M1, the blocking via 82VE, and the blocking electrode 81 are sequentially connected. Then, the blocking electrode 81 is connected to a fixed potential for shielding sequentially through the blocking electrode 81C, the blocking via 82VEC, the blocking wire line 83Mn, and the blocking via 82Vn in the circuit chip 11.

As illustrated in FIG. 45, the blocking wire line 83Mn of the circuit chip 11 is arranged so as to cover the gap between the blocking wire line 83M1 and the cathode wire line 52M1 of the photodiode chip 12 in plan view. That is, the blocking wire line 83Mn is arranged so as to overlap with at least a portion of the blocking wire line 83M1 and the cathode wire line 52M1. That is, in plan view, the entire pixel 21 is covered with the blocking wire line 83Mn, the blocking wire line 83M1, and the cathode wire line 52M1. With such an arrangement, it is possible to optically separate the circuit chip 11 and the photodiode chip 12 from each other.

In addition, the blocking wire line 83Mn which is the corresponding blocking wire line of the wiring layer 91 and other than the blocking wire line 83M1 and the cathode wire line 52M1 of the wiring layer 23 may be combined. That is, at least a portion of the cathode electrode 35, the shield electrode, or the shield wire line of the wiring layer 23 is arranged so as to overlap with the corresponding cathode electrode 35C, the corresponding shield electrode, or the corresponding shield wire line of the wiring layer 91 in plan view.

In addition, in the circuit chip 11, the blocking wire line 83Mn is arranged so as to be adjacent to the anode electrode 37C arranged in a mesh shape. Furthermore, in the photodiode chip 12, the blocking wire line 83M1 is arranged so as to be adjacent to the anode electrode 37 arranged in a mesh shape. With such an arrangement, the parasitic capacitance of the blocking wire line 83Mn and the anode electrode 37C is increased, the parasitic capacitance of the blocking wire line 83M1 and the anode electrode 37 is increased, and the parasitic capacitance functions as a bypass capacitor, so that it is possible to stabilize the anode potential.

Similarly to the case of the tenth embodiment, also in the eleventh embodiment, as illustrated in FIG. 47, the blocking electrode 81C is configured not to have a single quadrangular shape but to continuously extend over a plurality of the pixels 21. More specifically, the blocking electrode 81C is configured so as to surround the quadrangular cathode electrode 35C arranged at the center of the pixel 21 with an annular quadrangle. In addition, the blocking electrode 81C is configured so as to surround the quadrangular anode electrode 37C arranged at the upper left of the pixel 21 with an annular quadrangle. In addition, the corners of the annular quadrangle are configured so as to be continuous with the corners of the annular quadrangle of the adjacent pixels 21.

With such a configuration, the cathode electrode 35C and the anode electrode 37C can be individually surrounded, and not only shielding between the adjacent cathode electrodes 35C but also shielding between the cathode 32 and the anode 31 can be performed.

In addition, the sizes of the cathode electrode 35C and the anode electrode 37C are also different. The area of the cathode electrode 35C is smaller than the area of the anode electrode 37C. In order to improve the time resolution at the time of transmitting the cathode signal, it is demanded that parasitic capacitance is not added as much as possible. In the blocking electrode 81C, although necessary to prevent (or alternatively, reduce) noise from being superimposed, it is preferable to reduce the parasitic capacitance of the cathode electrode 35C. Therefore, by forming the cathode electrode 35C to be small, the parasitic capacitance of the cathode electrode 35C is reduced.

In contrast, it is preferable that a large amount of parasitic capacitance is added to the anode electrode 37C in order to supply a stable potential without fluctuation in potential. Therefore, by increasing the area of the anode electrode 37C or by reducing the distance between the anode electrode 37C and the blocking electrode 81C, the parasitic capacitance functions as a bypass capacitor, so that it is possible to stabilize the anode potential.

In addition, in this embodiment, the shield wire line is connected to a plurality of fixed potentials. In addition, the potentials of the cathode 32 and the pinning layer 64 are allowed to be common. In addition, the cathode wire line 52M1 is arranged at the center of the pixel 21.

Twelfth Embodiment (SPAD Pixel Chip (FIGS. 49 to 51))

Next, a twelfth embodiment will be described with reference to FIGS. 49 to 51.

Figure 49:
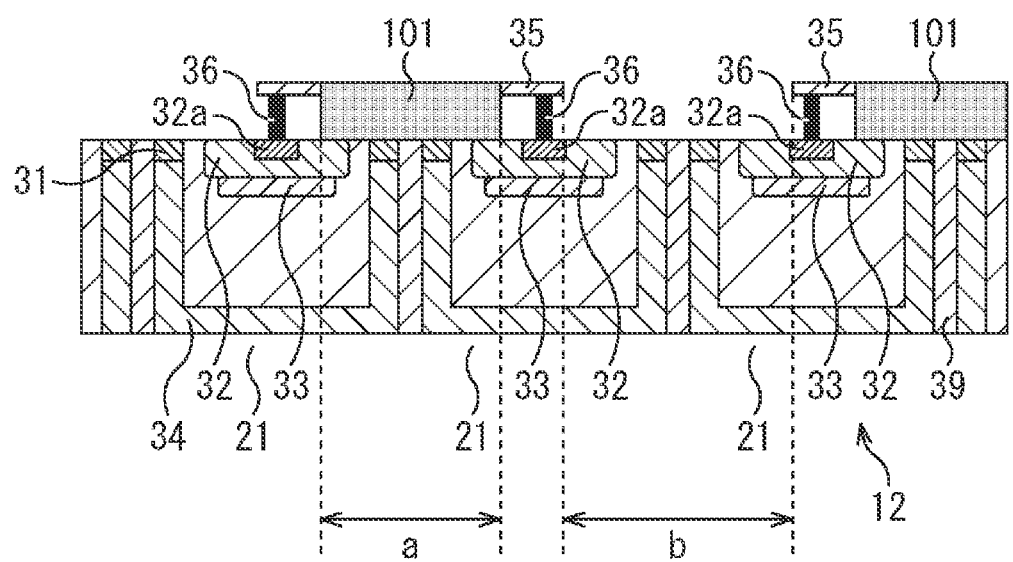
FIG. 49 is a cross-sectional view illustrating a configuration of a photodiode chip.
Figure 50:
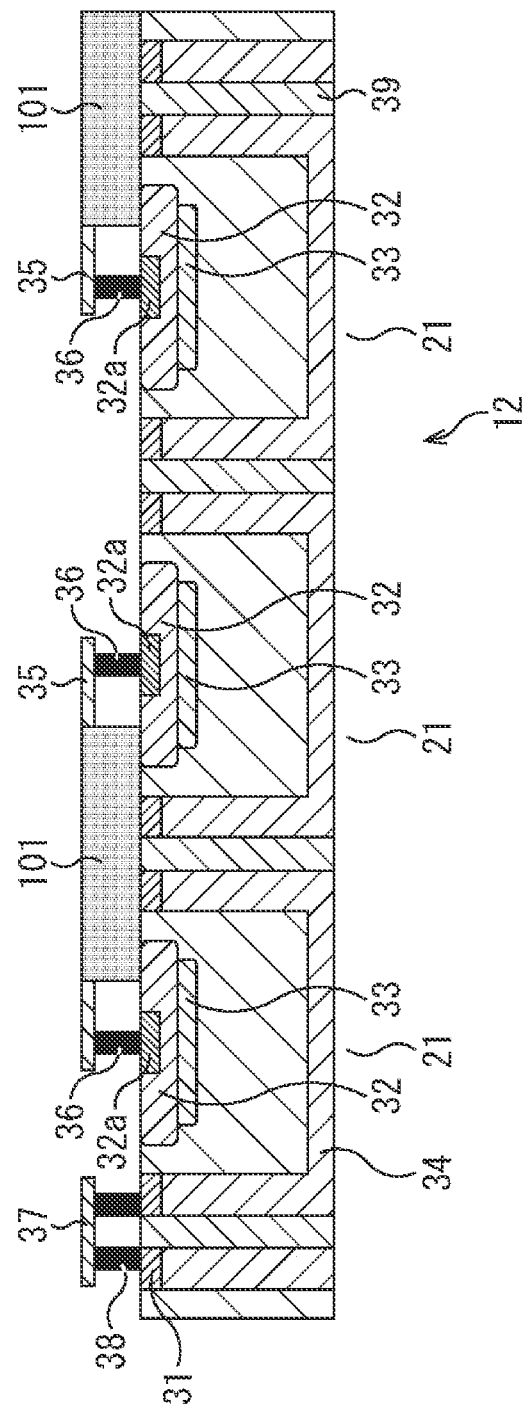
FIG. 50 is a cross-sectional view illustrating a configuration of a photodiode chip.

FIGS. 49 and 50 are cross-sectional views illustrating a configuration of a photodiode chip. FIG. 51 is a plan view illustrating a configuration of the photodiode chip. FIG. 49 is a view illustrating a configuration of a cross section taken along line A12-A12' or line B12-B12' of FIG. 51. FIG. 50 is a view illustrating a configuration of a cross section taken along line C12-C12' of FIG. 51. In addition, the illustration of the wiring layer 91 of the circuit chip 11 is omitted.

The wiring layer 23 includes a low dielectric constant member 101 including a low dielectric material such as SiOF, SiCO, or SiCOH, for example, in addition to the cathode via 36, the cathode electrode 35, the anode via 38, and the anode electrode 37.

Figure 51:
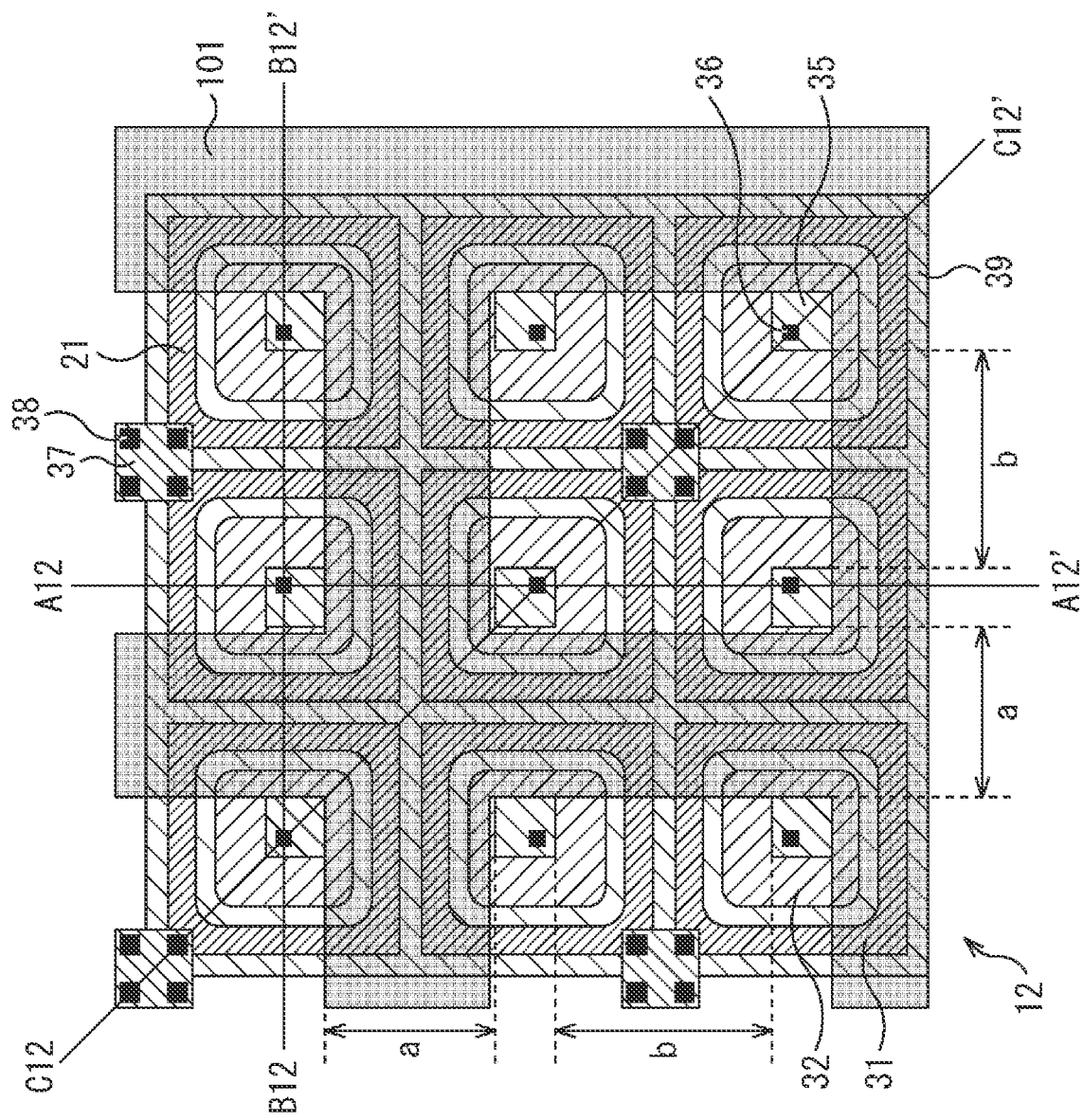
FIG. 51 is a plan view illustrating a configuration of a photodiode chip.

In the twelfth embodiment, as illustrated in FIG. 51, the anode electrodes 37 are arranged at the upper left corner, the lower left corner, the lower right corner, and the upper right corner in a case where the 2×2 pixels 21 is set as a unit.

In addition, as illustrated in FIGS. 49 and 51, similarly to the first embodiment, the cathode vias 36 are arranged at the centers of the pixels 21 in plan view. However, with respect to the cathode electrodes 35, the distance between the cathode electrode 35 in the pixel 21 in the odd-numbered row and the cathode electrode 35 in the pixel 21 in the even-numbered row therebelow is set to "a". In addition, the distance between the cathode electrode 35 in the pixel 21 in the even-numbered row and the cathode electrode 35 in the pixel 21 in the odd-numbered row therebelow is set to "b". In addition, the distance "a" is set to be shorter than the distance "b" (a<b).

The low dielectric constant member 101 is arranged between the cathode electrode 35 and the cathode electrode 35 adjacent to each other at a distance "a". That is, in the first embodiment, the low dielectric constant member 101 is arranged in a portion of the wiring layer 23 at a position where the anode electrode 37 is arranged.

With such an arrangement, the parasitic capacitance of another cathode electrode 35 closest to the cathode electrode 35 (another cathode via 36 closest to the cathode via 36) is reduced by the low dielectric constant member 101, so that it is possible to suppress the interference of the cathode signal caused by the parasitic capacitance.

In addition, in the first embodiment of FIG. 4, the cathode electrodes 35 with a ratio of 1 and the anode electrodes 37 with a ratio of 1.25 are arranged for one pixel 21. In addition, in the first embodiment illustrated in FIG. 3, the cathode electrodes 35 with a ratio of 1 and the anode electrodes 37 with a ratio of 1 are arranged for one pixel 21. In contrast, in the twelfth embodiment, as illustrated in FIG. 51, the cathode electrodes 35 with a ratio of 1 and the anode electrodes 37 with a ratio of 0.25 are arranged for one pixel 21. As a result, the number of electrodes can be reduced, which is advantageous for miniaturization.

Thirteenth Embodiment (SPAD Pixel Chip (FIGS. 52 to 54))

Next, a thirteenth embodiment will be described with reference to FIGS. 52 to 54.

Figure 52:
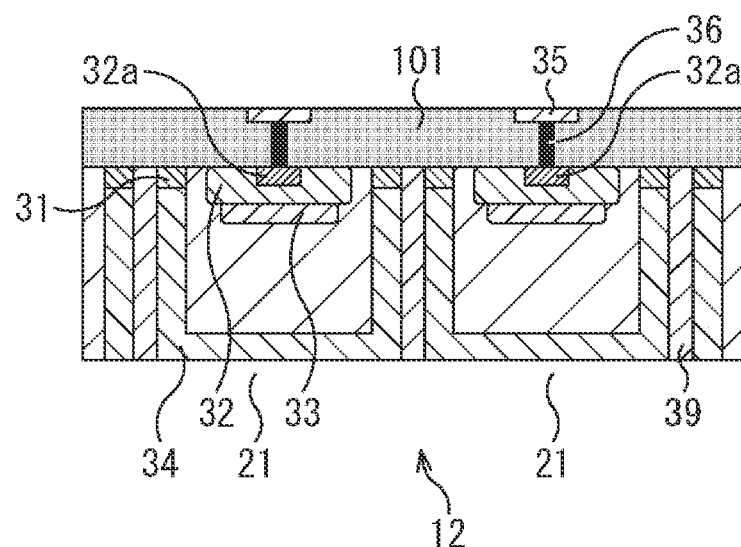
FIG. 52 is a cross-sectional view illustrating a configuration of a photodiode chip.
Figure 53:
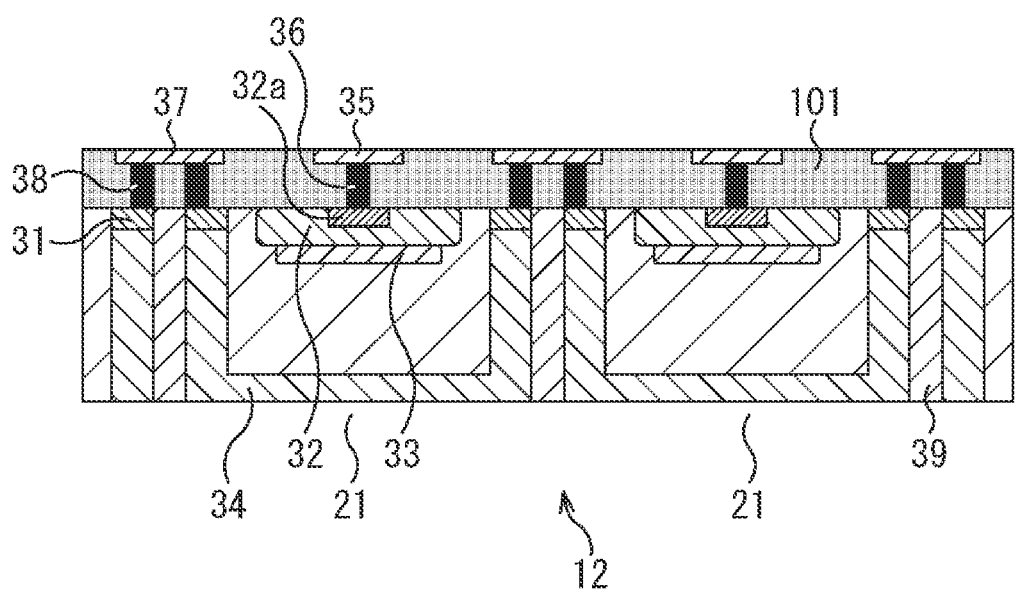
FIG. 53 is a cross-sectional view illustrating a configuration of a photodiode chip.
Figure 54:
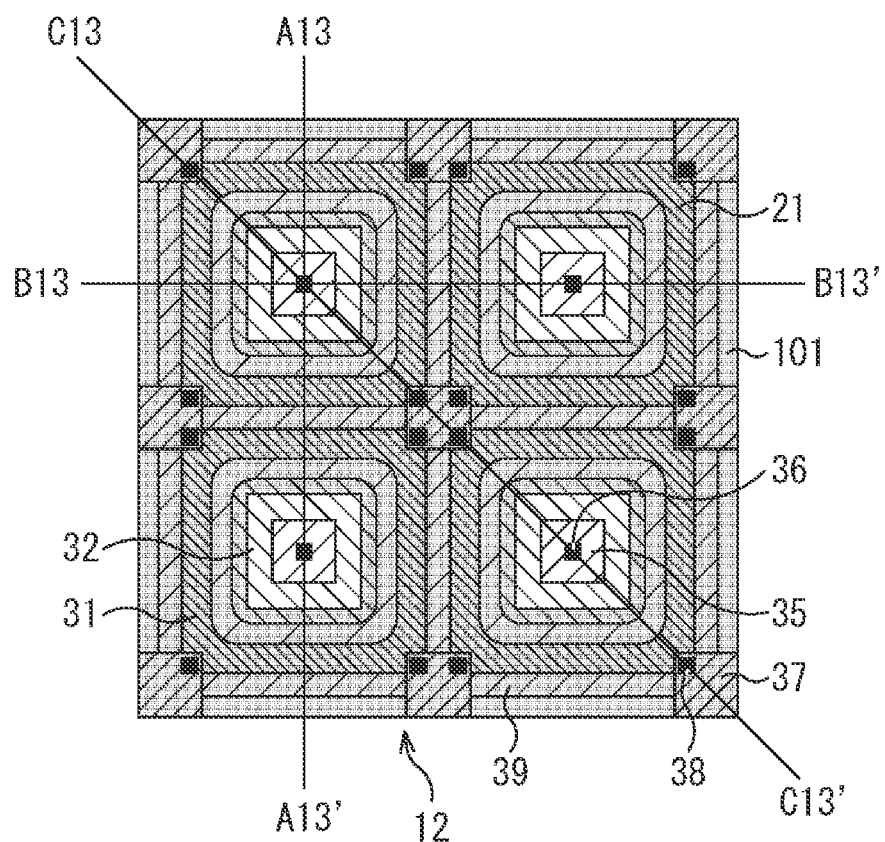
FIG. 54 is a plan view illustrating a configuration of a photodiode chip.

FIGS. 52 and 53 are cross-sectional views illustrating a configuration of a photodiode chip. FIG. 54 is a plan view illustrating a configuration of the photodiode chip. FIG. 52 is a view illustrating a configuration of a cross section taken along line A13-A13' or line B13-B13' of FIG. 54. FIG. 53 is a view illustrating the configuration of a cross section taken along line C13-C13' of FIG. 54. In addition, the illustration of the wiring layer 91 of the circuit chip 11 is omitted.

In the thirteenth embodiment, the wiring layer 23 includes the low dielectric constant member 101 in addition to the cathode electrode 35, the cathode via 36, the anode electrode 37, and the anode via 38.

The low dielectric constant member 101 is arranged so as to fill the spaces among all the electrodes (the cathode electrodes 35 and the anode electrodes 37) and the vias (the cathode vias 36 and the anode vias 38) of the wiring layer 23. In a case where the wire lines (the cathode wire line 52M1 and the anode wire line 51M1) are provided, the low dielectric constant member 101 is also arranged therebetween.

By filling the wiring layer 23 with the low dielectric constant member 101 as described above, it is possible to suppress the interference of the cathode signal caused by parasitic capacitance of the cathode electrode 35 and the cathode via 36. In addition, by reducing the parasitic capacitance between the cathode electrode 35 (cathode via 36) and the anode electrode 37 (anode via 38), it is possible to suppress superimposition of fluctuation of the anode power supply on the cathode signal.

In addition, in the third embodiment (FIG. 14) and the fourth embodiment (FIG. 19), the cathode electrode 35 with a ratio of 1 and the anode electrodes 37 with a ratio of 3 are arranged for one pixel 21. On the other hand, in the thirteenth embodiment, the cathode electrodes 35 with a ratio of 1 and the anode electrodes 37 with a ratio of 1 are arranged for one pixel 21. As a result, the number of electrodes can be reduced, which is advantageous for miniaturization.

Fourteenth Embodiment (SPAD Pixel Chip (FIGS. 55 to 57))

Next, a fourteenth embodiment will be described with reference to FIGS. 55 to 57.

Figure 55:
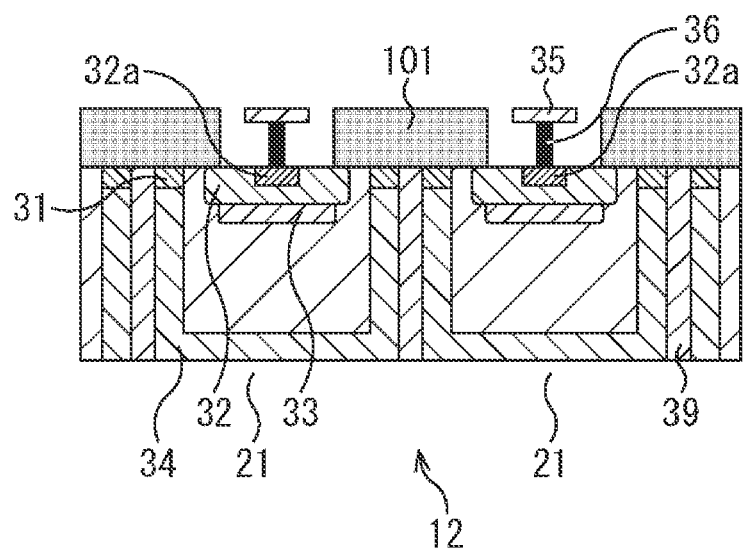
FIG. 55 is a cross-sectional view illustrating a configuration of a photodiode chip.
Figure 56:
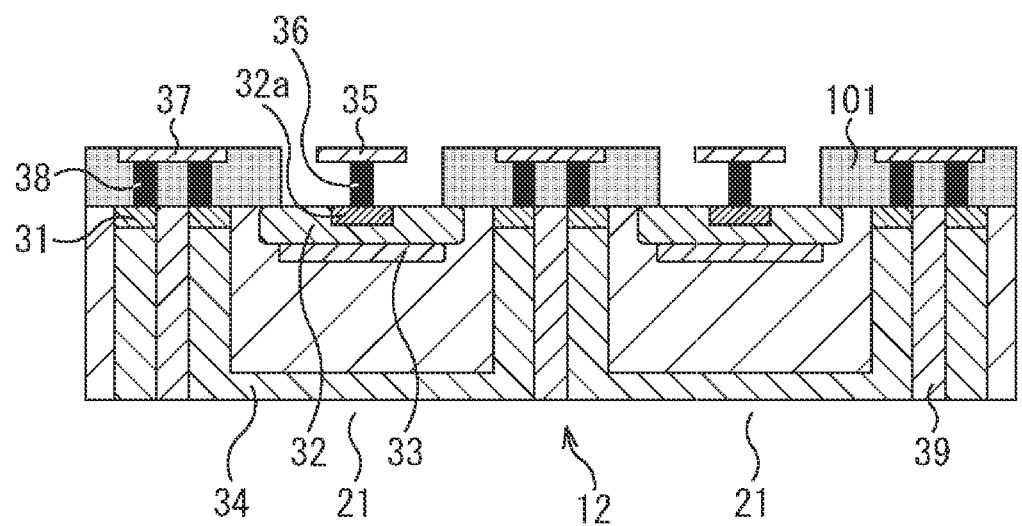
FIG. 56 is a cross-sectional view illustrating a configuration of a photodiode chip.
Figure 57:
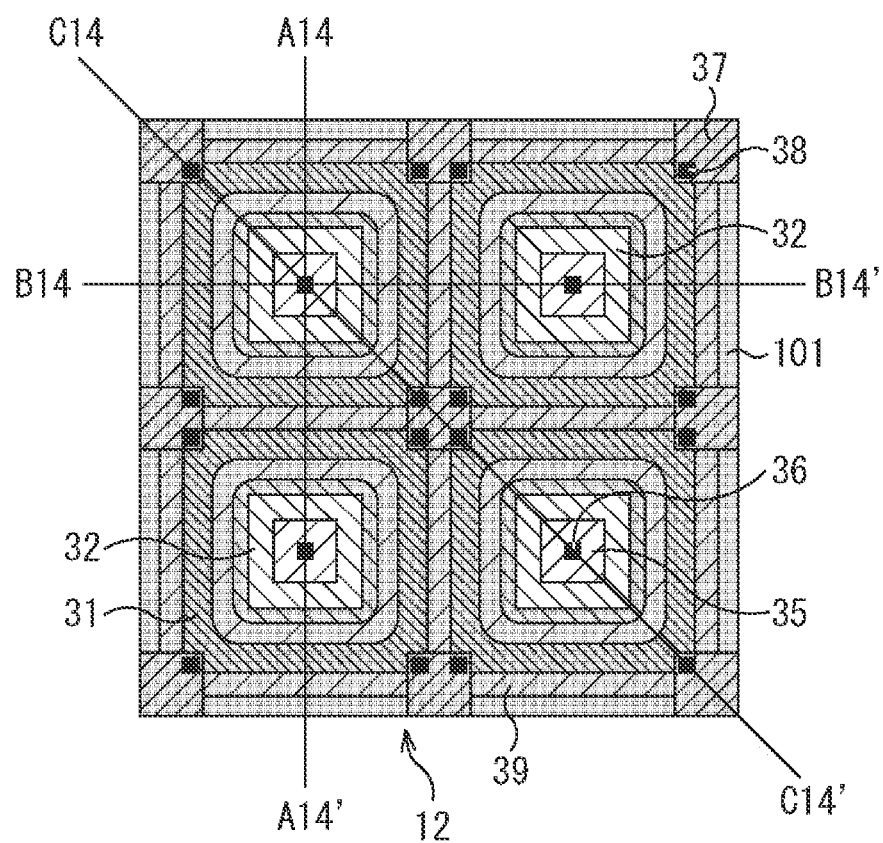
FIG. 57 is a plan view illustrating a configuration of a photodiode chip.

FIGS. 55 and 56 are cross-sectional views illustrating a configuration of a photodiode chip. FIG. 57 is a plan view illustrating a configuration of the photodiode chip. FIG. 55 is a view illustrating a configuration of a cross section taken along line A14-A14' or line B14-B14' of FIG. 57. FIG. 56 is a view illustrating a configuration of a cross section taken along line C14-C14' of FIG. 57. In addition, the illustration of the wiring layer 91 of the circuit chip 11 is omitted.

The wiring layer 23 includes a cathode electrode 35, a cathode via 36, an anode electrode 37, an anode via 38, and a low dielectric constant member 101. The low dielectric constant member 101 is arranged so as to surround the cathode via 36 and the cathode electrode 35 arranged at the center of the pixel 21 with a certain distance therebetween. That is, the low dielectric constant member 101 is arranged in a portion of the wiring layer 23.

In a portion where the low dielectric constant member 101 does not exist, a member including a typical dielectric material such as SiO2 is arranged. Therefore, the low dielectric constant member 101 having a small refractive index functions as a clad of an optical cable, and a member of a dielectric material having a higher refractive index than that of the low dielectric constant member 101 functions as a core. As a result, the light transmitted through the region overlapping with the anode multiplication layer 33 in plan view can be guided so as not to be deviated from the region, and the light transmitted outside the anode multiplication layer 33 can be guided so as to be drawn into the multiplication layer 33.

Figure 58:
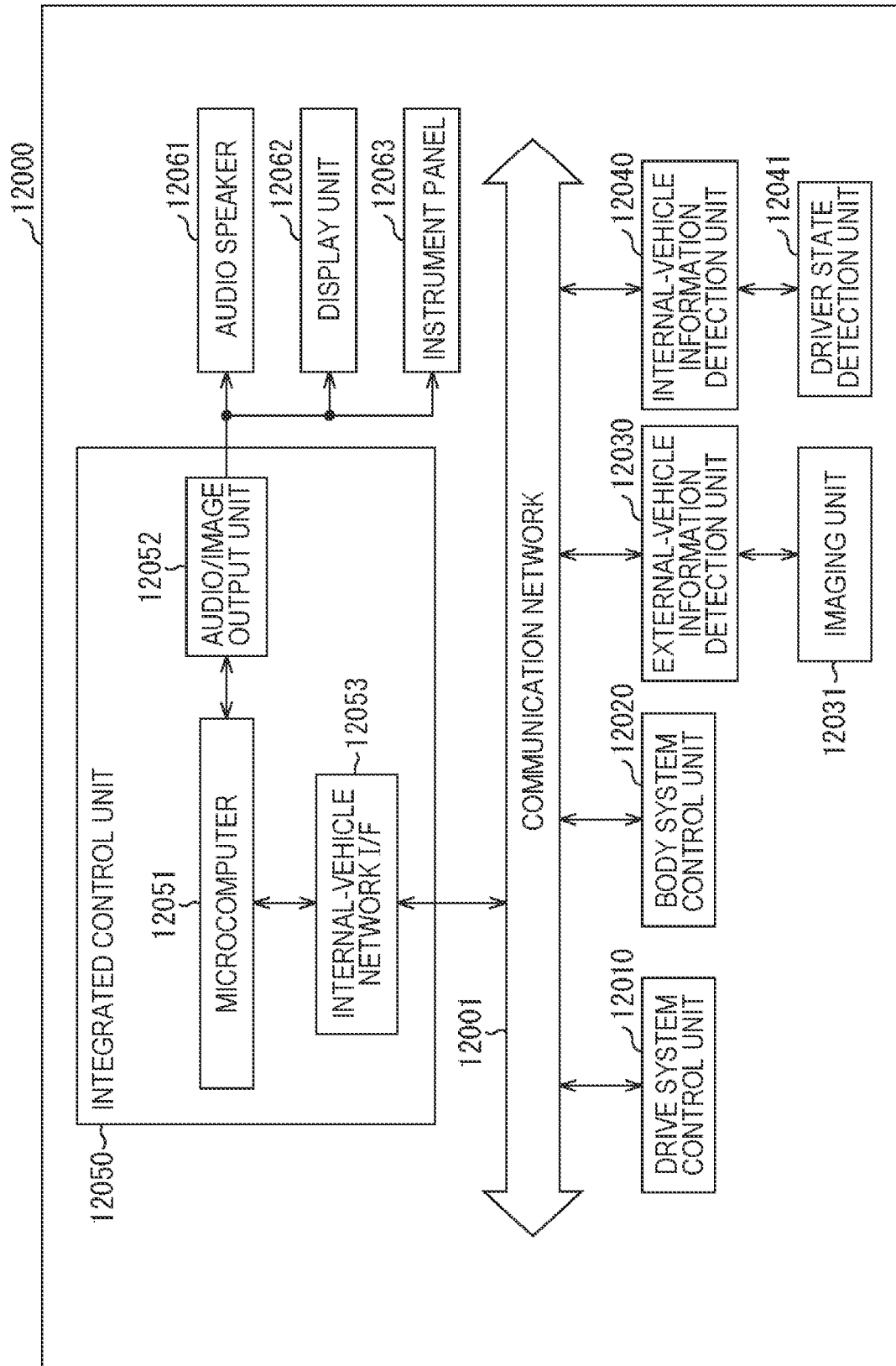
FIG. 58 is a block diagram illustrating an example of a schematic configuration of a vehicle control system.
Figure 59:
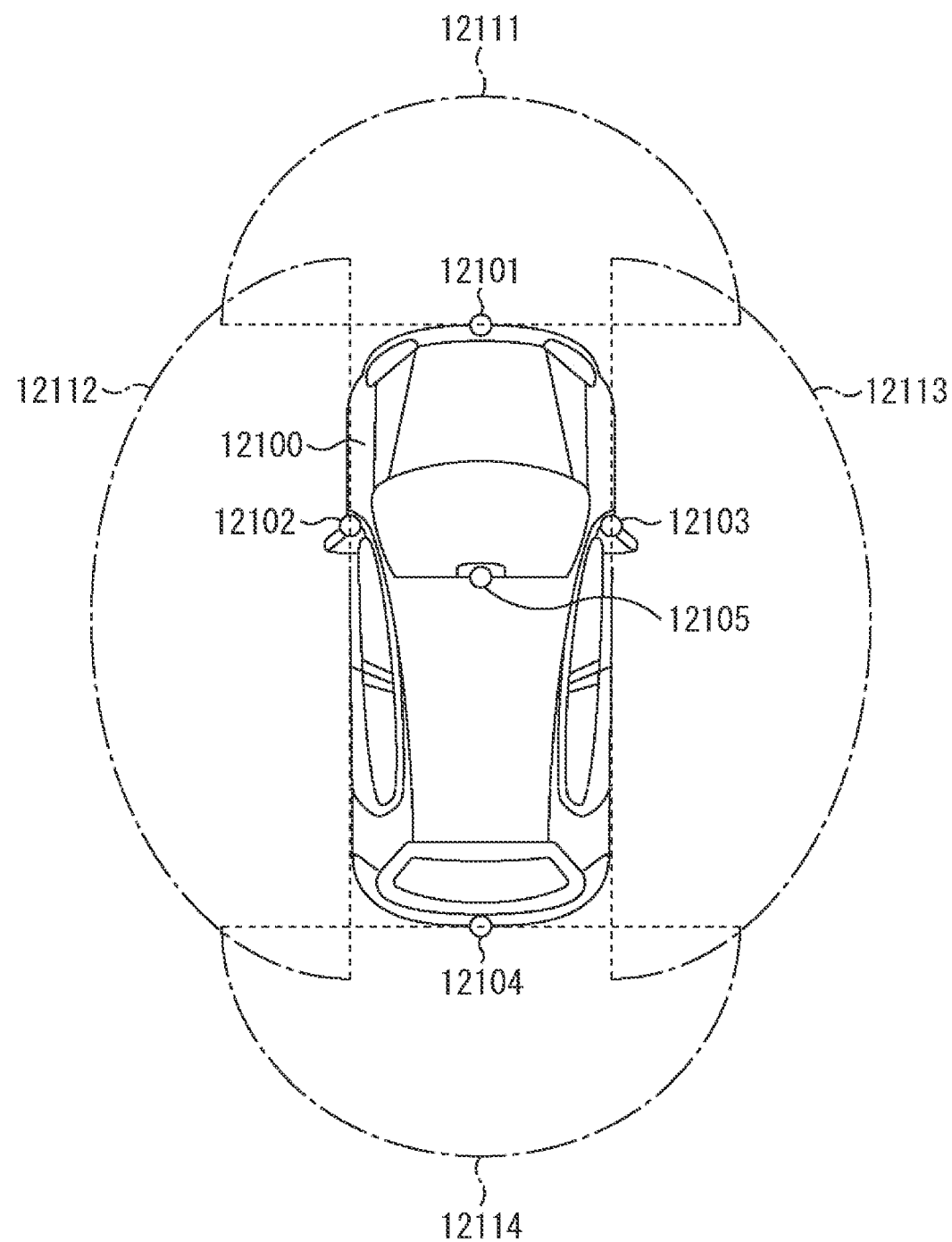
FIG. 59 is an explanatory view illustrating an example of installation positions of an external-vehicle information detection unit and an imaging unit.

<Application Example to Moving Body>
(FIGS. 58 and 59)

The present disclosure can be applied to various products. For example, the present disclosure may be implemented as a device mounted on any type of moving body such as a car, an electric car, a hybrid electric car, a motorcycle, a bicycle, a personal mobility, an airplane, a drone, a ship, or a robot.

FIG. 58 is a block diagram illustrating a schematic configuration example of a vehicle control system which is an example of a moving body control system to which the technique according to an embodiment of the present disclosure is applied.

A vehicle control system 12000 includes a plurality of electronic control units connected via a communication network 12001. In the example illustrated in FIG. 58, the vehicle control system 12000 includes a drive system control unit 12010, a body system control unit 12020, an external-vehicle information detection unit 12030, an internal-vehicle information detection unit 12040, and an integrated control unit 12050. In addition, as functional configurations of the integrated control unit 12050, a microcomputer 12051, an audio/image output unit 12052, and an internal-vehicle network I/F (interface) 12053 are illustrated.

The drive system control unit 12010 controls operations of devices related to a drive system of the vehicle according to various programs. For example, the drive system control unit 12010 functions as a control device of a driving force generation device for generating a driving force of a vehicle such as an internal combustion engine or a driving motor, a driving force transmission mechanism for transmitting the driving force to the wheels, a steering mechanism for adjusting a steering angle of the vehicle, a braking device for generating a braking force of the vehicle, and the like.

The body system control unit 12020 controls operations of various devices equipped on the vehicle body according to various programs. For example, the body system control unit 12020 functions as a control device for a keyless entry system, a smart key system, a power window device, various lamps such as a head lamp, a back lamp, a brake lamp, a turn indicator, a fog lamp, or the like. In this case, the body system control unit 12020 can be input with a radio wave transmitted from a portable device that substitutes for a key or a signal of various switches. The body system control unit 12020 receives input of such a radio wave or signal and controls a door lock device, a power window device, lamps, and the like of the vehicle.

The external-vehicle information detection unit 12030 detects information (external-vehicle information) of the outside of the vehicle on which the vehicle control system 12000 is mounted. For example, an imaging unit 12031 is connected to the external-vehicle information detection unit 12030. The external-vehicle information detection unit 12030 allows the imaging unit 12031 to capture an image of the outside of the vehicle and receives the captured image. The external-vehicle information detection unit 12030 may perform an object detection process or a distance detection process for persons, cars, obstacles, signs, characters on a road surface, and the like on the basis of the received image.

The imaging unit 12031 is an optical sensor that receives light and outputs an electric signal corresponding to the amount of light received. The imaging unit 12031 may output an electric signal as an image or output the electric signal as distance measurement information. In addition, the light received by the imaging unit 12031 may be visible light or invisible light such as infrared light.

The internal-vehicle information detection unit 12040 detects information (internal-vehicle information) of the inside of the vehicle. For example, a driver state detection unit 12041 that detects the state of the driver is connected to the internal-vehicle information detection unit 12040. The driver state detection unit 12041 may include, for example, a camera that images the driver, and the internal-vehicle information detection unit 12040 may calculate a degree of fatigue of the driver or a degree of concentration of the driver on the basis of the detection information input from the driver state detection unit 12041 or may determine whether the driver is dozing off.

The microcomputer 12051 may calculate a control target value of the driving force generation device, the steering mechanism, or the braking device on the basis of the external-vehicle information or the internal-vehicle information acquired by the external-vehicle information detection unit 12030 or the internal-vehicle information detection unit 12040 and may output a control command to the drive system control unit 12010. For example, the microcomputer 12051 may perform cooperative control for the purpose of implementing a function of an advanced driver assistance system (ADAS) including collision avoidance or impact mitigation of the vehicle, follow-up running based on the distance between vehicles, vehicle speed maintenance running, vehicle collision warning, vehicle lane departure warning, and the like.

In addition, the microcomputer 12051 may perform cooperative control for the purpose of autonomous driving or the like where the vehicle autonomously runs without depending on the operation of the driver by controlling the driving force generation device, the steering mechanism, the braking device, or the like on the basis of the information regarding the surroundings of the vehicle acquired by the external-vehicle information detection unit 12030 or the internal-vehicle information detection unit 12040.

In addition, the microcomputer 12051 can output a control command to the body system control unit 12020 on the basis of the external-vehicle information acquired by the external-vehicle information detection unit 12030. For example, the microcomputer 12051 may perform cooperative control for the purpose of antiglare such as switching the high beam to the low beam by controlling the head lamp according to the position of the preceding vehicle or the oncoming vehicle detected by the external-vehicle information detection unit 12030.

The audio/image output unit 12052 transmits at least one output signal of audio and image to an output device capable of visually or audibly performing notification of information to the passengers of the vehicle or the outside of the vehicle. In the example of FIG. 58, as an output device, an audio speaker 12061, a display unit 12062, and an instrument panel 12063 are illustrated. The display unit 12062 may include, for example, at least one of an on-board display and a head-up display.

FIG. 59 is a view illustrating an example of an installation position of the imaging unit 12031.

In FIG. 59, the vehicle 12100 includes imaging units 12101, 12102, 12103, 12104, and 12105 as imaging unit 12031.

For example, the imaging units 12101, 12102, 12103, 12104, and 12105 are provided at positions such as a front nose, side mirrors, a rear bumper, back doors, and an upper portion of a windshield inside the vehicle compartment of the vehicle 12100. The imaging unit 12101 provided for the front nose and the imaging unit 12105 provided in the upper portion of the windshield inside the vehicle compartment mainly acquire a front image of the vehicle 12100. The imaging units 12102 and 12103 provided in the side mirrors mainly acquire side images of the vehicle 12100. The imaging unit 12104 provided in the rear bumper or the back door mainly acquires a rear image of the vehicle 12100. The front image acquired by the imaging units 12101 and 12105 is mainly used for detection of preceding vehicles or pedestrians, obstacles, traffic signals, traffic signs, lanes, and the like.

In addition, FIG. 59 illustrates an example of the imaging ranges of the imaging units 12101 to 12104. The imaging range 12111 indicates the imaging range of the imaging unit 12101 provided in the front nose, the imaging ranges 12112 and 12113 indicate the imaging ranges of the imaging units 12102 and 12103 provided in the side mirrors, and the imaging range 12114 indicates the imaging range of the imaging unit 12104 provided in the rear bumper or the back doors. For example, by overlapping the image data captured by the imaging units 12101 to 12104, an overhead image of the vehicle 12100 viewed from the upper side is obtained.

At least one of the imaging units 12101 to 12104 may have a function of acquiring distance information. For example, at least one of the imaging units 12101 to 12104 may be a stereoscopic camera configured with a plurality of imaging devices or may be an imaging device having pixels for phase difference detection.

For example, by calculating the distance to each three-dimensional object within the imaging ranges 12111 to 12114 and the time change of the distance (the relative speed with respect to the vehicle 12100) based on the distance information obtained from the imaging units 12101 to 12104, the microcomputer 12051 can extract the three-dimensional object traveling at a predetermined speed (for example, 0 km/h or more) in substantially the same direction as the vehicle 12100 with the nearest three-dimensional object on the traveling path of the vehicle 12100 as a preceding vehicle. In addition, the microcomputer 12051 can set an inter-vehicle distance to be secured in advance of the preceding vehicle and can perform autonomous brake control (including follow-up stop control), autonomous acceleration control (including follow-up start control), and the like. In this manner, it is possible to perform cooperative control for the purpose of autonomous driving or the like where the vehicle autonomously runs without depending on the operation of the driver.

For example, based on the distance information obtained from the imaging units 12101 to 12104, the microcomputer 12051 classifies and extracts three-dimensional object data on three-dimensional objects into two-wheeled vehicles regular vehicles, large vehicles, pedestrians, other three-dimensional objects such as electric poles and uses the three-dimensional object data for autonomous avoidance of obstacles. For example, the microcomputer 12051 identifies obstacles in the vicinity of the vehicle 12100 as obstacles that the driver of the vehicle 12100 may see and obstacles that the driver may not easily see. Then, the microcomputer 12051 determines collision risk indicating a degree of risk of collision with each obstacle, and when there is possibility of collision of which the collision risk is equal to or higher than a set value, the microcomputer outputs an alarm to the driver through the audio speaker 12061 and the display unit 12062 or performs forced deceleration or avoiding steering through the drive system control unit 12010, so that it is possible to perform driving assistance for collision avoidance.

At least one of the imaging units 12101 to 12104 may be an infrared camera for detecting infrared rays. For example, the microcomputer 12051 can recognize a pedestrian by determining whether or not a pedestrian exists in the captured images of the imaging units 12101 to 12104. The pedestrian recognition is performed by, for example, a procedure of extracting feature points in captured images of the imaging units 12101 to 12104 as infrared cameras and a procedure of performing a pattern matching process on a series of feature points indicating a contour of an object to determine whether the object is a pedestrian. When the microcomputer 12051 determines that a pedestrian exists in the captured images of the imaging units 12101 to 12104 and recognizes a pedestrian, the audio/image output unit 12052 controls the display unit 12062 so as to display a square contour line for emphasis to the recognized pedestrian in an overlapped manner. In addition, the audio/image output unit 12052 may control the display unit 12062 to display icons or the like indicating pedestrians at desired positions.

Heretofore, an example of the vehicle control system to which the technique according to an embodiment of the present disclosure can be applied has been described. The SPAD pixel chip 1 of FIG. 1 can be applied to the imaging unit 12031. As a result, it is possible to obtain a more easily viewable image with less noise, so that driver's fatigue can be reduced.

Embodiments of the present disclosure are not limited to the above-described embodiments, and various modifications are possible without departing from the gist of the present disclosure.

<Others>

The present disclosure may have the following configurations.

(1)
An imaging device, comprising:
  a first chip including:
    a first pixel and a second pixel, the first pixel including a first anode region and a first cathode region, the second pixel including a second anode region and a second cathode region; and
    a first wiring layer including:
      a first anode electrode;
      a first anode via coupled to the first anode electrode and the first anode region; and
      a second anode via coupled to the first anode electrode and the second anode region.

(2)
The imaging device of (1), wherein, in a plan view, the first and second pixels are adjacent to one another, and wherein, in the plan view, the first anode electrode and the first and second anode vias are between the first and second cathode regions.

(3)
The imaging device of one or more of (1) to (2), wherein the first chip further comprises:
an insulating material between the first anode region and the second anode region, and wherein, in the plan view, the first anode electrode overlaps portions of the first anode region, the second anode region, and the insulating material.

(4)
The imaging device of one or more of (1) to (3), wherein, in the plan view, the first and second anode vias are aligned with one another along a first direction.

(5)
The imaging device of one or more of (1) to (4), further comprising:
a second chip bonded to the first chip and including circuitry for processing signals from the first and second pixels.

(6)
The imaging device of one or more of (1) to (5), wherein the second chip further comprises a second wiring layer that includes:
a second anode electrode coupled to the first anode electrode;
a first anode wiring;
a third anode via coupled to the second anode electrode and the first anode wiring; and
a fourth anode via coupled to the second anode electrode and the first anode wiring.

(7)
The imaging device of one or more of (1) to (6), wherein the first wiring layer further comprises:
a first cathode electrode;
a first cathode via coupled to the first cathode region and the first cathode electrode;
a second cathode electrode; and
a second cathode via coupled to the second cathode region and the second cathode electrode.

(8)
The imaging device of one or more of (1) to (7), further comprising:
a second chip bonded to the first chip and including circuitry for processing signals from the first and second pixels, the second chip including a second wiring layer that includes:
a second anode electrode coupled to the first anode electrode;
a first anode wiring;
a third anode via coupled to the second anode electrode and the first anode wiring; and
a fourth anode via coupled to the second anode electrode and the first anode wiring.

(9)
The imaging device of one or more of (1) to (8), wherein the second wiring layer further comprises:
a third cathode electrode coupled to the first cathode electrode;
a first cathode wiring;
a third cathode via coupled to the third cathode electrode and the first cathode wiring;
a fourth cathode electrode coupled to the second cathode electrode;
a second cathode wiring; and
a fourth cathode via coupled to the fourth cathode electrode and the second cathode wiring.

(10)
The imaging device of one or more of (1) to (9), wherein the second wiring layer further comprises:
a third cathode wiring;
a fifth cathode via coupled to the first cathode wiring and the third cathode wiring;
a fourth cathode wiring; and
a sixth cathode via coupled to the second cathode wiring and the third cathode wiring.

(11)
The imaging device of one or more of (1) to (10), wherein the first wiring layer further comprises:
a first cathode electrode;
a first cathode wiring between the first cathode electrode and the first cathode region in a cross-sectional view, wherein the first cathode wiring is coupled to the first cathode electrode; and
a plurality of cathode vias coupled to the first cathode region and the first cathode wiring.

(12)
The imaging device of one or more of (1) to (11), wherein, in a plan view, a first cathode via of the plurality of cathode vias is at a center portion of the first cathode region and a remainder of the plurality of cathode vias are at edge portions of the first cathode region.

(13)
The imaging device of one or more of (1) to (12), wherein the remainder of the plurality of cathode vias are arranged symmetrically around the first cathode via at the edge portions of the first cathode region.

(14)
The imaging device of one or more of (1) to (13), wherein the first wiring layer further comprises:
a first shield wiring that overlaps the first anode region and the second anode region in a plan view.

(15)
The imaging device of one or more of (1) to (14), wherein the shield wiring is coplanar with the first cathode wiring.

(16)
The imaging device of one or more of (1) to (15), wherein the first wiring layer further comprises:
a second shield wiring that overlaps the first cathode wiring and the first shield wiring in the plan view.

(17)
The imaging device of one or more of (1) to (16), wherein the second shield wiring is coplanar with the first cathode electrode.

(18)
An imaging device, comprising:
a first chip including:
a first pixel including a first anode region and a first cathode region; and
a first wiring layer including:
a first cathode electrode;
a first cathode wiring between the first cathode electrode and the first cathode region in a cross-sectional view, wherein the first cathode wiring is coupled to the first cathode electrode; and
a plurality of cathode vias coupled to the first cathode region and the first cathode wiring.

(19)
The imaging device of (18), wherein, in a plan view, a first cathode via of the plurality of cathode vias is at a center portion of the first cathode region and a remainder of the plurality of cathode vias are arranged symmetrically around the first cathode via at edge portions of the first cathode region.

(20)
An electronic device, comprising:
an imaging device including a first chip, the first chip including:
a first pixel and a second pixel, the first pixel including a first anode region and a first cathode region, the second pixel including a second anode region and a second cathode region; and
a first wiring layer including:
a first anode electrode;
a first anode via coupled to the first anode electrode and the first anode region; and
a second anode via coupled to the first anode electrode and the second anode region.

It should be understood by those skilled in the art that various modifications, combinations, sub-combinations and alterations may occur depending on design requirements and other factors insofar as they are within the scope of the appended claims, the above disclosure, or the equivalents thereof. It should be further understood that the terms "first," "second," "third," etc. are used for convenience of explanation, may be interchangeable, and do not limit the present disclosure.

REFERENCE SIGNS LIST

1 SPAD pixel chip
11 Circuit chip
12 Photodiode chip
21 Pixel
22 Si layer
23 Wiring layer
31 Anode
32 Cathode
33 Anode multiplication layer
34 Hole accumulation layer
35 Cathode electrode
36 Cathode via
37 Anode electrode
38 Anode via

What is claimed is:

1. A light detecting device, comprising:
a semiconductor layer, including:
a first pixel, the first pixel including a first semiconductor region and a second semiconductor region; and
a second pixel, the second pixel including a third semiconductor region and a fourth semiconductor region;
a first wiring layer, including:
a first wiring;
a first via coupled to the first wiring and the first semiconductor region; and
a second via coupled to the first wiring and the third semiconductor region,
wherein, in a plan view, the first via is disposed between the second semiconductor region and the fourth semiconductor region, and
wherein, in the plan view, the second via is disposed between the second semiconductor region and the fourth semiconductor region;
a first chip, wherein the first chip includes the first and second pixels and the first wiring layer; and
a second chip, wherein the second chip is bonded to the first chip and includes circuitry for processing signals from the first and second pixels.

2. The light detecting device of claim 1, wherein, in the plan view, the first and second pixels are adjacent to one another, and wherein, in the plan view, the first wiring and the first and second vias are between the second and fourth semiconductor regions.

3. The light detecting device of claim 2, further comprising:
an insulating material between the first semiconductor region and the third semiconductor region, and wherein, in the plan view, the first wiring overlaps portions of the first semiconductor region, the third semiconductor region, and the insulating material.

4. The light detecting device of claim 2, wherein, in the plan view, the first and second vias are aligned with one another along a first direction.

5. The light detecting device of claim 1, wherein the second chip further includes a second wiring layer, wherein the second wiring layer includes:
a second wiring coupled to the first wiring;
a third via coupled to the second wiring; and
a fourth via coupled to the second wiring.

6. The light detecting device of claim 5, wherein the first wiring layer further includes:
a third wiring;
a fifth via coupled to the second semiconductor region and the third wiring;
a fourth wiring; and
a sixth via coupled to the fourth semiconductor region and the fourth wiring.

7. The light detecting device of claim 1, wherein the first wiring layer further comprises:
a third wiring;
a second semiconductor region wiring between the third wiring and the second semiconductor region in a cross-sectional view, wherein the second semiconductor region wiring is coupled to the third wiring; and
a plurality of vias coupled to the second semiconductor region and the second semiconductor region wiring.

8. The light detecting device of claim 7, wherein, in the plan view, a first via of the plurality of vias coupled to the second semiconductor region and the second semiconductor region wiring is at a center portion of the second semiconductor region and a remainder of the plurality of vias are at edge portions of the second semiconductor region.

9. The light detecting device of claim 8, wherein all but the first via of the plurality of vias are arranged symmetrically around the first via at edge portions of the second semiconductor region.

10. The light detecting device of claim 7, wherein the first wiring layer further comprises:
a first shield wiring that overlaps the first semiconductor region and the third semiconductor region in the plan view.

11. The light detecting device of claim 10, wherein the first shield wiring is coplanar with the second semiconductor region wiring.

12. The light detecting device of claim 10, wherein the first wiring layer further comprises:
a second shield wiring that overlaps the second semiconductor region wiring and the first shield wiring in the plan view.

13. The light detecting device of claim 12, wherein the second shield wiring is coplanar with the second wiring.

14. The light detecting device of claim 1, wherein a first plurality of vias including the first via is coupled to the first wiring and the first semiconductor region and a second plurality of vias including the second via is coupled to the first wiring and the third semiconductor region.

15. The light detecting device of claim 14, wherein the first plurality of vias and the second plurality of vias are symmetrically disposed.

16. A light detecting device, comprising:
a semiconductor layer, including:
a first pixel, the first pixel including a first semiconductor region and a second semiconductor region; and
a second pixel, the second pixel including a third semiconductor region and a fourth semiconductor region;
a first wiring layer including:
a first wiring;
a first via coupled to the first wiring and the first semiconductor region; and
a second via coupled to the first wiring and the third semiconductor region,
wherein, in a plan view, the first wiring is disposed between the second semiconductor region and the fourth semiconductor region;
a first chip, wherein the first chip includes the first and second pixels and the first wiring layer; and
a second chip, wherein the second chip is bonded to the first chip and includes circuitry for processing signals from the first and second pixels.

17. The light detecting device of claim 16, wherein the second chip further includes a second wiring layer, wherein the second wiring layer includes:
a second wiring coupled to the first wiring;
a third via coupled to the second wiring; and
a fourth via coupled to the second wiring.

18. The light detecting device of claim 17, wherein the first wiring layer further includes:
a third wiring;
a fifth via coupled to the second semiconductor region and the third wiring;
a fourth wiring; and
a sixth via coupled to the fourth semiconductor region and the fourth wiring.

19. The light detecting device of claim 16, wherein the first wiring layer further comprises:
a third wiring;
a second semiconductor region wiring between the third wiring and the second semiconductor region in a cross-sectional view, wherein the second semiconductor region wiring is coupled to the third wiring; and
a plurality of vias coupled to the second semiconductor region and the second semiconductor region wiring.

20. A light detecting device, comprising:
a semiconductor layer, including:
a first pixel, the first pixel including a first semiconductor region and a second semiconductor region; and
a second pixel, the second pixel including a third semiconductor region and a fourth semiconductor region; and
a first wiring layer, including:
a first wiring;
a first via coupled to the first wiring and the first semiconductor region; and
a second via coupled to the first wiring and the third semiconductor region,
wherein, in a plan view, the first via is disposed between the second semiconductor region and the fourth semiconductor region, and
wherein, in the plan view, the second via is disposed between the second semiconductor region and the fourth semiconductor region;
a third wiring;
a second semiconductor region wiring between the third wiring and the second semiconductor region in a cross-sectional view, wherein the second semiconductor region wiring is coupled to the third wiring; and
a plurality of vias coupled to the second semiconductor region and the second semiconductor region wiring.

* * * * *